US006660446B2

(12) United States Patent
Shimada et al.

(10) Patent No.: US 6,660,446 B2
(45) Date of Patent: Dec. 9, 2003

(54) HEAT-SENSITIVE COMPOSITION AND PLANOGRAPHIC PRINTING PLATE

(75) Inventors: Kazuto Shimada, Shizuoka-ken (JP); Tadahiro Sorori, Shizuoka-ken (JP); Kunihiko Kodama, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 128 days.

(21) Appl. No.: 09/865,539

(22) Filed: May 29, 2001

(65) Prior Publication Data

US 2002/0025489 A1 Feb. 28, 2002

(30) Foreign Application Priority Data

| | | |
|---|---|---|
| May 30, 2000 | (JP) | 2000-160323 |
| Jun. 20, 2000 | (JP) | 2000-184603 |
| Sep. 4, 2000 | (JP) | 2000-266797 |

(51) Int. Cl.[7] .................... G03F 7/039

(52) U.S. Cl. .................... 430/270.1; 430/171; 430/281.1; 430/286.1; 430/287.1; 430/944; 430/945

(58) Field of Search .................... 430/270.1, 281.1, 430/286.1, 287.1, 302, 348, 944, 945, 964, 171

(56) References Cited

U.S. PATENT DOCUMENTS

| | | | | | |
|---|---|---|---|---|---|
| 5,965,319 | A | * | 10/1999 | Kobayashi | 430/176 |
| 6,042,987 | A | * | 3/2000 | Kobayashi | 430/270.1 |
| 6,232,038 | B1 | * | 5/2001 | Takasaki et al. | 430/281.1 |
| 6,368,769 | B1 | * | 4/2002 | Ohkawa et al. | 430/270.1 |
| 6,423,462 | B1 | * | 7/2002 | Kunita | 430/156 |
| 6,447,978 | B1 | * | 9/2002 | Leon et al. | 430/270.1 |
| 6,451,500 | B1 | * | 9/2002 | Leon | 430/270.1 |
| 6,475,700 | B1 | * | 11/2002 | Higashi et al. | 430/278.1 |
| 6,482,571 | B1 | * | 11/2002 | Teng | 430/302 |
| 6,495,310 | B2 | * | 12/2002 | Teng | 430/303 |

FOREIGN PATENT DOCUMENTS

| | | | | |
|---|---|---|---|---|
| EP | 652 483 A1 | * | 5/1995 | B41C/1/10 |

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

A heat-sensitive composition comprising a compound of a specific general formula which generates an acid or radical when heated, and a compound whose physical and chemical properties are irreversibly changed by an acid or radical.

36 Claims, No Drawings

HEAT-SENSITIVE COMPOSITION AND PLANOGRAPHIC PRINTING PLATE

BACKGROUND OF THE INVENTION

1. Field of Invention

The present invention relates to a heat-sensitive composition which can be applied widely as a heat-sensitive recording material, and a planographic printing plate having a negative recording layer obtained by using the above-mentioned composition, the plate being writable by infrared laser and being highly sensitive, and image portions of the recording layer being excellent in alkali developing-resistance and printing-endurance.

2. Description of the Related Art

Recent development of laser is remarkable, and particularly, in solid laser and semiconductor layer having light-emitting ranges in a range from near infrared ray to infrared ray, output is increasing and size is decreasing. Therefore, these lasers are very useful as an exposure light source in producing a printing plate directly from digital data of computers and the like.

The above-mentioned negative planographic printing plate material for infrared laser using, as an exposure light source, infrared laser having an emitting range in an infrared range is a planographic printing material having a photo-sensitive layer containing a light-heat converting agent, a polymerization initiator generating a radical by light or heat, and a polymerizable compound.

Usually, such a negative image recording material utilizes a recording method in which a polymerization reaction is caused by using a radical generated by light or heat as an initiator, and where in exposed portions of a recording layer are hardened to form image portions. Such a negative image forming material has lower image forming property as compared with a positive material in which a recording layer is solubilized by energy of infrared laser irradiation, and forms strong image portions by promoting a hardening reaction by polymerization, therefore, heating treatment is usually conducted before a developing process when the negative image forming material is used. Examples of the negative image recording material which is subjected to such post heating treatment include, recording materials composed of a resol resin and novolak resin descried in U.S. Pat. No. 5,340,699 and the like, as well as other materials.

Particularly when an aluminum substrate is used, there is a problem that energy by infrared laser irradiation is diffused in the substrate having high heat conductivity, and is not used for promotion and initiation of a polymerization reaction to form images, consequently, sufficient sensitivity is not obtained.

SUMMARY OF THE INVENTION

The present invention has been accomplished in view of the above-mentioned problems, and an object of the present invention is to provide a heat-sensitive composition in which highly sensitive substance can be changed irreversibly by heating, and a negative planographic printing plate which is obtained by using the above-mentioned composition which has high sensitivity, requires no heating treatment before development or in which the heating treatment can be simplified, has image portions excellent in alkali development-resistance and printing-endurance, and can be written by heat mode.

The present inventors have done intensive research, and found that a composition having excellent hardening property and color developing property due to exposure to heat is obtained by including an acid/radical generator having the following general formula (A), general formula (B), general formula (C), general formula (D) or general formula (E), and a whose physical properties are irreversible by an acid or radical, and further that increase in sensitivity of recording and improvement of printing endurance of a planographic printing plate can be attained by providing a recording layer containing such a composition. This discovery led to the present invention.

Namely, a heat-sensitive composition comprising (I) a compound which generates an acid or a radical when heated and which has the following general formula (A), general formula (B), general formula (C), general formula (D) or general formula (E), and (II) a compound whose physical and chemical properties are changed irreversibly by an acid or radical $^{a}X—COO^{-}\,{}^{a}M^{+}$ General formula (A)

General formula (B)

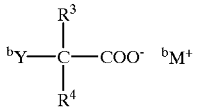

General formula (C)

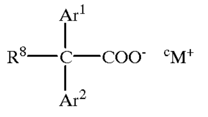

$^{d}R—COO^{-}\,{}^{d}M^{+}$ General formula (D)

$^{e}X^{-}\,{}^{e}M^{+}$ General formula (E)

wherein, in general formula (A), $^{a}M^{+}$ represents a monovalent cation; $^{a}X$ represents one of the groups shown below or a halogen atom;

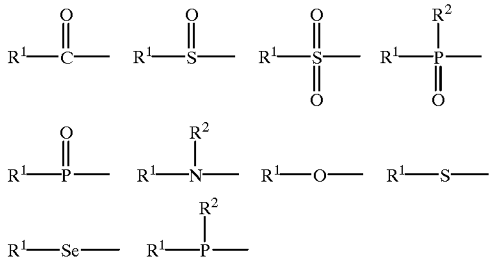

and in the formula, $R^1$ and $R^2$ may be the same or different and represent a monovalent non-metal atom, in the general formula (B), $^{b}Y$ has the same definition as for $^{a}X$ in the general formula (A) or represents —OH, —CN, —$NO_2$, —$Si(R^5)(R^6)(R^7)$; $R^3$ to $R^7$ may be the same or different and represent a monovalent non-metal atom; and $^{b}M^{+}$ represents a monovalent cation, in the general formula (C), $R^8$ represents a monovalent non-metal atom; $Ar^1$ and $Ar^2$ may be the same or different and represent an aryl group; and $^{c}M^{+}$ represents a monovalent cation, in the general formula (D), $^{d}R$ represents an alkyl group or aryl group; and $^{d}M^{+}$ represents a counter cation selected from the group consisting of sulfonium, iodonium, diazonium, ammonium and azinium, in the general formula (E), $^eX^-$ is an anion of a compound having a structure of the following general formula (F);

General formula (F)

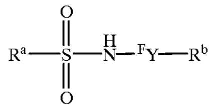

in the formula, $^FY$ represents a single bond, —CO— or —$SO_2$—; each of $R^a$ and $R^b$ independently represents a linear, branched or cyclic alkyl group, aryl group, aralkyl group or camphor group; $R^a$ and $R^b$ may be connected via an alkylene group, arylene group or aralkyl group to form a ring; when $^FY$ is a —CO— group, $R^b$ may be a hydroxyl group or alkoxy group; and, $^eM^+$ represents a counter cation selected from the group consisting of sulfonium, iodonium, diazonium, ammonium and azinium.

When this composition further contains the heat-sensitive composition according to Claim 1 wherein, the composition further comprises (III) a light-heat converting agent, and by exposure in the absorption wavelength of said (III) a light-heat converting agent, an acid or radical of a compound (I) generating an acid or radical by being heated which is represented by at least one of the above-mentioned general formulae (A) to general formula (E) is generated, and there are changed in physical or chemical properties of compound (II) whose physical or chemical properties are changed irreversibly by an acid or radical leading to possibility of recording by exposure.

Further, the planographic printing plate disclosed by the present invention can realize recording by heat mode exposure, and comprises a substrate having disposed thereon a photosensitive layer containing (I) an acid/radical polymerization initiator represented by at least one of the above-mentioned general formula (A) to general formula (E), (III) a light-heat converting agent, (II-a) a radical-polymerizable compound having an unsaturated bond, and (IV) a binder polymer.

In the present invention, "heat mode applicable" means that recording by heat mode exposure is possible. The definition of the heat mode exposure in the present invention will be explained in detail. As described in Hans-Joachim Timpe, IS&Ts NIP 15: 1999 International Conference on Digital Printing Technologies. P. 209, it is known that process which starts with the light-excitation of a light-excitation of a light absorbing substance (for example, a colorant) in a photosensitive material and the resulting chemical or physical change, and is followed by image formation which is caused by said light excitation and resulting chemical or physical changes, is of mainly two modes. One is a so-called photon mode in which a light absorbing substance which has been light-excited is de-activated by certain photochemical mutual action (for example, energy transfer, electron movement) with other reactive substance in a photosensitive material, and a consequently deactivated reactive substance causes chemical or physical change necessary for the above-mentioned image formation. Another is a so-called heat mode in which a light absorbing substance which has been light-excited generates heat and is de-activated, and a reactive substance causes chemical or physical change necessary for the above-mentioned image formation by utilizing this heat. Other models include, special modes such as abrasion in which substances are explosively spattered by light energy locally concentrated, multi-photon absorption in which one molecule absorbs a large number of photons at one time, and the like, however, these modes are omitted in this specification.

An exposure process utilizing each of the above-mentioned modes is called photon mode exposure and heat mode exposure respectively. The technical difference between the photon mode exposure and the heat mode exposure is with respect whether or not the amount of energy of the photons which are exposed can be added to amount of energy of the desired reaction. For example, consider the case where using n photons causes a certain reaction. In the photo mode, because the photos have photochemical action upon each other, the energy of one photo can not be added to the total amount of energy of the reaction according to the law of conservation of energy and the law of conservation of quantum momentum. Namely, to cause a particular reaction, the relation: "energy amount of one photon≧energy amount of reaction" is necessary. On the other hand, in the heat mode exposure, it is possible to add energy amount, since heat is generated after light-excitation and light energy is converted into heat and utilized. Therefore, the relation: "energy amount of n photons≧energy amount of reaction" is sufficient. However, this addition of energy amount is limited by thermal diffusion. Namely, if the next light-excitation-deactivation process occurs and heat is generated by the time heat escapes due to thermal diffusion from the exposed portion (reaction point) being examined, then accumulation of the heat is ensured, leading to increase in temperature at this portion. However, when the next generation of heat is delayed, heat escapes and dose not accumulate. That is, in heat mode radiation, even if the total amount of exposure energy is the same, results are different when light having high energy is radiated for a short period of time, than when light having low energy is radiated for a long period of time, and the former is advantageous with respect to accumulation of heat.

Of course, although there may be cases where a similar phenomenon occur due to the effect of diffusion of material form subsequent reactions, generally speaking, this phenomenon dose not occur in photo mode exposure.

Namely, from the standpoint of properties of a photosensitive material, inherent sensitivity of a photosensitive material (energy amount for reaction required to form image) is constant with respect to exposure power density (w/$cm^2$) (=energy density per unit time) in the photon mode, while in the heat mode, the inherent sensitivity of a photosensitive material increases with respect to the exposure power density. Accordingly, if when being actually used as a image recording material the exposure time is set such that productivity is maintained, when the two modes are compared, it is found that in photo mode exposure, a high sensitivity of 0.1 mJ/$cm^2$ is usually achieved. However since the reaction occurred even when the exposure amount was extremely low, there was a problem of low exposure fogging at non-exposed portions. On the other hand, in the heat mode exposure, a reaction occurs only at exposure amount of certain level or more, and exposure amount of about 50 mJ/$cm^2$ is usually necessary in view of thermal stability of a photosensitive material, however, the problem of low exposure fogging is avoided.

Thus, in the actual heat mode exposure, exposure power density on the surface of a photosensitive material of 5000 w/$cm^2$ or more, preferably 10000 w/$cm^2$ or more, is necessary. Laser having high power density of $5.0\times10^5$/$cm^2$ or more is not described in detail but its use is not preferable due to problems such as occurrence of abrasion, staining of a light source, and the like.

Though the working of the present invention is not clear, (I) an acid/radical generating agent of the general formulae (A) to (E) included in the heat-sensitive composition of the present invention is a compound having a carboxylate or sulfonamide structure in a counter anion in an onium salt structure, and has lower thermal decomposition temperature and higher sensitivity than a compound having a sulfonate ($—SO_3^-$) or inorganic salt ($PF_6^-$, $SbF_6^-$, $BF_4^-$) as a counter anion generally used as a radical polymerization initiator.

Particularly in the case of a compound having a carboxylate, such as those represented by the general formulae (A) to (C), though the reaction mechanism is not definite, it is supposed that by action of heat generated in decomposition of an acid/radical generating agent, a carboxylic acid in a counter anion causes decarboxylation, and an acid or radical is generated not only from a mother nucleus of a sulfonium salt but also from the counter anion side, leading to high sensitivity.

The structure causing decarboxylation easily is a structure in which bond dissociation energy between a carboxyl group and a R group of $R—COO^-$ is low, or a structure in which pKa of R—H which is a hydrogenated body of a R part of a $R—COO^-$ structure is low, for example, pKa is lower than that of a hydrogenated body of methane ($CH_3$—H). Further, regarding the temperature at which decarboxylation is conducted, it is preferable that decarboxylation is caused at a temperature of 250° C. or less, preferably 230° C. or less, further preferably 215° C. or less.

Further, an acid generated in decomposition has lower permeability in alkaline water than a carboxylic acid or carbon dioxide, namely, a compound which is relatively weak acid, and is effective for promotion and initiation of polymerization, and generates a strong acid such as a sulfonic acid and the like, therefore, it is supposed that when this composition is used as a recording layer of a planographic printing plate, damage by an alkaline developer in developing is small, and the film strength of image portion increases, consequently, printing endurance increases.

It has been found that a composition manifesting high sensitivity to heat or exposure and excellent in thermosetting property is obtained by combining an acid/radical generating agent in the present invention with a compound manifesting irreversible change in physical or chemical properties, because of the above-mentioned action.

DETAILED DESCRIPTION OF THE PREFERRED EMBODIMENTS

The present invention will be illustrated in detail below.

In the heat-sensitive composition of the present invention, because of inclusion of (I) an acid/radical generating agent of the general formulae (A) to (E) and (II) a compound which manifests irreversible change in physical and chemical properties by an acid or radical, the acid/radical generating agent (I) of the general formulae (A) to (E) is decomposed, by heat, to generate an acid or radical, and the physical and chemical properties of the compound (II) which manifests irreversible change in physical and chemical properties by an acid or radical are changed by the generated acid or radical, to cause a hardening reaction, color development reaction, decoloring reaction and the like by radical polymerization. When this heat-sensitive composition further contains (III) a light-heat converting agent, by irradiation with light having a wavelength of this light-heat converting agent, for example, infrared laser and the like, the light-heat converting agent (III) generates heat, the acid/radical generating agent (I) of the general formulae (A) to (E) is decomposed by heat of the infrared laser light itself or heat generated by the light-heat converting agent (III), to generate an acid or radical, causing change in properties of the compound (II) which manifests irreversible change in physical and chemical properties by an acid or radical.

(I) Compound Generating Acid/Radical of the General Formulae (A) to (E)

The acid/radical generating agent used in the present invention is represented by the following general formulae (A) to (E).

$^{a}X—COO^{-a}M^{+}$ General formula (A)

General formula (B)

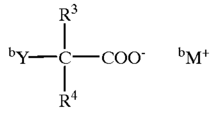

General formula (C)

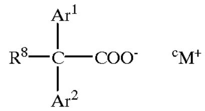

$^{d}R—COO^{-d}M^{+}$ General formula (D)

$^{e}X^{-e}M^{+}$ General formula (E)

In the formula (A), $^{a}X$ represents one of the groups shown below or a halogen atom;

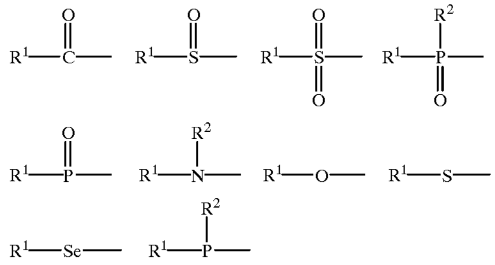

and in the formula, $R^1$ and $R^2$ may be the same or different and represent a monovalent non-metal atom.

$R^1$ and $R^2$ preferably represent hydrogen, alkyl group, alkenyl group or alkynyl group, or aryl group, cycloalkyl group, cycloalkenyl group, cycloalkynyl group having 1 to 20 carbon atom, or alkoxy group having 1 to 10 carbon atoms, and these may be substituted with one or more of halogen atoms, carbonyl groups, alkoxy groups, ester groups, thioether groups, amide groups, imide groups, hydroxyl group, nitro group, cyano group, thiocarbonyl groups, amino groups, sulfonate groups, sulfoxide groups, aryl groups, silyl group and the like.

From the standpoint of sensitivity, an alkyl group, alkenyl group or aryl group having 1 to 12 carbon atoms are preferable.

Preferable aryl groups include phenyl, naphthalene, anthracene, imidazole, indole, carbazole, furan, benzofuran, benzimidazole, oxazole, benzoxazole, benzothiazole, pyridine, triazole, pyrazole, thiophene and the like are listed, and further preferably, phenyl, naphthalene, anthracene and indole are listed.

$^{a}M^{+}$ represents a monovalent cation, and specifically, and specifically include, $Li^+$, $Na^+$, $K^+$, phosphonium, selenonium, oxonium, siliconium, carbonium, sulfonium, iodoniumdiazonium, ammonium and azinium ions.

Here, the azinium is a moiety having an azine ring which is a 6-membered ring containing a nitrogen atom in the structure, and includes pyridinium, diazinium and triazinium. Azinium contains one or more aromatic rings condensed with an azine ring, and includes, for example, quinolinium, isoquinolinium, benzoazinium, naphthoazinium and the like. Specifically, those described, for example, in U.S. Pat. No. 4,743,528, JP-A Nos. 63-138345, 63-142345 and 63-142346, and JP-B No. 46-42363, and counter cations forming 1-methoxy-4-phenylpyridinium tetrafluoroborate, N-alkoxypyridinium salts and the like are examples.

Of these cations, $Li^+$, $Na^+$, $K^+$, ammonium, iodonium and sulfonium are preferable from the standpoints of stability and sensitivity, and compounds having a diaryl iodonium or triaryl sulfonium skeleton represented by the following general formula ($^a$M-I) or ($^a$-MII) are further preferable from the standpoints of stability and sensitivity.

($^a$M-I)

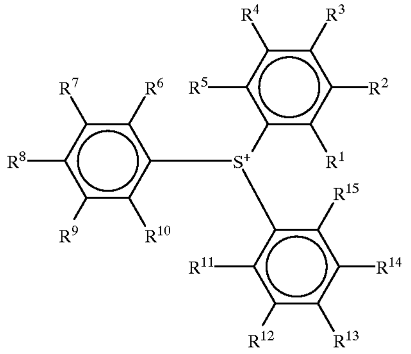

($^a$M-II)

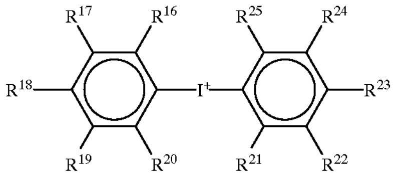

In the above-mentioned formulae ($^a$M-I) and ($^a$M-II), $R^1$ to $R^{25}$ independently represent a hydrogen atom, linear, branched or cyclic alkyl group, linear, branched or cyclic alkoxy group, hydroxy group, halogen atom or —S—$R^{26}$ group. Here, $R^{26}$ represents a linear, branched or cyclic alkyl or aryl group.

As the linear and branched alkyl groups $R^1$ to $R^{25}$ in the general formula ($^a$M-I) or ($^a$M-II),groups having 1 to 4 carbon a toms such as a methyl group, ethyl group, propyl group, n-butyl group, sec-butyl group and t-butyl group, optionally having a substituent, are listed. As the cyclic alkyl group, groups having 3 to 8 carbon atoms such as a cyclopropyl group, cyclopentyl group and cyclohexyl group, optionally having a substituent, are listed.

As the alkoxy groups $R^1$ to $R^{25}$, groups having 2 to 4 carbon atoms such as a methoxy group, ethoxy group, hydroxyethoxy group, propoxy group, n-butoxy group, isobutoxy group, sec-butoxy group and t-butoxy group are listed.

As the halogen atoms $R^1$ to $R^{25}$, a fluorine atom, chlorine atom, bromine atom and iodine atom are listed.

As the aryl group $R^{26}$, groups having 6 to 14 carbon atoms such as a phenyl group, tolyl group, methoxyphenyl group, naphthyl group and the like are listed. The aryl group may have a substituent.

As the preferable substituent which can be carried on groups $R^1$ to $R^{25}$, alkoxy groups having 1 to 4 carbon atom, halogen atoms (fluorine atom, chlorine atom, iodine atom), aryl groups having 6 to 10 carbon atom, alkenyl groups having 2 to 6 carbon atoms, cyano group, hydroxyl group, carboxy group, alkoxycarbonyl groups, nitro group and the like are listed.

General formula (B)

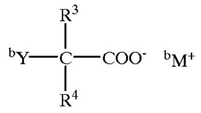

In the general formula (B), $^b$Y has the same definition as for $^a$X in the general formula (A) or represents —OH, —CN, —$NO_2$, —Si ($R^5$) ($R^6$) ($R^7$), and $R^3$ to $R^7$ may be the same or different and represent a monovalent non-metal atom. $^b M^+$ represents a monovalent cation, and specific examples preferably include the same cations listed as examples for the general formula (A).

Specifically, $R^3$ to $R^7$have the same definition as that for $R^1$ and $R^2$ in the general formula (A), and $R^3$ and $R^4$ preferably represent a hydrogen atom, alkyl group having 1 to 6 carbon atoms or aryl group having 6 to 10 carbon atom. Further, $R^3$ and $R^4$ may bond with each other to form a ring.

$R^5$ to $R^7$ preferably represent an alkyl group having 1 to 6 carbon atoms, aryl group having 6 to 10 carbon atoms or alkoxy group having 1 to 6 carbon atoms.

General formula (C)

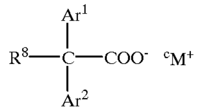

In the general formula (C), $R^8$ represents a monovalent non-metal atom. $Ar^1$ and $Ar^2$ may be the same or different and represent an aryl group. $^c M^+$ represents a monovalent cation, and specific examples include the same cations gives as examples for the general formula (A).

Specifically, $R^8$ has the same definition as $R^1$ and $R^2$ in the general formula (A), and $R^8$ represents preferably a hydrogen atom, alkyl group having 1 to 6 carbon atoms, aryl group having 6 to 10 carbon atom or a hydroxyl group.

As the $Ar^1$ and $Ar^2$, specifically, phenyl, naphthalene, anthracene, imidazole, indole, carbazole, furan, benzofuran, benzimidazole, oxazole, benzoxazole, benzothiazole, pyridine, triazole, pyrazole, thiophene are listed, and further preferably, phenyl, naphthalene, anthracene and indole are listed.

Among them, examples of acid/radical generating agent suitably used in the present invention, from the standpoints of stability and heat reactivity include those represented by the general formula (A) in which $^a$X has the following structure:

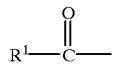

and, those represented by the general formula (B) in which $^b$Y has one of the following structures, and those represented by the general formula (C).

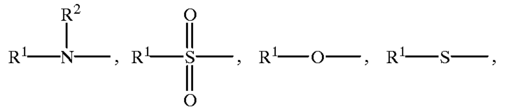

Among the above-mentioned materials, the most preferable acid/radical generating agents are those represented by the general formula (A) in which ${}^{a}X$ has the following structure:

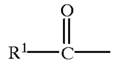

The general formula (D) is as follows.

${}^{d}R—COO^{-}\,{}^{d}M^{+}$ General formula (D)

In the above-mentioned formula, ${}^{d}R$ represents preferably an alkyl group having 1 to 20 carbon atoms or an aryl group having 1 to 20 carbon atoms. ${}^{d}R$ may have a cyclic structure. Further, these alkyl group and aryl group may have a substituent, and as the substituents which can be introduced, for example, alkyl groups, alkoxy groups, alkenyl groups, alkynyl groups, amino groups, cyano group, hydroxyl group, halogen atoms, amide groups, ester groups, carbonyl group, carboxyl group and the like are specifically listed, and these may have a substituent as described above. Further, two or more substituents may be bond to each other to form a ring, and further, the cyclic structure may be a heterocyclic structure containing a nitrogen atom, sulfur atom and the like.

With regard to the polymerization initiator of the present invention, ${}^{d}R—COOH$, that is a conjugate acid of the carboxylate ${}^{d}R—COO^{-}$ of the general formula (D), has a pKa in water of preferably 2 or more, further preferably 3 or more. When pKa in water is 2 or more, the thermal decomposition temperature of the initiator tends to decrease, and this is believed to contribute to increase in sensitivity.

${}^{d}M^{+}$ represents a counter cation selected from sulfonium, iodonium, diazonium, ammonium and azinium.

Here, the azinium is a moiety having an azine ring which is a 6-membered ring containing a nitrogen atom in the structure, and includes pyridinium, diazinium and triazinium. Azinium contains one or more aromatic rings condensed with an azine ring, and includes, for example, quinolinium, isoquinolinium, benzoazinium, naphthoazinium and the like. Specifically, those described, for example, in U.S. Pat. No. 4,743,528, JP-A Nos. 63-138345, 63-142345 and 63-142346, and JP-B No. 46-42363 are listed, and counter cations forming 1-methoxy-4-phenylpyridinium tetrafluoroborate, N-alkoxypyridinium salts and the like are given as examples.

Of these cations, compounds having, as a counter cation, iodonium or sulfonium are preferable, further, compound having a diaryliodonium or triarylsulfonium skeleton are preferable from the standpoints of stability and sensitivity. The structure of the iodonium skeleton is preferably a diarylsulfonium skeleton from the standpoint of stability, and the aryl group may be substituted in the same manner as for the above-mentioned aryl group.

Further, the general formula (E) is as follows.

${}^{e}X^{-}\,{}^{e}M^{+}$ General formula (E)

In the above-mentioned formula, ${}^{e}X^{-}$ is an anion of a compound having a structure of the following general formula (F).

General formula (F)

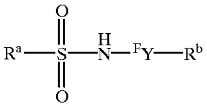

In the above-mentioned formula, ${}^{F}Y$ represents a single bond, —CO— or —$SO_2$—. ${}^{F}Y$ preferably represents —CO— from the standpoints of sensitivity and stability, and compounds of the general formula (F) having a pKa from 0 to 6 are further preferable embodiments.

Each of $R^a$ and $R^b$ independently represents a linear, branched or cyclic alkyl group, aryl group, aralkyl group or camphor group. $R^a$ and $R^b$ may be connected via an alkylene group, arylene group or aralkyl group to form a ring. When ${}^{F}Y$ is a —CO— group, $R^b$ may be a hydroxyl group or alkoxy group.

$R^a$ and $R^b$ preferably represent an alkyl group having 1 to 20 carbon atoms, an aryl group having 1 to 20 carbon atoms or an aralkyl group having 1 to 20 carbon atoms. The alkyl group, aryl group and aralkyl group may have a substituent, and as the substituents which can be introduced in these groups, examples include alkyl groups, alkoxy groups, alkenyl groups, phenyl groups, alkynyl groups, amino groups, cyano groups, hydroxyl groups, a halogen atom, amide groups, ester groups, carbonyl groups, and carboxyl groups and these may also have the above substituents. Further, two or more substituents may bond to each other to form a ring, and furthermore, the cyclic structure may be a heterocyclic structure containing a nitrogen atom, sulfur atom and the like.

Examples of compounds having a structure of the general formula (F) which can form a counter anion of the compound (E) are given below, but the scope of the present invention is not limited to these examples.

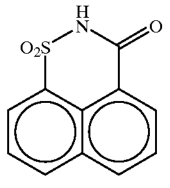

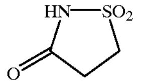

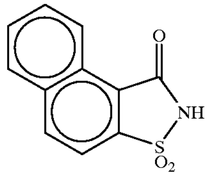

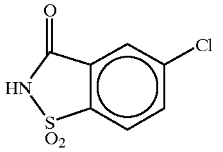

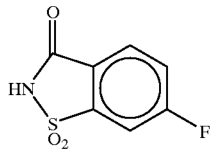

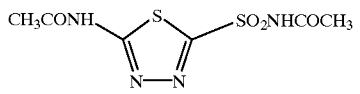

-continued
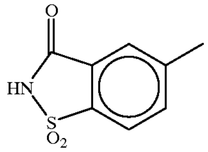 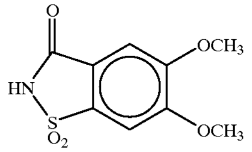
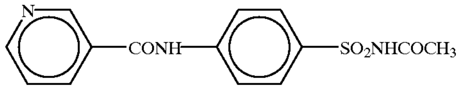
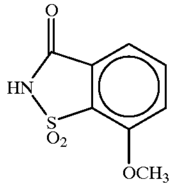 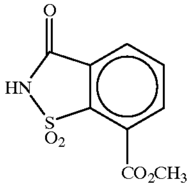
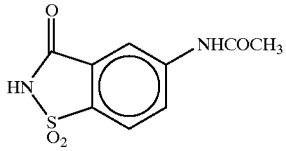
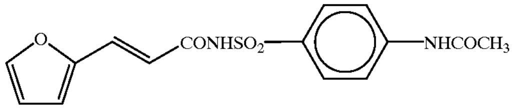
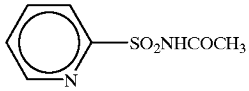 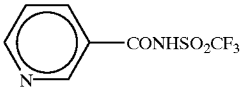
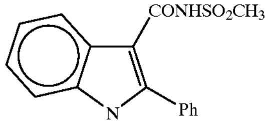
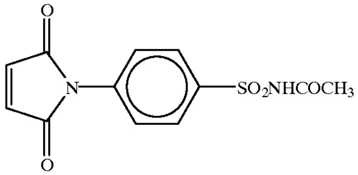
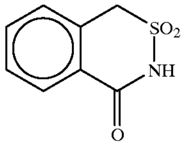 
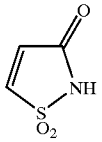 $CH_3SO_2NHCOCH_3$
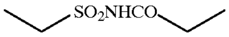
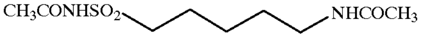
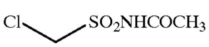 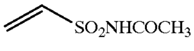
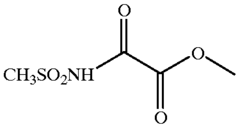
-continued
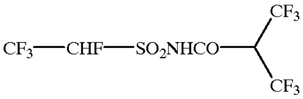 $CCl_3$—$SO_2NHCOCH_3$
PhCONH—$SO_2CF_3$ 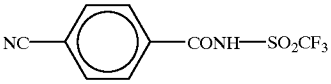
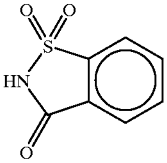 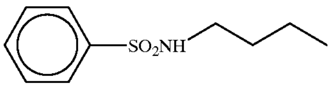
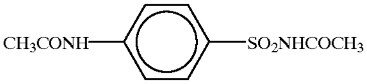
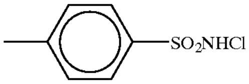
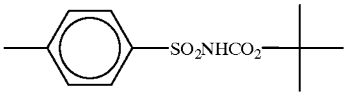
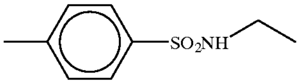
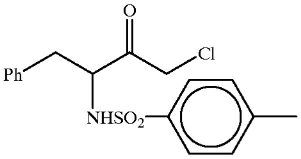
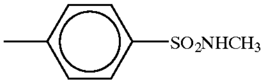
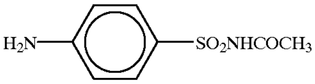
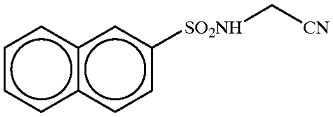
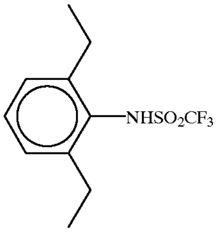
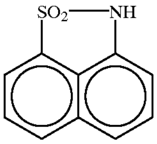 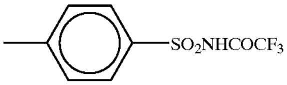

-continued

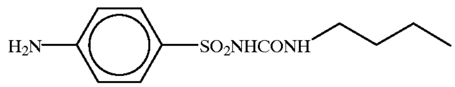

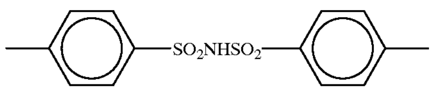

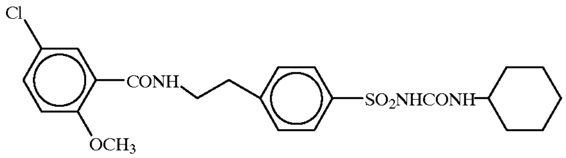

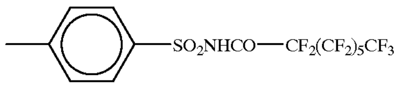

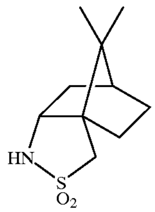

More preferable examples of the component (E) include compounds having the following general formulae (ii) and (iii) By using these compounds, sensitivity and printing endurance become more excellent. By heating these compounds or irradiating a composition containing a light-heat converting agent with light to generate heat, compounds having a structure of the general formula (F) corresponding to $X^-$ in the general formula (ii) or (iii), function as an acid generating agent or radical initiator.

General formula (ii)

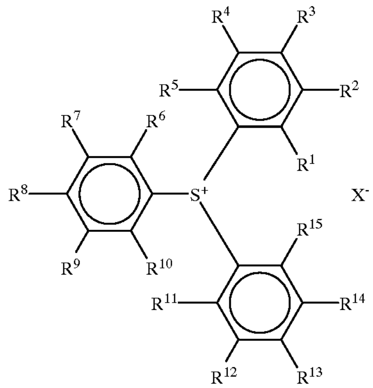

General formula (iii)

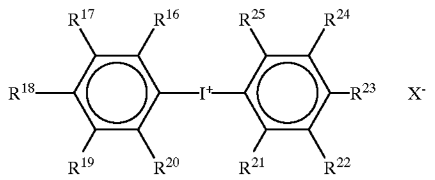

In the above-mentioned formulae, $R^1$ to $R^{25}$ represent a hydrogen atom, linear, branched or cyclic alkyl group, linear, branched or cyclic alkoxy group, hydroxy group, halogen atom or —S—$R^{26}$ group. Here, $R^{26}$ represents a linear, branched or cyclic alkyl or aryl group. Here, $X^-$ is an anion of a compound having a structure of the general formula (F).

As the linear and branched alkyl groups $R^1$ to $R^{25}$ in the general formula (ii) or (iii), groups having 1 to 4 carbon atoms such as a methyl group, ethyl group, propyl group, n-butyl group, sec-butyl group and t-butyl group, optionally having a substituent, are listed. As the cyclic alkyl group, groups having 3 to 8 carbon atoms such as a cyclopropyl group, cyclopentyl group and cyclohexyl group, optionally having a substituent, are listed.

As the alkoxy groups $R^1$ to $R^{25}$, groups having 2 to 4 carbon atoms such as a methoxy group, ethoxy group, hydroxyethoxy group, propoxy group, n-butoxy group, isobutoxy group, sec-butoxy group and t-butoxy group are listed.

As the halogen atoms $R^1$ to $R^{25}$, a fluorine atom, chlorine atom, bromine atom and iodine atom are listed.

As the aryl group $R^{26}$, groups having 6 to 14 carbon atoms such as a phenyl group, tolyl group, methoxyphenyl group, naphthyl group and the like are listed. The aryl group may have a substituent.

As the preferable substituent which can be carried on groups $R^1$ to $R^{25}$, alkoxy groups having 1 to 4 carbon atom, halogen atoms (fluorine atom, chlorine atom, iodine atom), aryl groups having 6 to 10 carbon atom, alkenyl groups having 2 to 6 carbon atoms, cyano group, hydroxyl group, carboxy group, alkoxycarbonyl groups, nitro group and the like are listed.

${}^eM^+$ represents a counter cation selected from sulfonium, iodonium, diazonium, ammonium and azinium.

Here, the azinium is a moiety having an azine ring which is a 6-membered ring containing a nitrogen atom in the structure, and includes pyridinium, diazinium and triazinium. Azinium contains one or more aromatic rings condensed with an azine ring, and includes, for example, quinolinium, isoquinolinium, benzoazinium, naphthoazinium and the like. Specifically, those described, for example, in U.S. Pat. No. 4,743,528, JP-A Nos. 63-138345, 63-142345 and 63-142346, and JP-B No. 46-42363 are listed, and counter cations forming 1-methoxy-4-phenylpyridinium tetrafluoroborate, N-alkoxypyridinium salts and the like are examples.

Of these cations, compound having, as a counter cation, iodonium or sulfonium are preferable from the standpoints of stability and sensitivity, and further, compounds having a diaryl iodonium or triaryl sulfonium skeleton are preferable.

Specific examples of the acid/radical generating agent of the general formulae (A) to (E) are shown below in combination with anion portions corresponding to the preferable counter cation, but the scope of the present invention is not limited to these examples.

First, specific examples of the acid/radical generating agent of the general formulae (A) [Exemplary compounds (I-1) to (I-28)] are given.

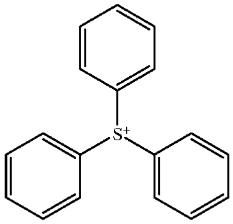
(I-1)
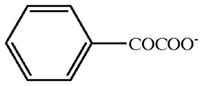
(I-2)
$CH_3COCOO^-$
(I-3)
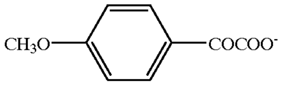
(I-4)
HS—$CH_2COCOO^-$
(I-5)
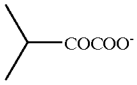
(I-6)
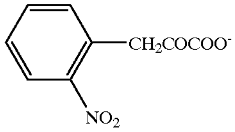
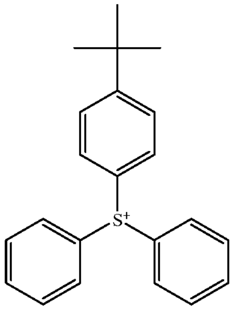
(I-7)
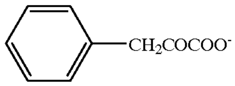
(I-8)
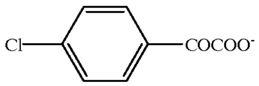
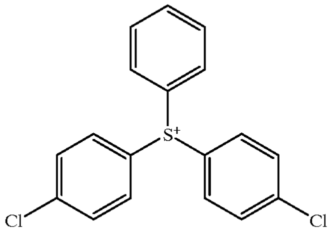
(I-9)
$HCOCOO^-$
-continued
(I-10)
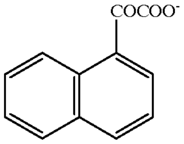
(I-11)
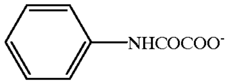
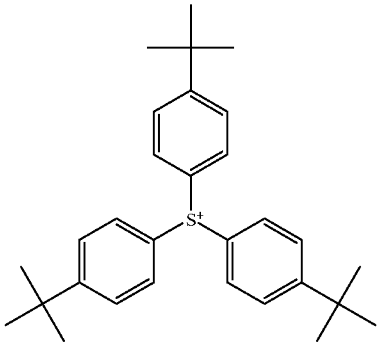
(I-12)
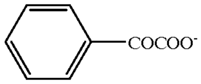
(I-13)
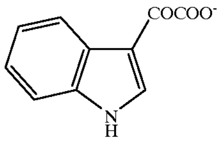
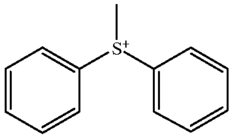
(I-14)
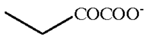
(I-15)
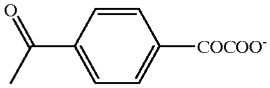
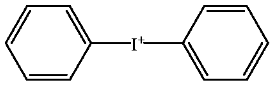
(I-16)
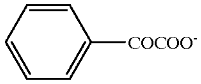
(I-17)
$CH_3COCOO^-$
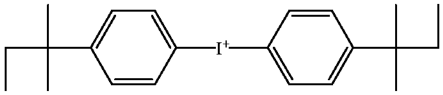

-continued (I-18)

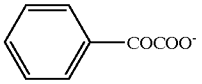

(I-19)

$CF_3COCOO^-$

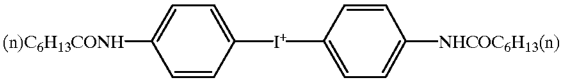

(I-20)

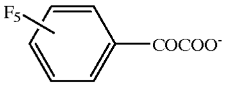

(I-21)

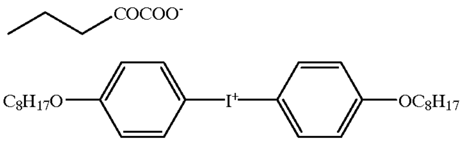

(I-22)

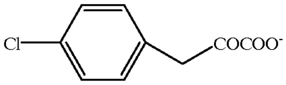

(I-23)

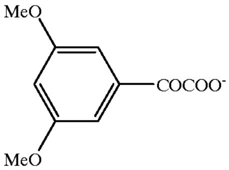

(I-24)

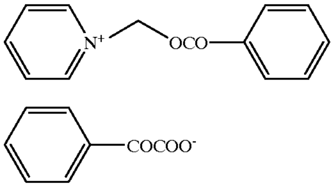

(I-25)

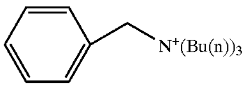 $CH_3COCOO^-$ (I-26)

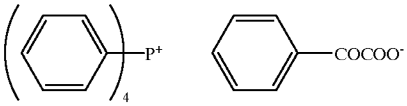

(I-27)

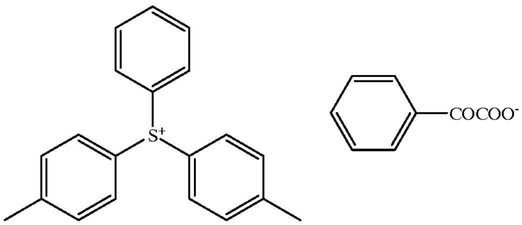

-continued (I-28)

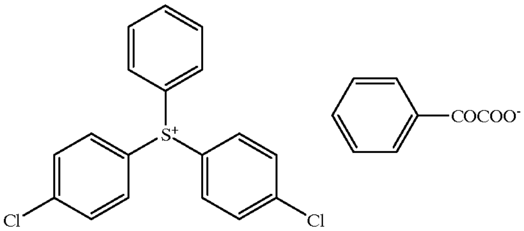

In addition, as a specific example of a preferred acid/radical generating agent of the general formula (A), Exemplary compound (I-a) is shown below.

(I-a)

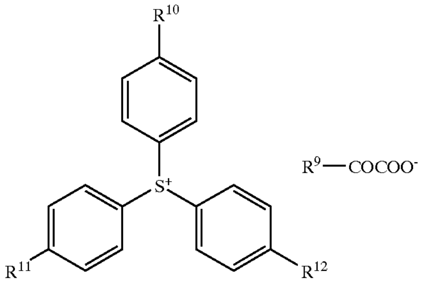

wherein in compound (I-a), $R^9$ represents a phenyl group or an alkyl group having 1 to 4 carbon atom(s); and $R^{10}$, $R^{11}$ and $R^{12}$ each independently represents a hydrogen atom, halogen atom, a methyl group, or a butyl group.

Since the counter anion of the above-shown compound (I-a) has the structure of $—COCOO^-$, compound (I-a) is superior in thermal degradability, high sensitivity, and stability.

Followings are the $^1$HNMR spectral peaks observed using Unity-plus (300 MHz) (trade name, manufactured by Varian Associates, Inc.) of the above-shown (I-1), (I-2), (I-12), (I-24) and (I-25).

(I-1): 7.38(m, 2H), 7.48(m, 1H), 7.61–7.74(m, 9H), 7.82 (m, 6H), and 8.06(m, 2H)

(I-2): 2.29(s, 9H) and 7.67–7.80(m, 15H)

(I-12): 1.32(s, 9H), 7.38(m, 2H), 7.47(m, 1H), 7.63(m, 6H), 7.74(m, 6H), and 8.09(m, 2H)

(I-27): 2.42(s, 6H), 7.33–7.49(m, 7H), 7.59–7.76(m, 7H), 7.73–7.76(m, 2H), and 8.04–8.07(m, 2H)

(I-28): 7.36–7.41(m, 2H), 7.47–7.52(m, 1H) and 7.56–7.87(m, 13H).

Specific examples of the acid/radical generating agent of the general formula (B) [Exemplary compounds (II-1) to (II-47)] are shown below.

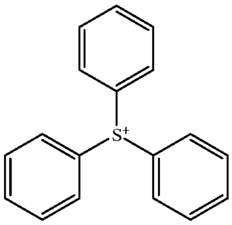

-continued
(II-1)
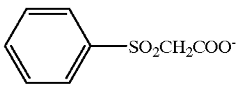
(II-2)
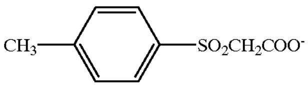
(II-3)
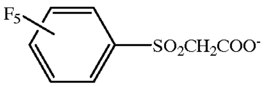
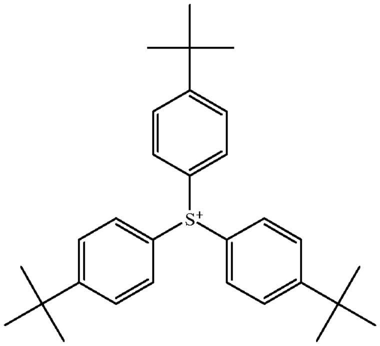
(II-4)
$CH_3SO_2CH_2COO^-$
(II-5)
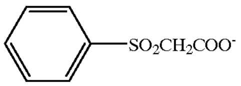
(II-6)
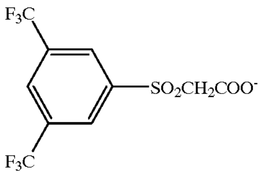
(II-7)
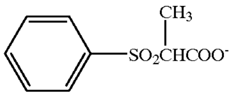
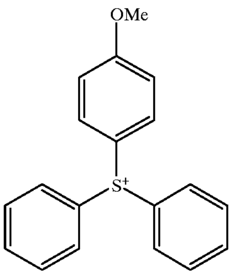
(II-8)
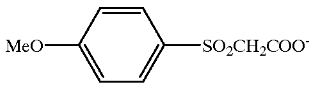
-continued
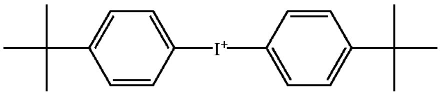
(II-9)
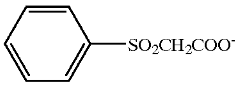
(II-10)
$(n)C_4H_9SO_2CH_2COO^-$
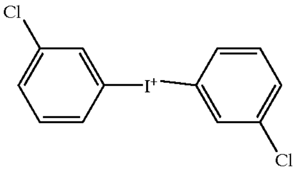
(II-11)
$CH_3SO_2CH_2COO^-$
(II-12)
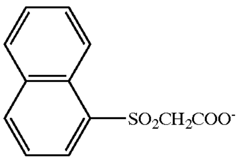
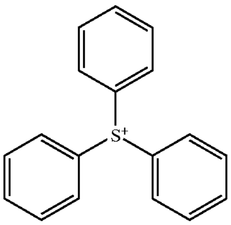
(II-13)
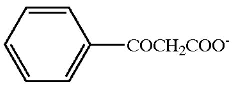
(II-14)
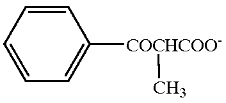
(II-15)
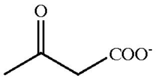
(II-16)
$CN—CH_2COO^-$
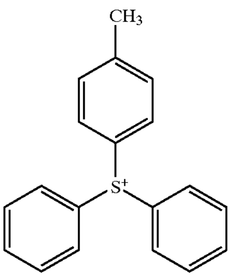
(II-17)
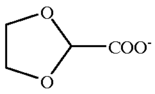

-continued
(II-18)
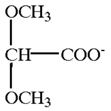
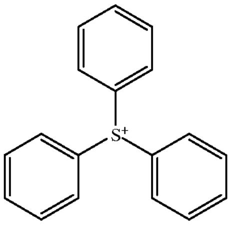
(II-19)
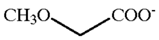
(II-20)
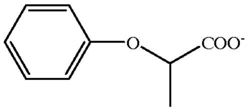
(II-21)
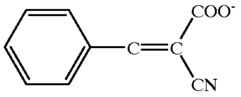
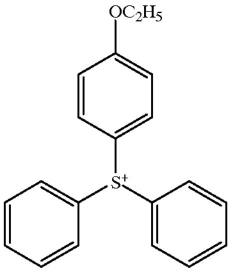
(II-22)
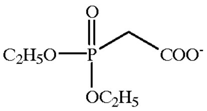
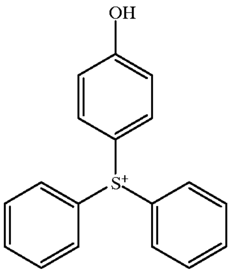
(II-23)
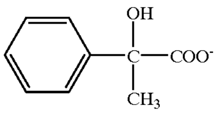
-continued
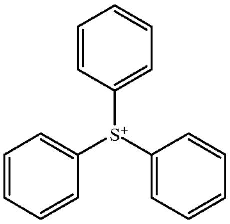
(II-24)
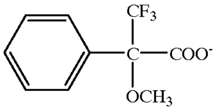
(II-25)
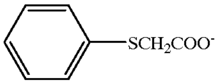
(II-26)
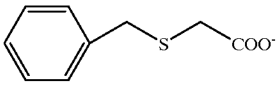
(II-27)
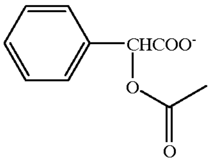
(II-28)
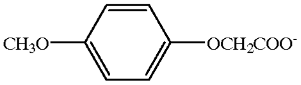
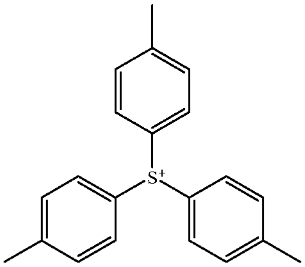
(II-29)
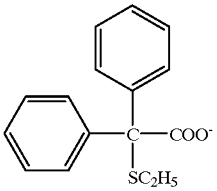
(II-30)
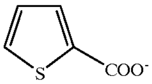

-continued
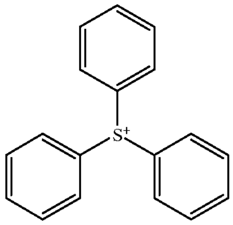
(II-31)
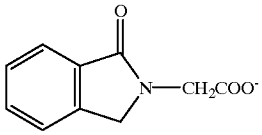
(II-32)
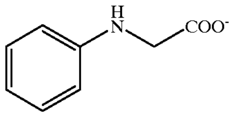
(II-33)
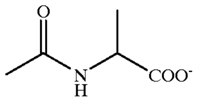
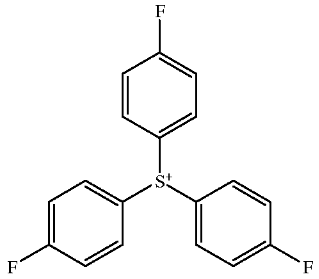
(II-34)
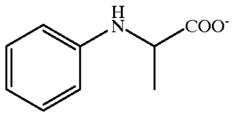
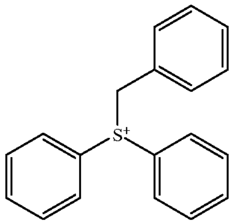
(II-35)
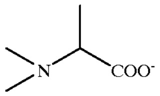
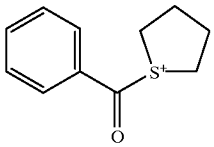
-continued
(II-36)
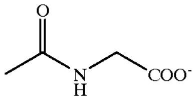
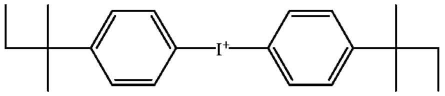
(II-37)
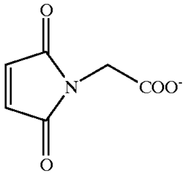
(II-38)
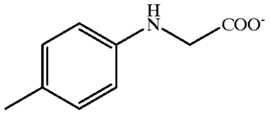
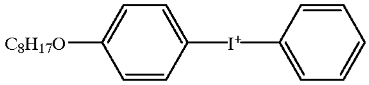
(II-39)
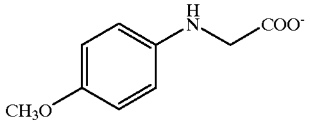
(II-40)
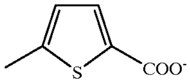
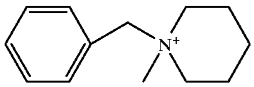
(II-41)
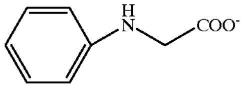
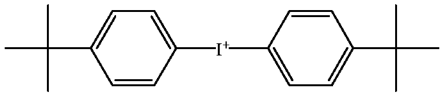
(II-42)
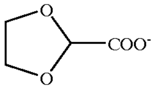
(II-43)
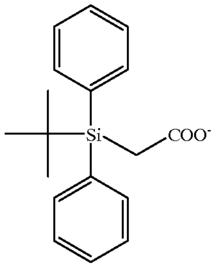

-continued
(II-44)
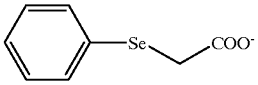
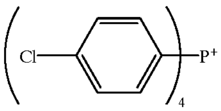
(II-45)
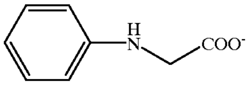
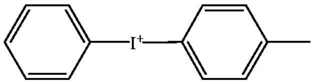
(II-46)
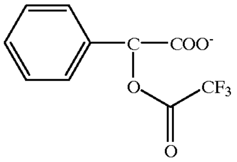
(II-47)
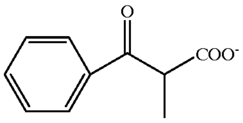
Specific examples of the acid/radical generating agent of the general formula (C) [Exemplary compounds (III-1) to (III-17)] are shown below.
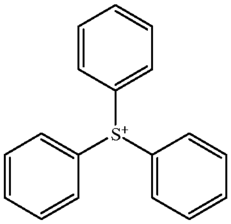
(III-1)
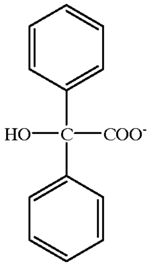
-continued
(III-2)
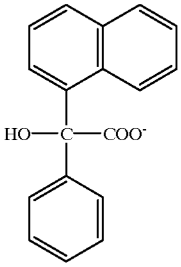
(III-3)
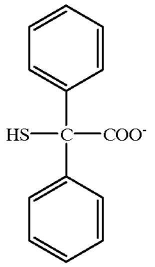
(III-4)
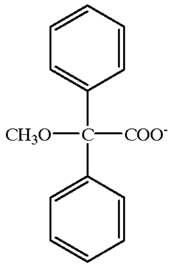
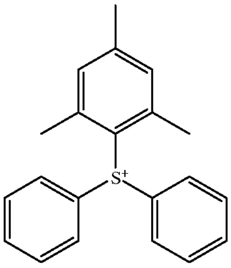
(III-5)
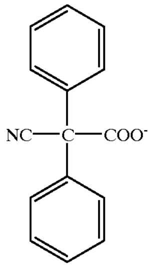
(III-6)
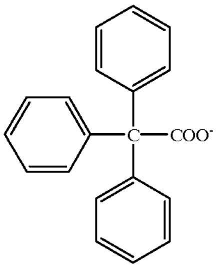

-continued
(III-7)
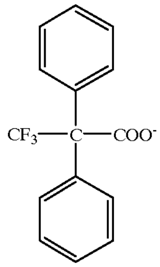
(III-8)
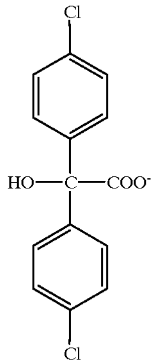
(III-9)
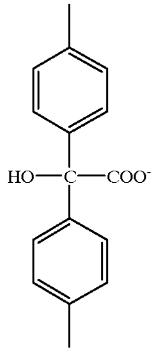
(III-10)
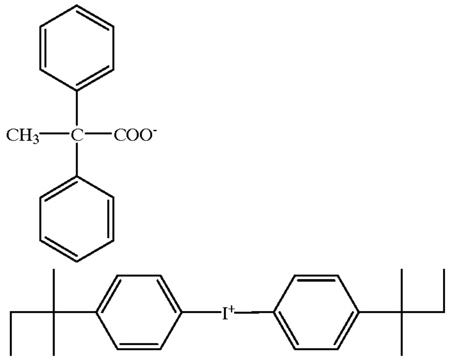
(III-11)
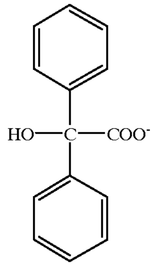
-continued
(III-12)
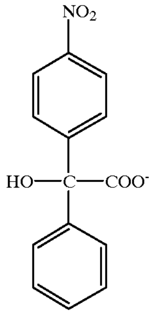
(III-13)
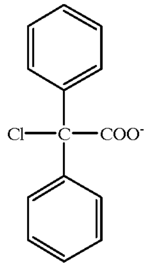
(III-14)
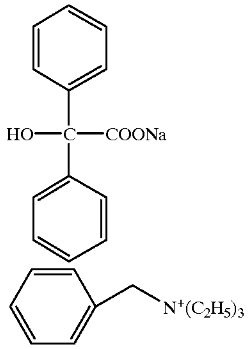
(III-15)
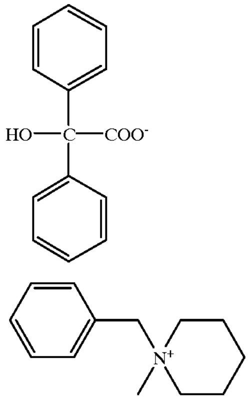
(III-16)
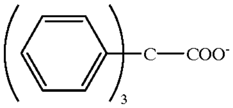
(III-17)
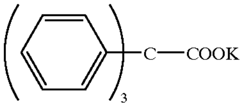

Examples of carboxylic acid suitable for forming the radical polymerization initiator of the general formulae (A) to (C) are shown below.
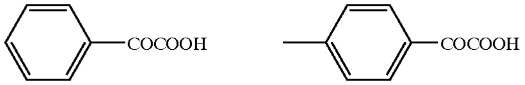
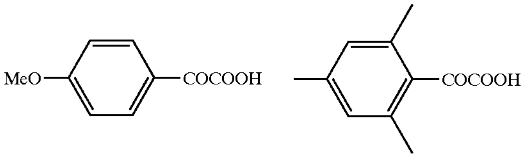
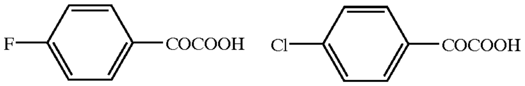
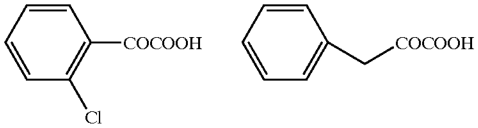
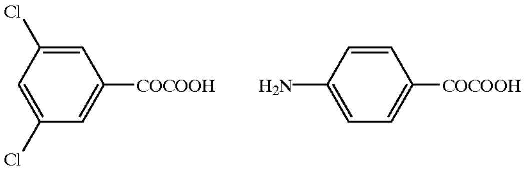
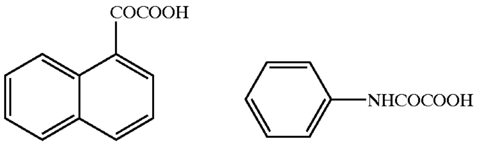
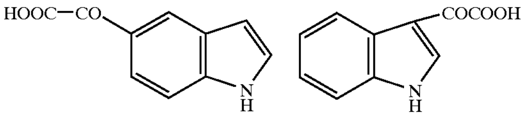
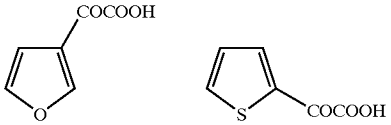
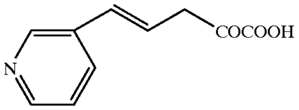
$CH_3COCOOH$
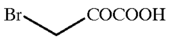
HCOCOOH
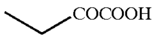
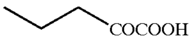
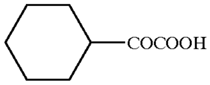
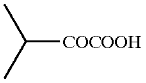
HS—$CH_2COCOOH$
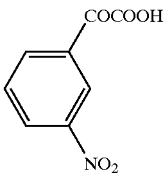
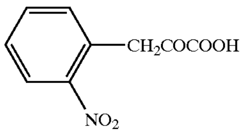
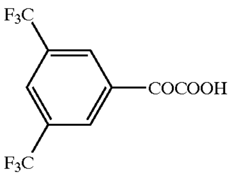
-continued
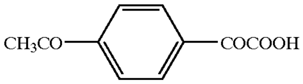
$Cl_3C$—COCOOH
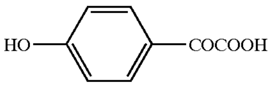
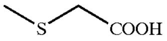
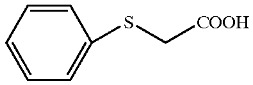
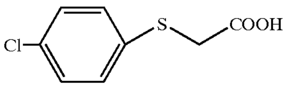
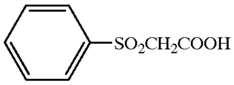
$CH_3SO_2CH_2COOH$
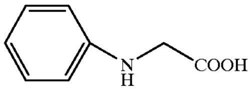
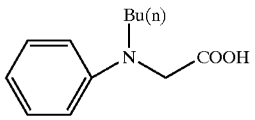
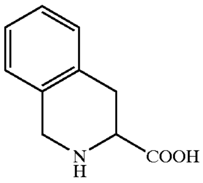
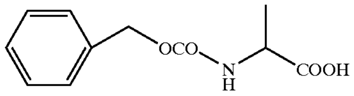
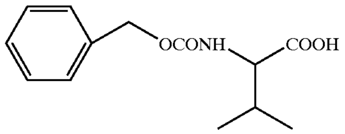
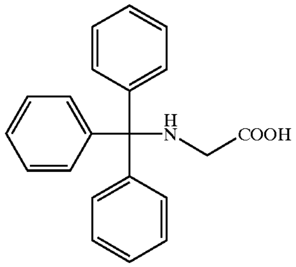
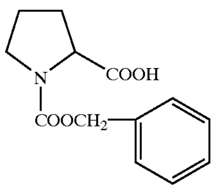
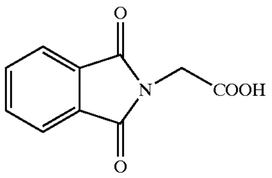
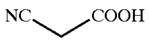
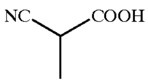
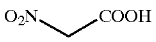
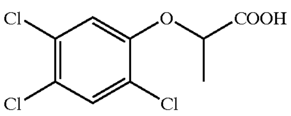
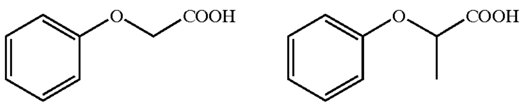
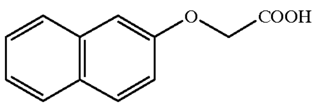

-continued
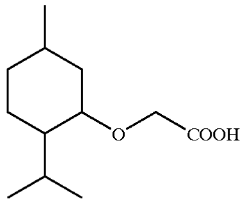
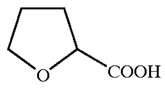
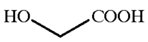
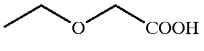
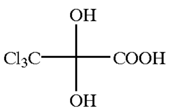
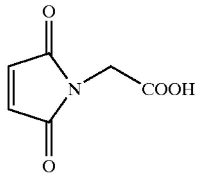
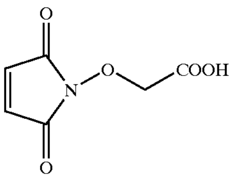
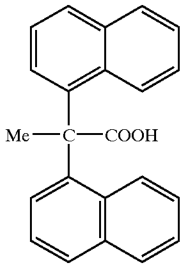
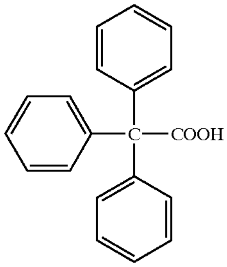
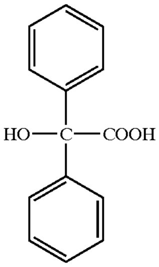
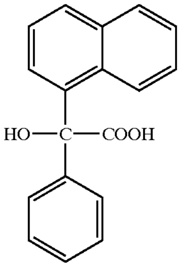
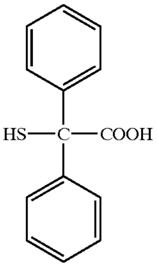
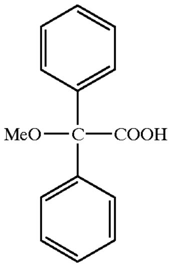
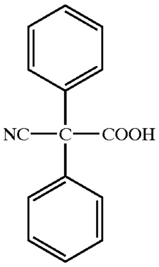
-continued
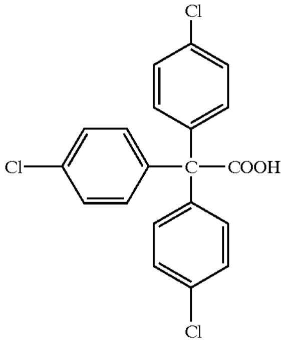
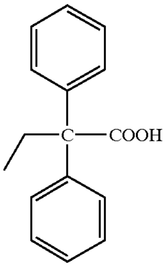
As specific examples of the acid/radical generating agent of the general formulae (D), first, preferable iodonium salt (iodonium is counter cation) compounds [Exemplary compounds (IVA-1) to (IVJ-8)] are shown below.
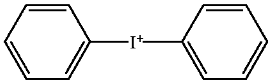
(IVA-1)
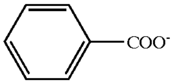
(IVA-2)
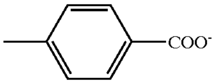
(IVA-3)
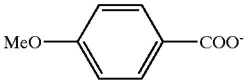
(IVA-4)
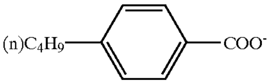
(IVA-5)
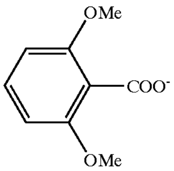
(IVA-6)
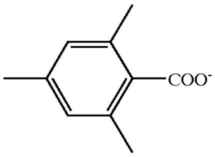
(IVA-7)
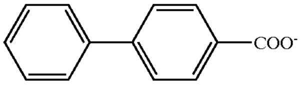
(IVA-8)
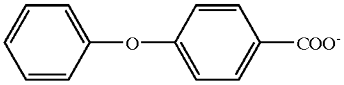
(IVA-9)
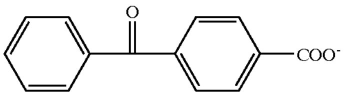

-continued
(IVA-10)
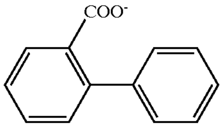
(IVA-11)
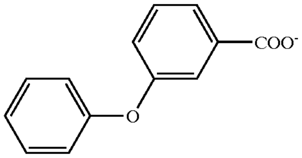
(IVA-12)
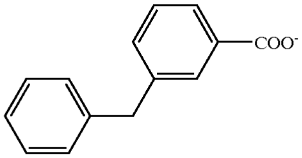
(IVA-13)
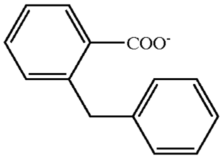
(IVA-14)
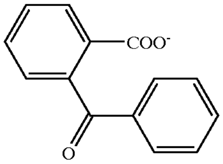
(IVA-15)
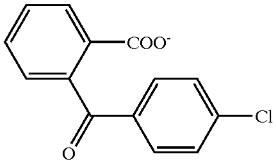
(IVA-16)
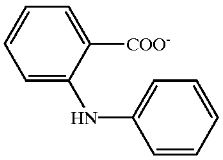
(IVA-17)
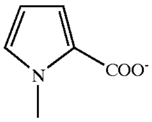
(IVA-18)
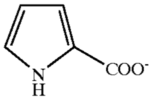
(IVA-19)
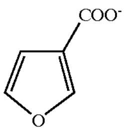
-continued
(IVA-20)
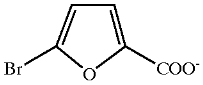
(IVA-21)
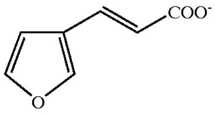
(IVA-22)
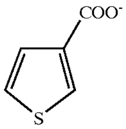
(IVA-23)
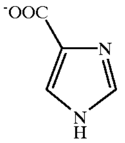
(IVA-24)
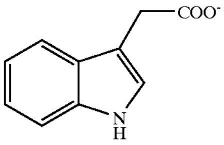
(IVA-25)
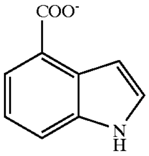
(IVA-26)
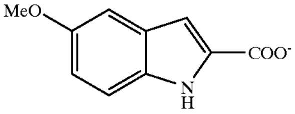
(IVA-27)
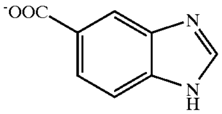
(IVA-28)
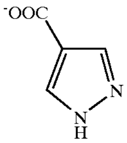
(IVA-29)
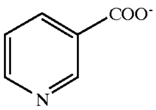
(IVA-30)
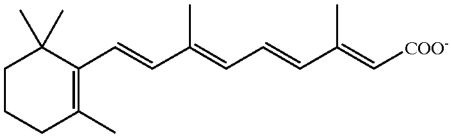
(IVA-31)
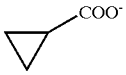

-continued
(IVA-32)
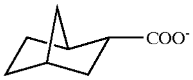
(IVA-33)
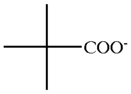
(IVA-34)
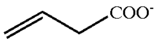
(IVA-35)
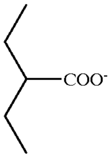
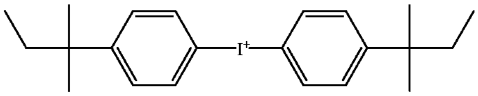
(IVB-1)
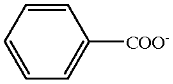
(IVB-2)
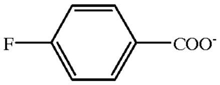
(IVB-3)
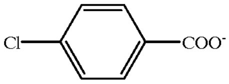
(IVB-4)
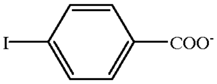
(IVB-5)
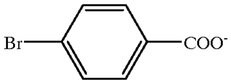
(IVB-6)
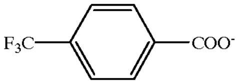
(IVB-7)
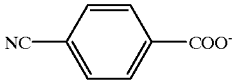
(IVB-8)
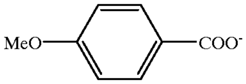
(IVB-9)
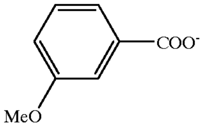
-continued
(IVB-10)
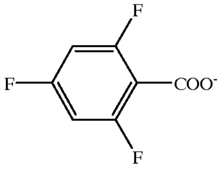
(IVB-11)
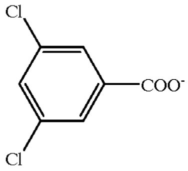
(IVB-12)
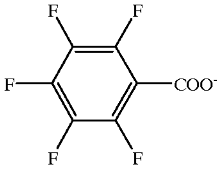
(IVB-13)
$CH_3COO^-$
(IVB-14)
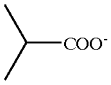
(IVB-15)
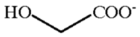
(IVB-16)
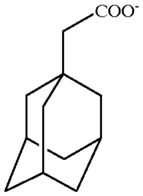
(IVB-17)
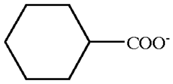
(IVB-18)
$CCl_3COO^-$
(IVB-19)
$C_8F_{17}COO^-$
(IVB-20)
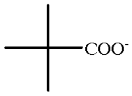
(IVB-21)
$C_{15}F_{31}COO^-$
(IVB-22)
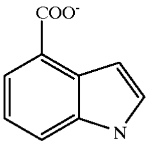

-continued
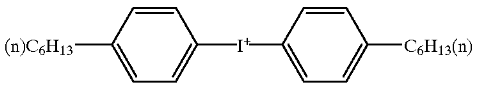
(IVC-1)
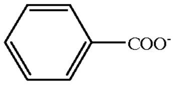
(IVC-2)
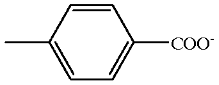
(IVC-3)
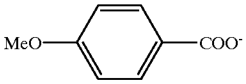
(IVC-4)
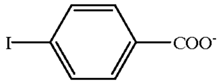
(IVC-5)
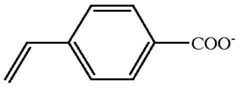
(IVC-6)
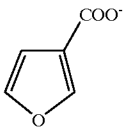
(IVC-7)
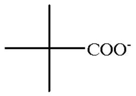
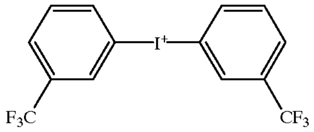
(IVD-1)
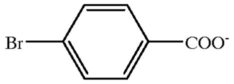
(IVD-2)
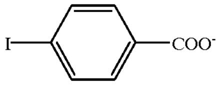
(IVD-3)
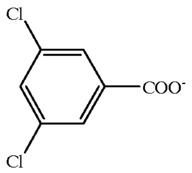
(IVD-4)
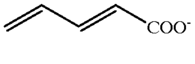
-continued
(IVD-5)
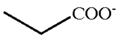
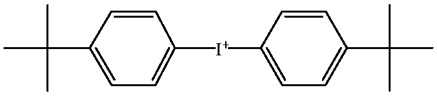
(IVE-1)
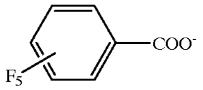
(IVE-2)
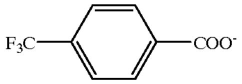
(IVE-3)
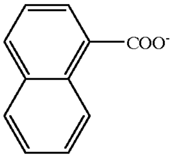
(IVE-4)
$CH_3COO^-$
(IVE-5)
$CF_3COO^-$
(IVE-6)
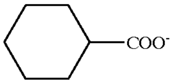
(IVE-7)
$CCl_3COO^-$
(IVE-8)
(IVE-9)
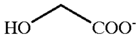
(IVE-10)
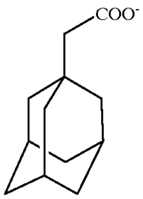
(IVE-11)
$C_{20}H_{41}COO^-$
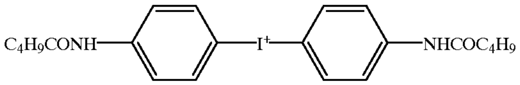
(IVF-1)
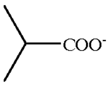
(IVF-2)
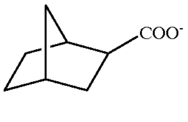

-continued
(IVF-3)
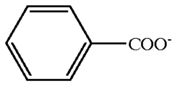
(IVF-4)
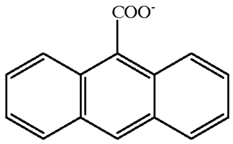
(IVF-5)
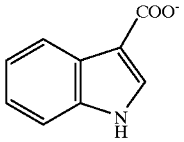
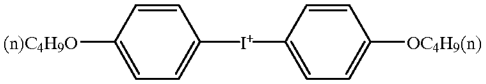
(IVG-1)
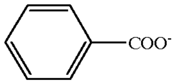
(IVG-2)
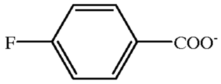
(IVG-3)
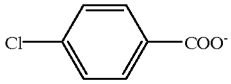
(IVG-4)
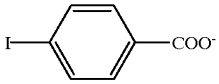
(IVG-5)
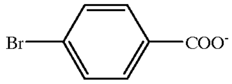
(IVG-6)
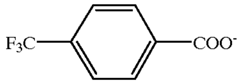
(IVG-7)
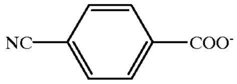
(IVG-8)
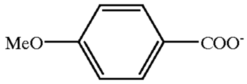
(IVG-9)
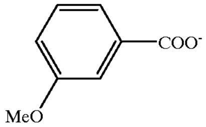
-continued
(IVG-9)
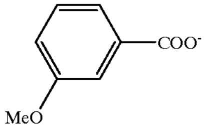
(IVG-10)
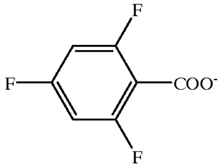
(IVG-11)
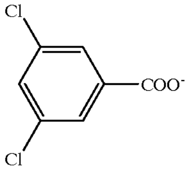
(IVG-12)
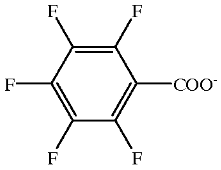
(IVG-13)
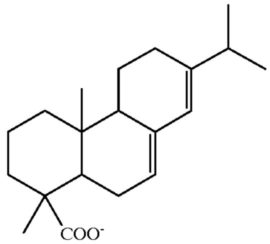
(IVG-14)
$CH_3COO^-$
(IVG-15)
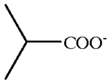
(IVG-16)
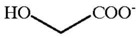
(IVG-17)
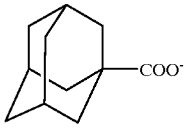
(IVG-18)
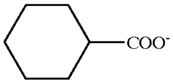
(IVG-19)
$CCl_3COO^-$
(IVG-20)
$C_8F_{17}COO^-$ -continued
(IVG-21)
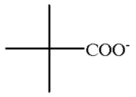
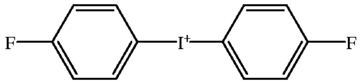
(IVH-1)
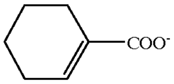
(IVH-2)
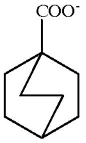
(IVH-3)
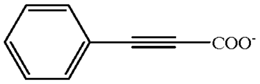
(IVH-4)
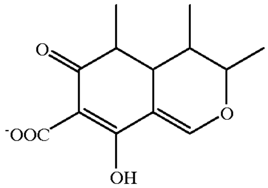
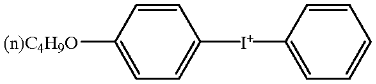
(IVI-1)
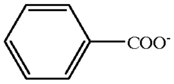
(IVI-2)
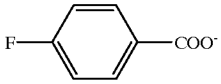
(IVI-3)
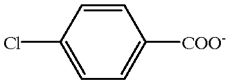
(IVI-4)
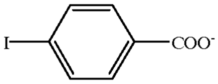
(IVI-5)
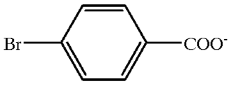
(IVI-6)
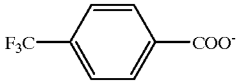
-continued
(IVI-7)
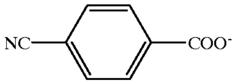
(IVI-8)
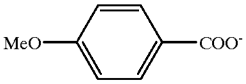
(IVI-9)
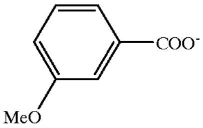
(IVI-10)
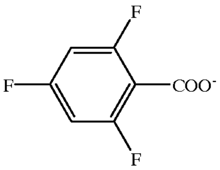
(IVI-11)
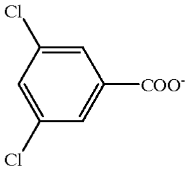
(IVI-12)
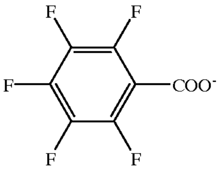
(IVI-13)
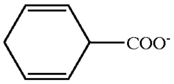
(IVI-14)
$CH_3COO^-$
(IVI-15)
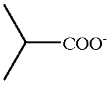
(IVI-16)
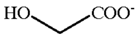
(IVI-17)
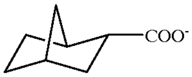
(IVI-18)
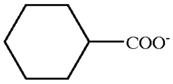
(IVI-19)
$CCl_3COO^-$ -continued (IVI-20)

$C_8F_{17}COO^-$ (IVI-21)

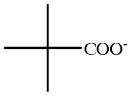

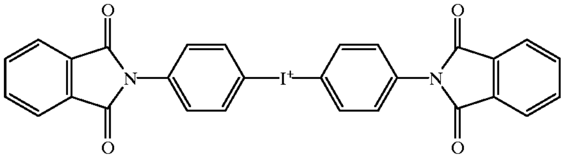

(IVJ-1)

$CF_3COO^-$ (IVJ-2)

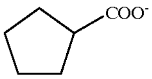

(IVJ-3)

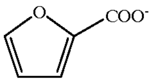

(IVJ-4)

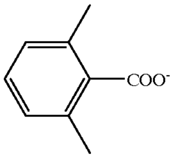

(IVJ-5)

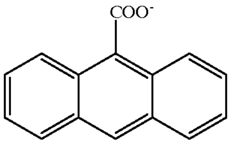

(IVJ-6)

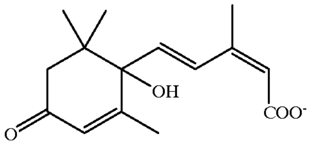

(IVJ-7)

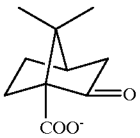

(IVJ-8)

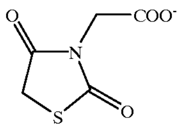

As the structure of a sulfonium skeleton, a triarylsulfonium skeleton is preferable from the standpoints of sensitivity and stability, and the aryl group may be substituted in the same manner as for the above-mentioned aryl group. Then, preferable sulfonium salt (sulfonium is a counter cation) compounds [Exemplary compounds (SA-1) to (SJ-12)] are shown below.

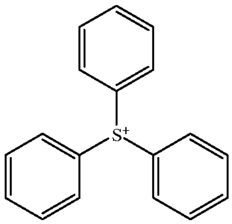

(SA-1)

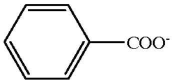

(SA-2)

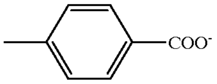

(SA-3)

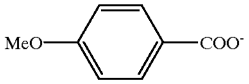

(SA-4)

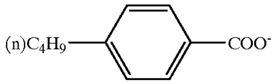

(SA-5)

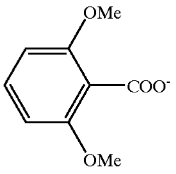

(SA-6)

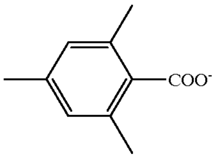

(SA-7)

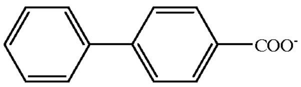

(SA-8)

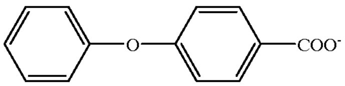

(SA-9)

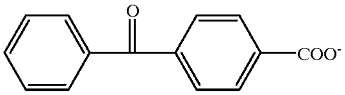

(SA-10)

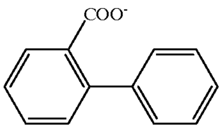

-continued
(SA-11)
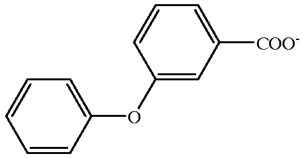
(SA-12)
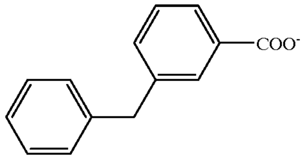
(SA-13)
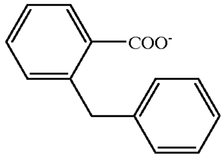
(SA-14)
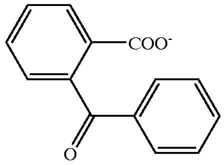
(SA-15)
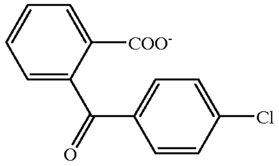
(SA-16)
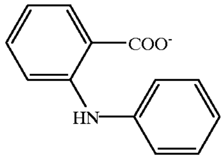
(SA-17)
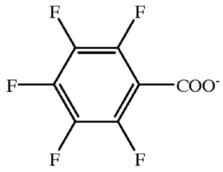
(SA-18)
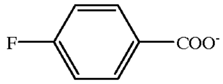
(SA-19)
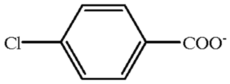
-continued
(SA-20)
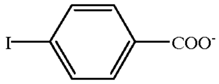
(SA-21)
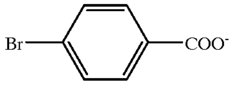
(SA-22)
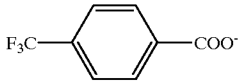
(SA-23)
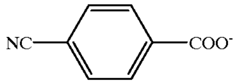
(SA-24)
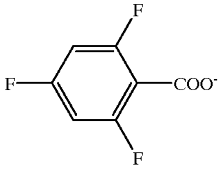
(SA-25)
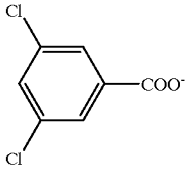
(SA-26)
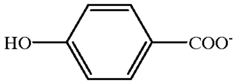
(SA-27)
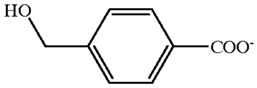
(SA-28)
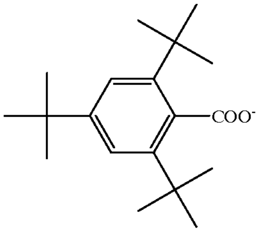
(SA-29)
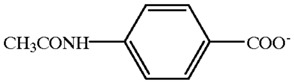
(SA-30)
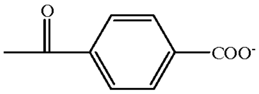

-continued
(SA-31)
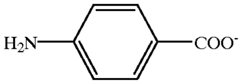
(SA-32)
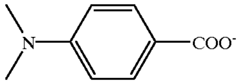
(SA-33)
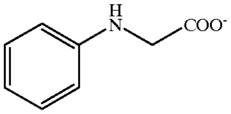
(SA-34)
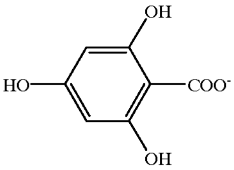
(SA-35)
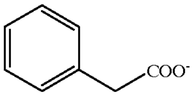
(SA-36)
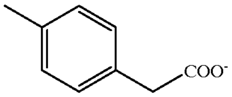
(SA-37)
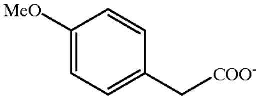
(SA-38)
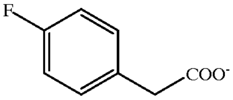
(SA-39)
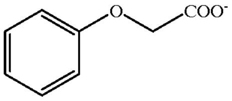
(SA-40)
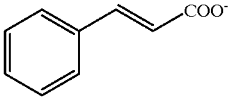
(SA-41)
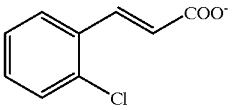
-continued
(SA-42)
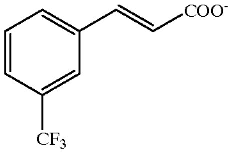
(SB-1)
$CH_3COO^-$
(SB-2)
$C_{15}H_{31}COO^-$
(SB-3)
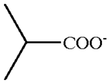
(SB-4)
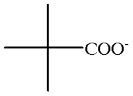
(SB-5)
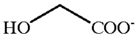
(SB-6)
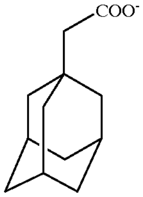
(SB-7)
$C_8F_{17}COO^-$
(SB-8)
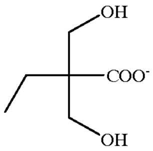
(SB-9)
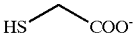
(SB-10)
$CF_3COO^-$
(SB-11)
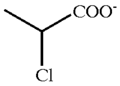
(SB-12)
(SB-13)
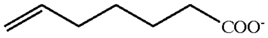
(SB-14)
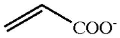
(SB-15)
$CH_3(CH_2)_{17}CH_2COO^-$
(SB-16)
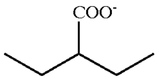

-continued
(SB-17)
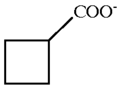
(SB-18)
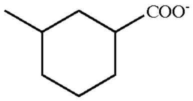
(SB-19)
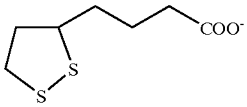
(SB-20)
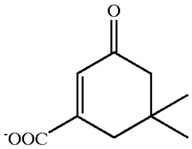
(SB-21)
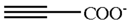
(SB-22)
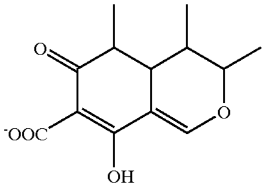
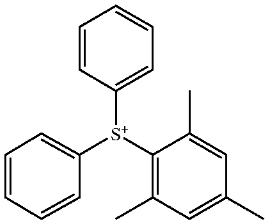
(SC-1)
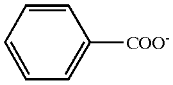
(SC-2)
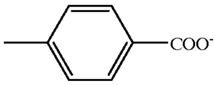
(SC-3)
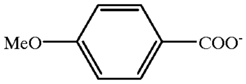
(SC-4)
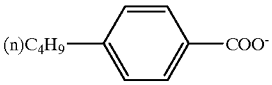
-continued
(SC-5)
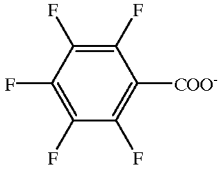
(SC-6)
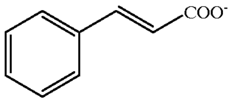
(SC-7)
$CH_3CH_2COO^-$
(SC-8)
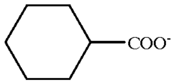
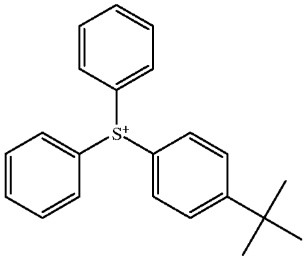
(SD-1)
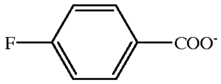
(SD-2)
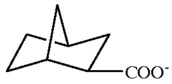
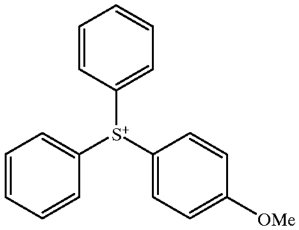
(SE-1)
$CH_3COO^-$
(SE-2)
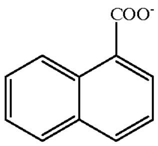
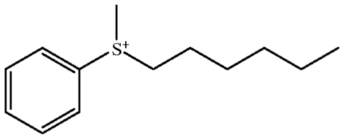

-continued
(SF-1)
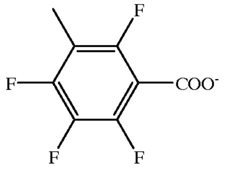
(SF-2)
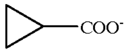
(SF-3)
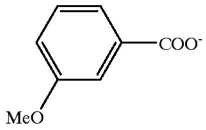
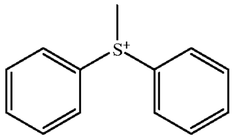
(SG-1)
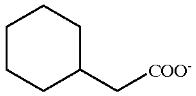
(SG-2)
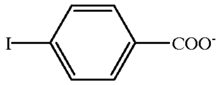
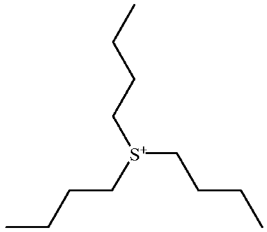
(SH-1)
$CCl_3COO^-$
(SH-2)
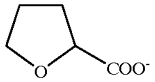
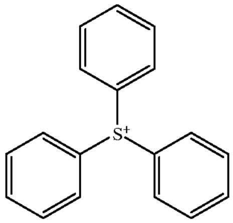
(SI-1)
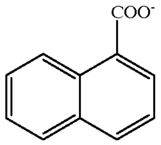
-continued
(SI-2)
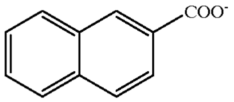
(SI-3)
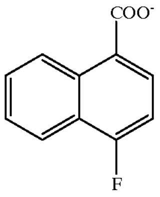
(SI-4)
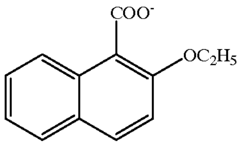
(SI-5)
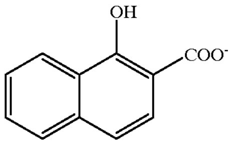
(SI-6)
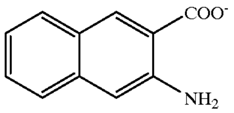
(SI-7)
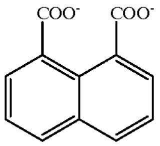
(SI-8)
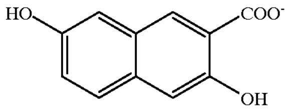
(SI-9)
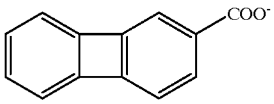
(SI-10)
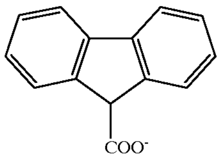
(SI-11)
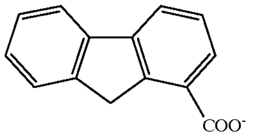

-continued
(SI-12)
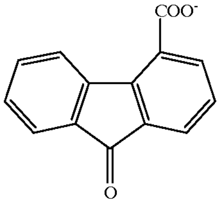
(SI-13)
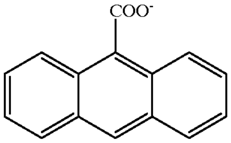
(SI-14)
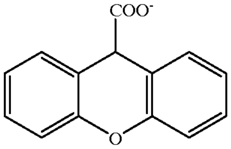
(SI-15)
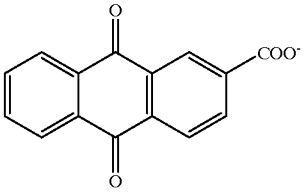
(SI-16)
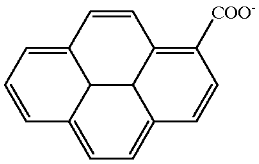
(SJ-1)
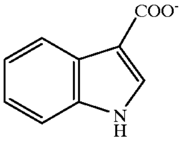
(SJ-2)
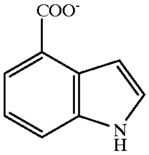
(SJ-3)
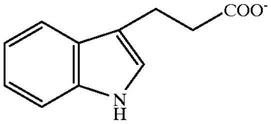
(SJ-4)
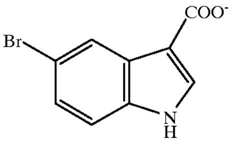
-continued
(SJ-5)
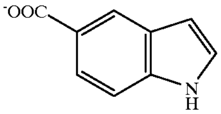
(SJ-6)
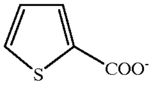
(SJ-7)
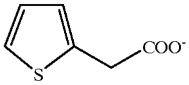
(SJ-8)
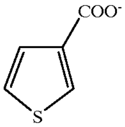
(SJ-9)
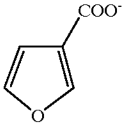
(SJ-10)
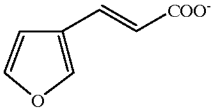
(SJ-11)
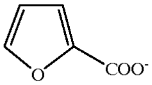
(SJ-12)
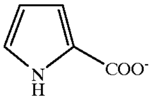
In radical polymerization initiators regarding compounds of the general formula (D), examples of carboxylic acids (R—COOH) suitable for forming a cation portion ($^{d}$R—$COO^{-}$) are shown below.
HCOOH $CH_2ClCOOH$ 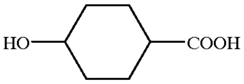
$CH_3COOH$ $CF_3COOH$ $CH_3OCH_2COOH$ 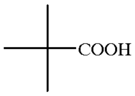
$C_8F_{17}COOH$ $CF_3(CF_2)_7CF_2COOH$ $CH_3OCH_2CH_2COOH$ -continued
$C_{20}H_{41}COOH$ $CCl_3COOH$ 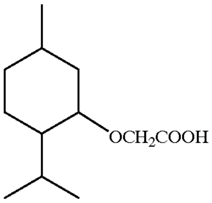
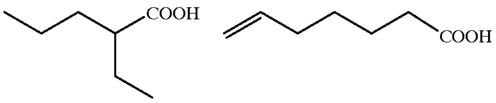
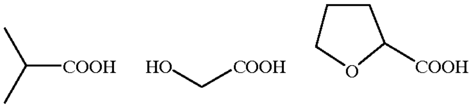
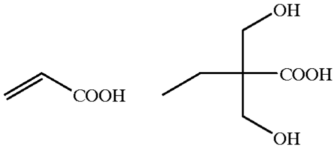 $HSCH_2COOH$
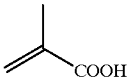 $HO(CH_2)_{11}COOH$ 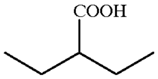
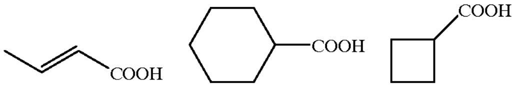
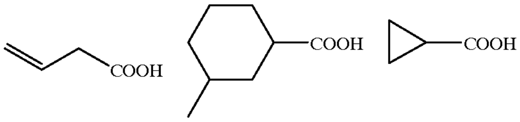
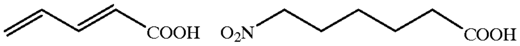
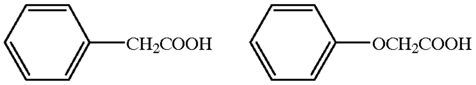
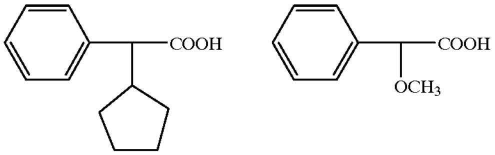
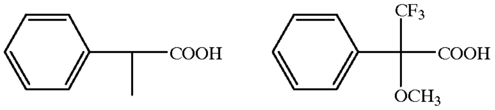
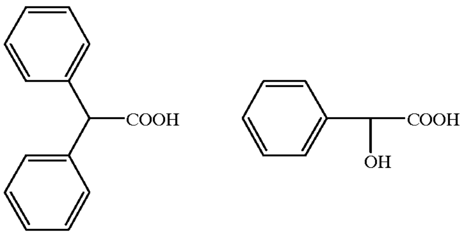
-continued
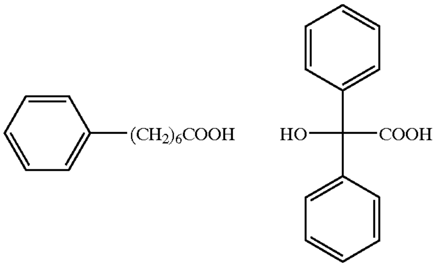
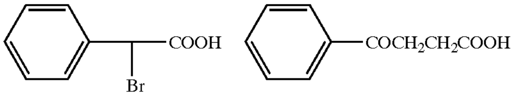
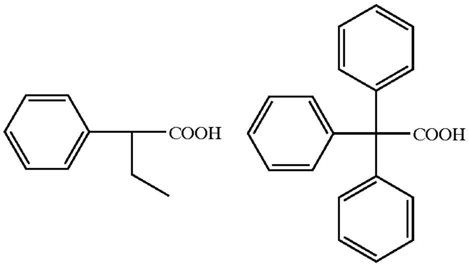
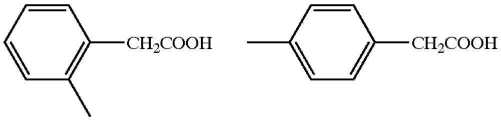
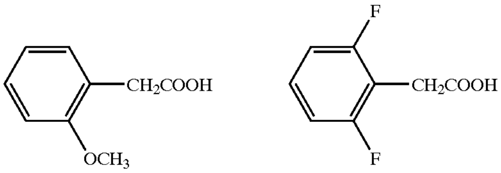
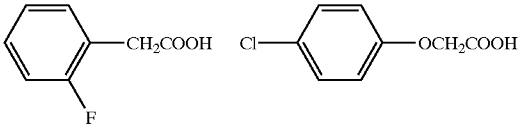
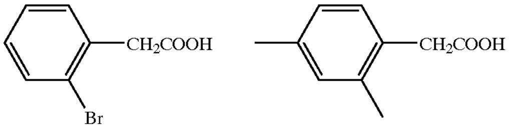
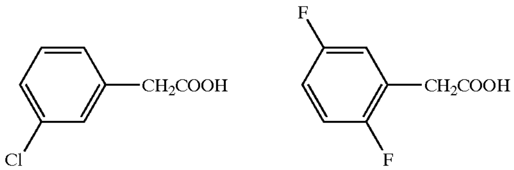
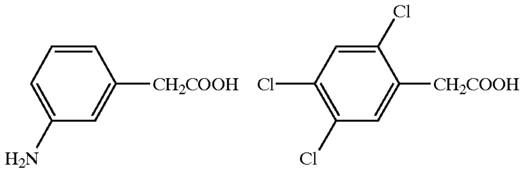
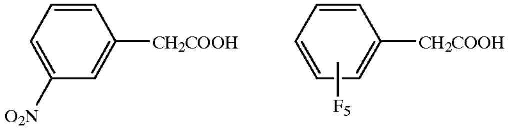

-continued
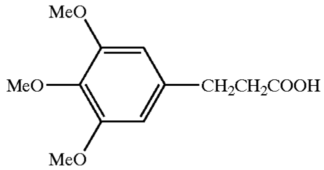
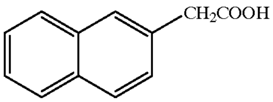
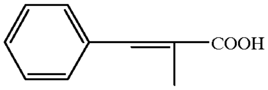
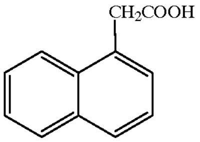
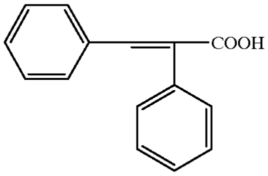
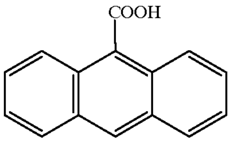
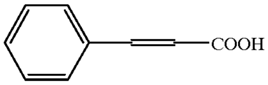
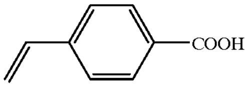
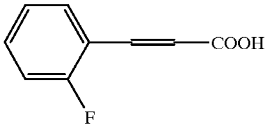
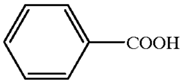
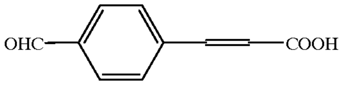
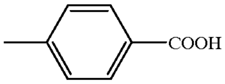
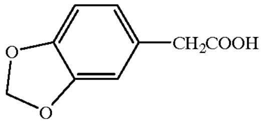
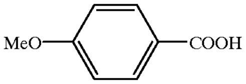
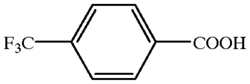
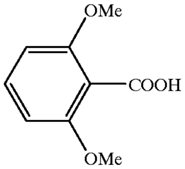
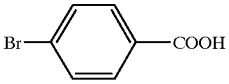
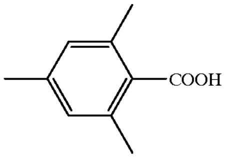
-continued
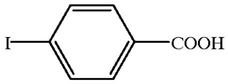
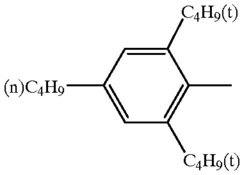
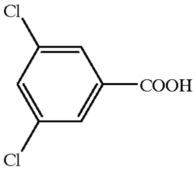
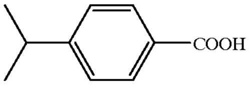
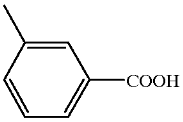
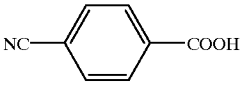
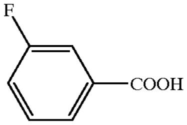
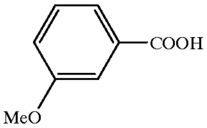
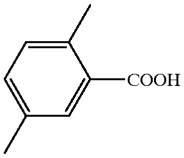
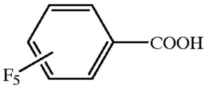
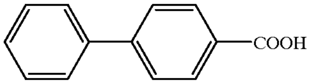
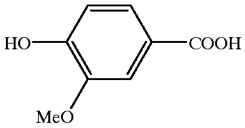
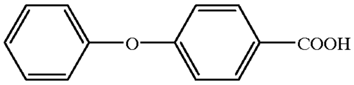
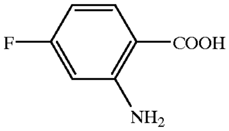
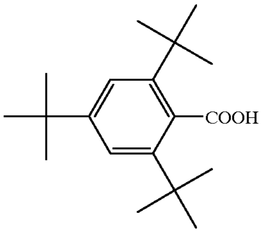
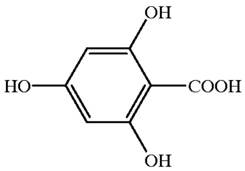
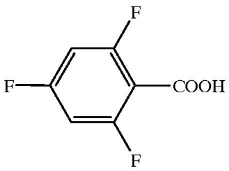

-continued
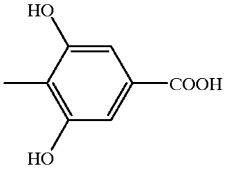
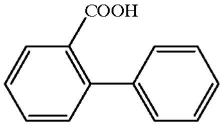
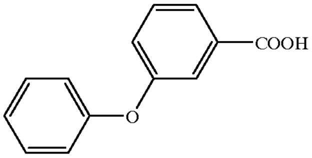
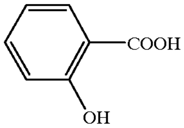
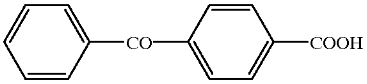
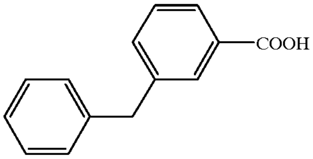
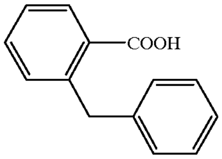
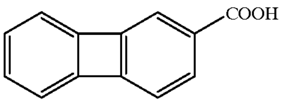
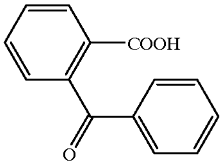
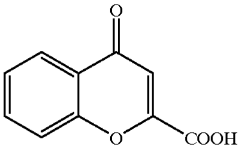
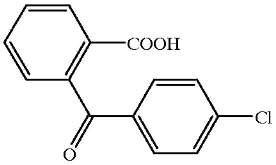
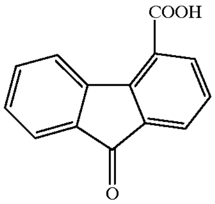
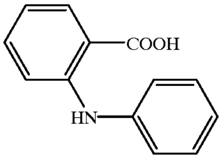
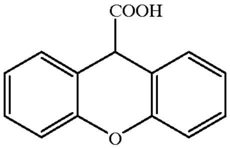
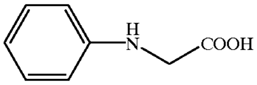
-continued
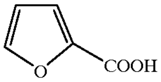
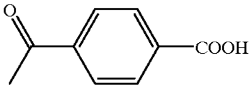
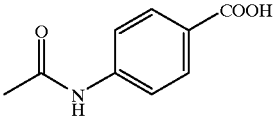
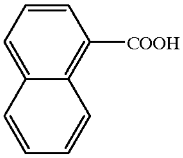
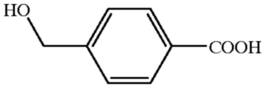
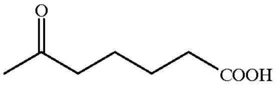
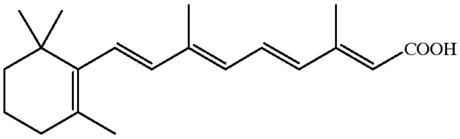
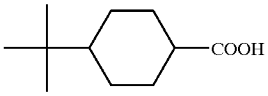
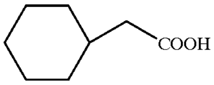
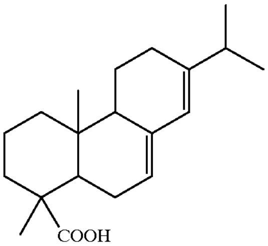
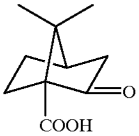
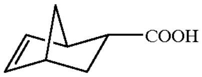
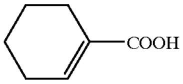
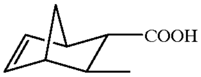
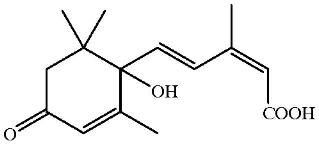
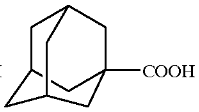
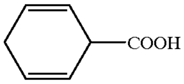
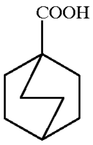

-continued
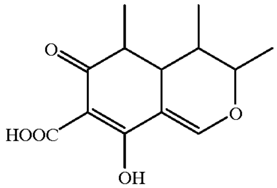
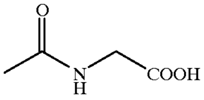
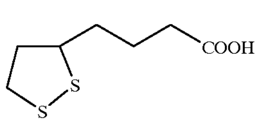
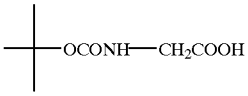
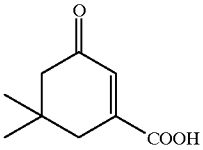
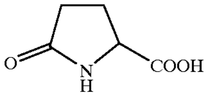
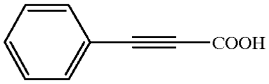
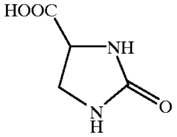
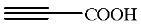
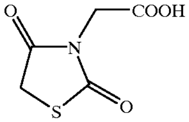
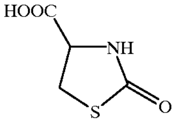
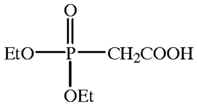
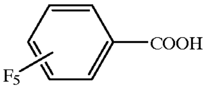
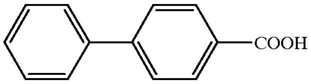
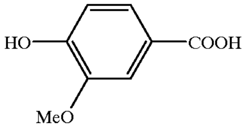
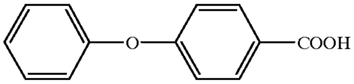
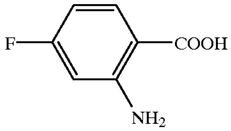
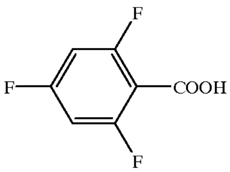
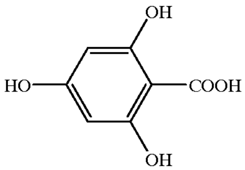
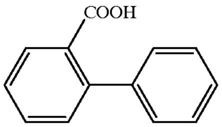
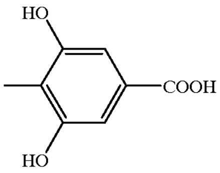
-continued
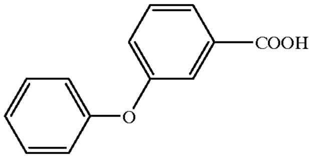
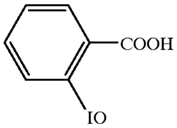
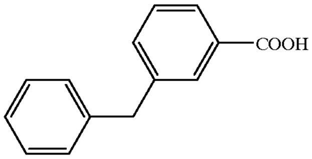
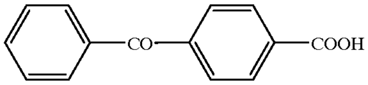
As specific examples of the acid/radical generating agent of the general formula (E), the following exemplary compounds (ii-1) to (ii-28) are shown.
(ii-1)
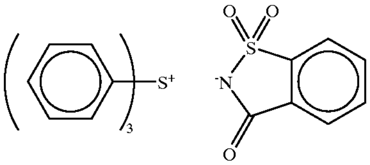
(ii-2)
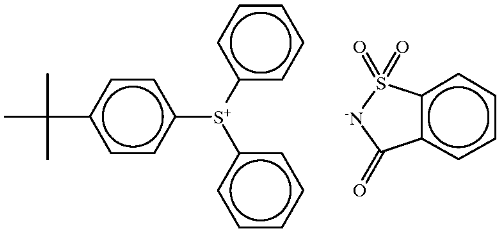
(ii-3)
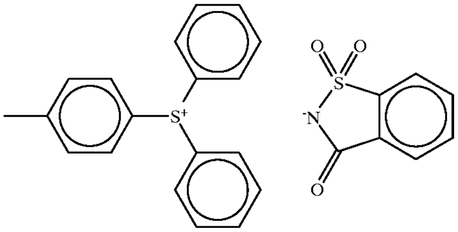
(ii-4)
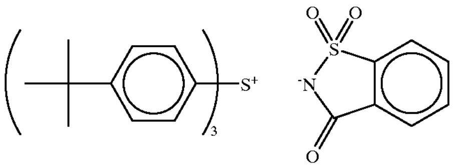

-continued
(ii-5)
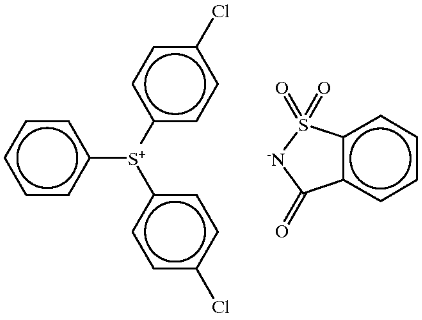
(ii-6)
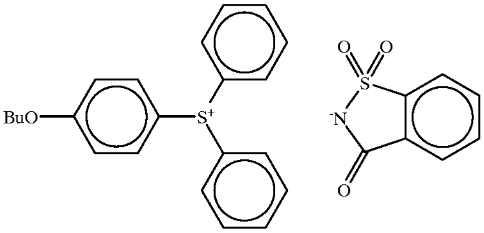
(ii-7)
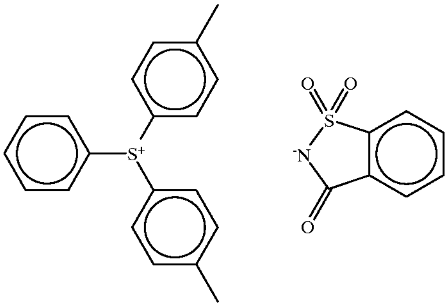
(ii-8)
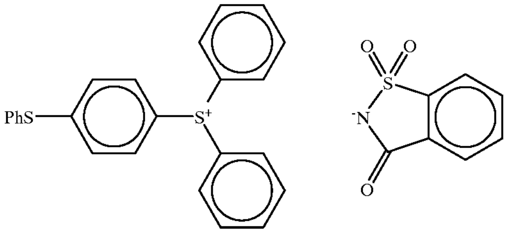
(ii-9)
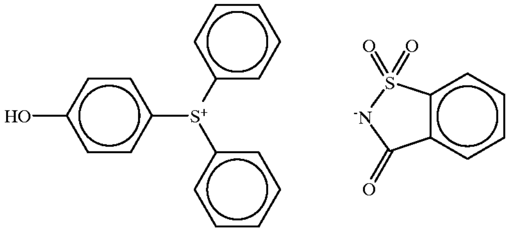
(ii-10)
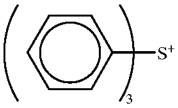
-continued
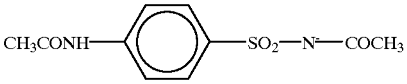
(ii-11)
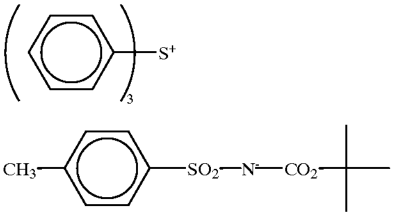
(ii-12)
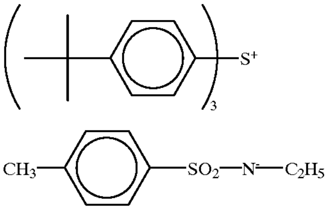
(ii-13)
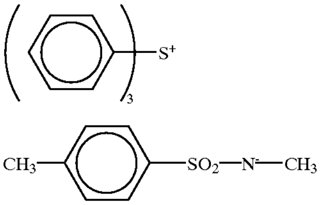
(ii-14)
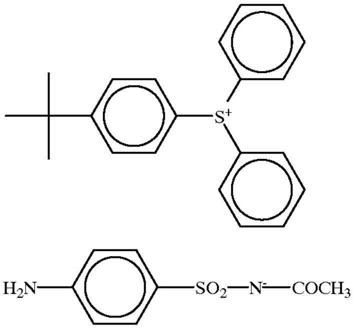
(ii-15)
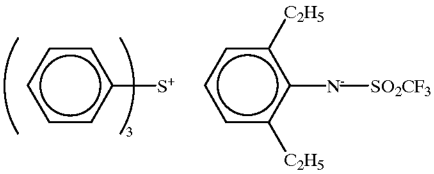
(ii-16)
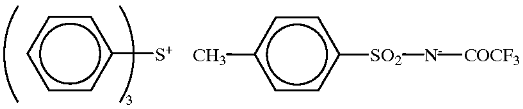
(ii-17)
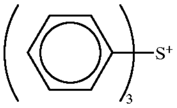

-continued

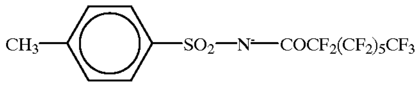

(ii-18)

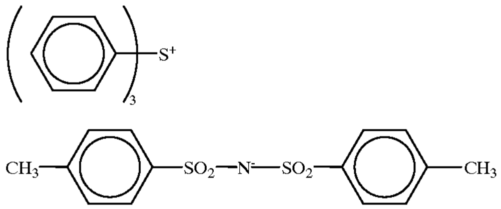

(ii-19)

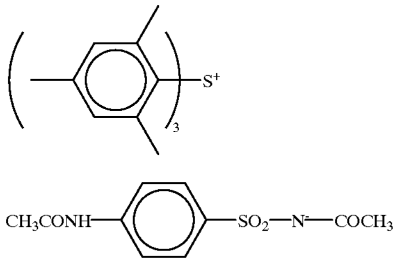

(ii-20)

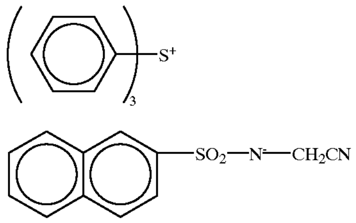

(ii-21)

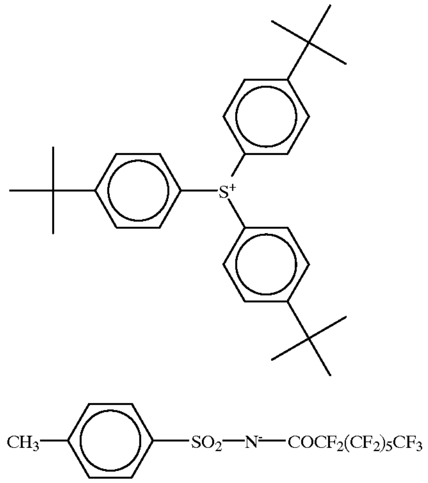

(ii-22)

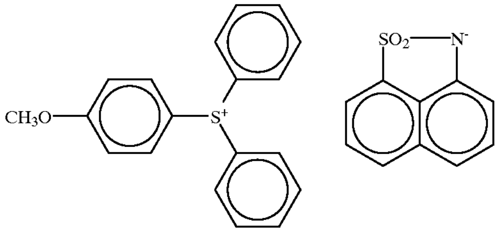

-continued (ii-23)

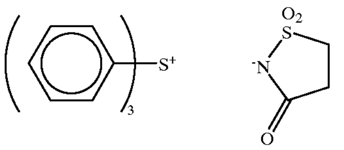

(ii-24)

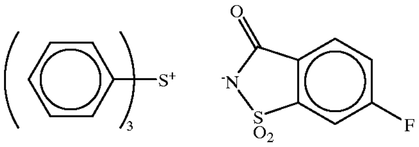

(ii-25)

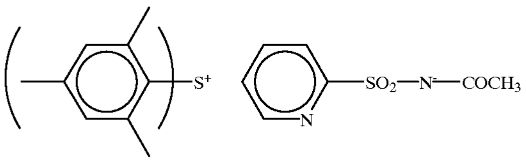

(ii-26)

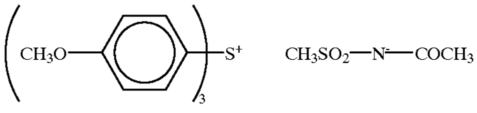

(ii-27)

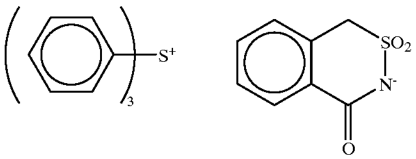

(ii-28)

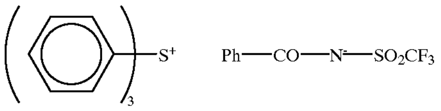

As the structure of an iodonium skeleton, a diaryliodonium skeleton is preferable from the standpoints of sensitivity and stability, and the aryl group may be substituted in the same manner as for the above-mentioned aryl group.

As preferable iodonium salts, namely, as the acid/radical generating agent of the general formula (iii), the following exemplary compounds (iii-1) to (iii-15) are listed.

(iii-1)

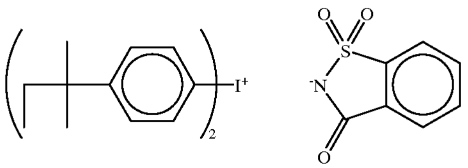

(iii-2)

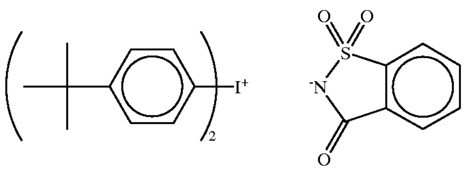

-continued (iii-3)

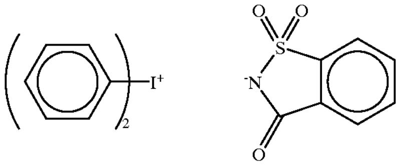

(iii-4)

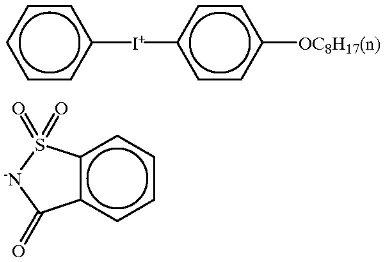

(iii-5)

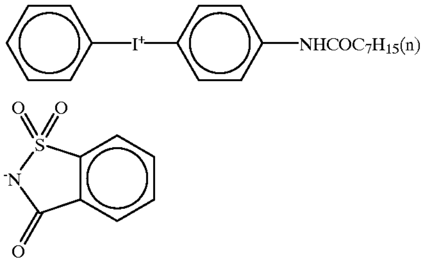

(iii-6)

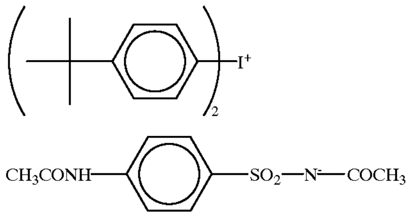

(iii-7)

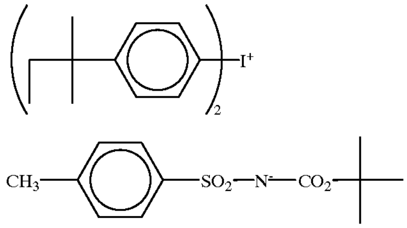

(iii-8)

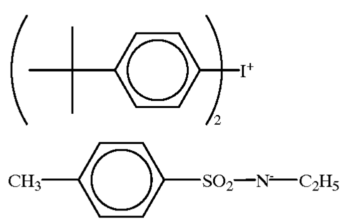

(iii-9)

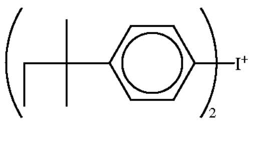

-continued

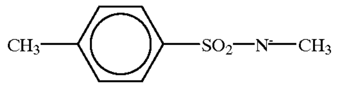

(iii-10)

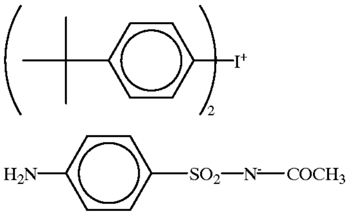

(iii-11)

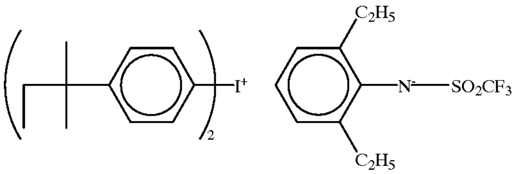

(iii-12)

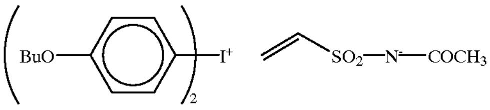

(iii-13)

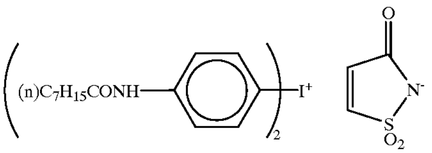

(iii-14)

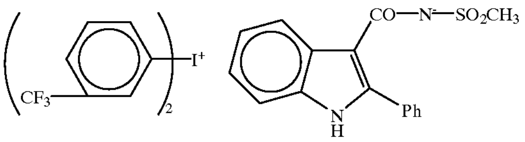

(iii-15)

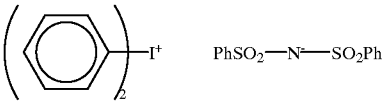

Synthesis examples of (I-1) triphenylsulfonium benzoylformate is given as a typical example. Synthesis of Triphenylsulfonium benzoylformate 76 g of diphenylsulfoxide was dissolved in 1000 ml of benzene, to this was added 300 g of aluminum chloride, and the mixture was refluxed for 24 hours. The reaction solution was poured, under ice cooling, into 2 L of water, and to this was added 500 ml of concentrated hydrochloric acid, and the mixture was heated at 70° C. for 10 minutes. This aqueous solution was washed with 800 ml of ethyl acetate, and filtrated, then, a solution prepared by dissolving 200 g of ammonium iodide in 600 ml of water was added to the solution.

The precipitated powder was filtrated and washed with water, then, washed with ethyl acetate and dried to obtain 98 g of triphenylsulfonium iodide.

78 g of triphenylsulfonium iodide was dissolved in 1000 ml of methanol, to this solution was added 48.7 g of silver oxide, and the mixture was stirred at room temperature for 4 hours. The solution was filtrated, and to this was added excess amount of 34.0 g of benzoylformic acid. The reaction solution was concentrated, and the concentrated solution was washed with 200 ml of ethyl acetate, 100 ml of hexane, 100 ml of acetone, and 200 ml of ethyl acetate successively, the supernatant was reslurried, and dried under reduced pressure to obtain 75 g of triphenylsulfonium benzoylformate.

Other sulfonium salts can also be synthesized in the same manner. For example, compound (I-2) can be synthesized in the same manner as (I-1), except that pyruvic acid is substituted for the benzoylformic acid. Compound (I-27) can be synthesized in the same manner as (I-1), except that di-p-tolylsulfoxide is substituted for the diphenylsulfoxide in order to obtain an intermediate compound of di(4-methylphenyl)phenylsulfonium iodide. Compound (I-28) can be synthesized in the same manner as (I-1), except that di-4-chlorophenylsulfoxide is substituted for the diphenylsulfoxide in order to obtain an intermediate compound of di(4-chlorophenyl)phenylsulfonium iodide. Further, compound (I-12) can be synthesized in the same manner as (I-1), except that (4-t-buthylphenyl)sulfonium is obtained as a substitute for the triphenylsulfonium iodide.

Other sulfonium salts and iodonium salts can also be synthesized in the same manner by appropriately selecting starting substances and carboxylic acids to be added.

As other methods for obtaining iodonium iodide, methods described in Bull. Chem. Soc. Jpn. 70, 219–224 (1997), *Bull. Chem.* Soc. Jpn. 70, 1665–1669 (1997), Bull. Chem. Soc. Jpn. 70, 115–120 (1999), J. Amer. *Chem. Soc.;* 82; 1960, 725–731, J. Amer. *Chem. Soc.;* 81; 1959, 342–346, and the like can be used.

As other methods for obtaining sulfonium iodide, methods described in J. Amer. Chem. *Soc.;* 91; 1969; 145–150, and the like can be used. As other methods for obtaining carboxylate of sulfonium, methods described in J. Org. ehent *Chem.* 35; 1970 2539–2543, and the like can be used.

The heat-sensitive composition of the present invention preferably contains an acid/radical generating agent of the above-mentioned general formulae (A) to (C) in an amount of 0.5 to 30% by weigh based on the total amount of solid components constituting the composition.

In the present invention, in addition to the above-mentioned specific acid/radical generating agent other known photopolymerization initiators, heat polymerization initiators and the like can be selected provided they are used in an amount which does not compromise the effect of the present invention. As these polymerization initiators which can be used together with the acid/radical generating agent, for example, known onium salts which do not have a carboxylic acid structure in a counter cation portion, triazine compounds having a trihalomethyl group, peroxides, azo-based polymerization initiators, azide compounds, quinonediazide and the like are listed.

As specific examples of the onium salts which can be suitably used as a radical generating agent which can be used together, those described in Japanese Patent Application No. 11-310623, paragraph Nos. [0030] to [0033] are listed.

Further, known polymerization initiators such as onium salts of the general formulae (I) to (IV) described in JP-A No. 9-34110, paragraph Nos. [0012] to [0050], heat polymerization initiators described in JP-A No. 8-108621, paragraph No. [0016], and the like, are preferably used.

When other polymerization initiators are used together with the acid/radical generating agent, the content of the polymerization initiator is preferably 50% by weight or less based on the above-mentioned specific acid/radical generating agent.

The acid/radical generating agent used in the present invention has a maximum absorption wavelength of preferably 400 nm or less, further preferably 360 nm or less. By thus controlling the absorption wavelength so as to be in an ultraviolet ray range, handling of an image formation material can be conducted under white light.

(II) Compound Which Manifests Irreversible Change in Physical and Chemical Properties by Acid or Radical The compound (II) which manifests irreversible change in physical and chemical properties by an acid or radical, and is the second essential component of the heat-sensitive composition of the present invention, will be described. This compound is a compound which whose physical properties and chemical properties change due to the action of an acid or radical generated by heat of the above-mentioned acid/radical generating agent, and which remains in the changed condition. This compound is not particularly restricted and providing it has the above described nature any compound can be used. For example, compounds listed as examples of the above-mentioned acid/radical generating agent themselves often have such a nature. As the properties of the compound (II) which are changed by an acid or radical generated from the acid/radical generating agent, for example, molecular physical properties such as absorption spectrum (color), chemical structure, polarizability and the like, and material physical properties such as degree of solution, strength, refractive index, flowability, stickiness and the like.

When a compound whose absorption spectrum changes due to oxidation and reduction or due to a nucleophilic addition reaction is used as the compound (II), oxidation, reduction and the like are caused by an acid or radical generated by the acid/radical generating agent, enabling image formation Such examples are disclosed in, for example, J. Am. Chem. Soc., 108, 128 (1986), J. Imaging. Soc., 30, 215 (1986), Israel. J. Chem., 25, 264 (1986).

By using an addition polymerizable or condensation polymerizable compound as the compound (II) and combining it with an acid/radical generating agent (II), a thermosetting resin or a negative photopolymer can be formed.

The optimum amount of the compound (II) content is appropriately selected in accordance with the desired change in properties or compounds used, and in general, when a compound manifesting change in absorption spectrum due to oxidation and reduction or due to a nucleophilic addition reaction is used, the content is from 0.5 to 40% by weight based on the total solid content of the composition, and when an addition polymerizable or condensation polymerizable compound is used, the content is from 0.5 to 30% by weight based on the total solid content of the composition.

As the compound (II) suitable for producing a planographic printing plate having high sensitivity which is one object of the present invention, (II-a) radical polymerizable compounds having an unsaturated bond are listed. These compounds will be described in detail below.

(II-a) Radical Polymerizable Compounds Having Unsaturated Bond

The radical polymerizable compounds used in the present invention is an addition polymerizable compound having at least one ethylenically unsaturated double bond, and preferably selected from compounds having at least one, and preferably 2 or more terminal ethylenically unsaturated bonds. Such a compound group is widely known in the art, and in the present invention, can be used without particular restriction. These include compounds having chemical forms such as monomers and prepolymers, namely, dimers, trimers and oligomers, or mixtures thereof, and copolymers thereof, and the like. Examples of the monomer and copolymers thereof include unsaturated carboxylic acids (e.g., acrylic acid, methacrylic acid, itaconic acid, crotonic acid, isocrotonic acid, maleic acid and the like), and esters and amides thereof, and preferably, esters of unsaturated carboxylic acids with aliphatic polyhydric alcohol compounds, and amides of unsaturated carboxylic acids with aliphatic polyvalent amine compounds are used. Further, unsaturated carboxylates having a nucleophilic substituent such as a hydroxyl group, amino group, mercapto group and the like, adducts of amides with monofunctional or polyfunctional isocyanates, epoxies, and dehydration condensation reaction products with monofunctional or polyfunctional carboxylic acids, and the like, are also suitably used.

Further, unsaturated carboxylates having an electrophilic substituent such as an isocyanate group, epoxy group and the like, adducts of amides with monofunctional or polyfunctional alcohols, amines and thiols, unsaturated carboxylates having a releasable substituent such as a halogen group, tosyloxy group and the like, and substitution reaction products of amides with monofunctional or polyfunctional alcohols, amines or thiols, are also suitable. Furthermore, as other examples, a compound group obtained by substituting the above-mentioned unsaturated carboxylic acids with unsaturated phosphonic acid, styrene, vinyl ether and the like can also be used.

Specific examples of monomers of esters of aliphatic polyhydric alcohol compounds with unsaturated carboxylic acids, include acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer and the like.

As the methacrylates, there are listed tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)phenyl]dimethylmethane and the like.

As the itaconates, there are listed ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate and the like.

As the crotonates, there are listed ethylene glycol dicrotonate, tetramethylene glycol dicrotonate, pentaerythritol dicrotonate, sorbitol tetradicrotonate and the like.

As the isocrotonate, there are listed ethylene glycol diisocrotonate, pentaerythritol diisocrotonate, sorbitol tetraisocrotonate and the like.

As the maleates, there are listed ethylene glycol dimaleate, triethylene glycol dimaleate, pentaerythritol dimaleate, sorbitol tetramaleate and the like.

As examples of other esters, there are suitable used, for example, aliphatic alcohol-based esters described in JP-B Nos. 46-27926 and 51-47334, and JP-A No. 57-196231, those having an aromatic skeleton described in JP-A Nos. 59-5240, 59-5241 and 2-226149, those having an amino group described in JP-A No. 1-165613, and the like.

Further, the above-mentioned estermonomers can also be used as a mixture.

Specific examples of monomers of amides of aliphatic polyvalent amines with unsaturated carboxylic acids include methylenebis-acrylamide, methylenebis-methacrylamide, 1,6-hexamethylenebis-acrylamide, 1,6-hexamethylenebismethacrylamide, diethylenetriaminetrisacrylamide, xylylenebisacrylamide, xylylenebismethacrylamide and the like.

As examples of the other preferable amide-based monomers, those having a cyclohexylene structure described in JP-B No. 54-21726 are listed.

Still further, urethane-based addition-polymerizable compounds produced by using an addition reaction of an isocyanate with a hydroxyl group are also suitable, and as specific examples thereof, vinylurethane compounds containing two or more polymerizable vinyl groups in one molecule obtained by adding a vinyl monomer having a hydroxyl group of the following general formula (2) to a polyisocyanate compound having two or more isocyanate groups in one molecule described in JP-B No. 48-41708, for example, and the like are listed.

$$CH_2{=}C(R)COOCH_2CH(R')OH \qquad \text{General formula (2)}$$

In the general formula (2), R and R' represent H or $CH_3$.

Further, urethane acrylates as described in JP-A No. 51-37193, JP-B Nos. 2-32293 and 2-16765, and urethane compounds having an ethylene oxide-based skeleton described in JP-B Nos. 58-49860, 56-17654, 62-39417 and 62-39418 are also suitable.

Even further, by using addition-polymerizable compounds having an amino structure or sulfide structure in the molecule described in JP-A Nos. 63-277653, 63-260909 and 1-105238, photosensitive compositions having extremely excellent photosensitive speed can be obtained.

As other examples, polyfunctional acrylates and methacrylates such as polyester acrylates, and epoxy acrylates obtained by reacting epoxy resins with (meth) acrylic acid, and the like, as described in JP-A No. 48-64183, JP-B Nos. 49-43191 and 52-30490, are listed. Further, certain unsaturated compounds described in JP-B Nos. 46-43946, 1-40337 and 1-40336, and vinylphosphonic acid-based compounds described in JP-A No. 2-25493, and the like, are also listed. In some cases, structures containing a perfluoroalkyl group described in JP-A No. 61-22048 are suitably used. Further, those introduced as photo-curing monomers and oligomers in Nippon Secchaku Kyokai Journal vol. 20, No. 7, 300 to 308 (1984) can also be used.

Details of methods for using these addition polymerizable compounds, such as a structure used, whether they are used singly or in combination, addition amount and the like, can be optionally set depending on the desired performance of the sensitive material obtained finally. They can be selected, for example, from the following standpoints. From the standpoint of photosensitive speed, a structure having high content of unsaturated groups per molecule is preferable, and in same cases, one having two or more functional groups is preferable. For increasing strength of the image portion, namely, a hardened film, a compound having three or more functional groups is preferred, and further, a method in which both of photosensitive property and strength are controlled by simultaneous use of compounds having a different number of functional groups and having different polymerizable groups (for example, acrylates, methacrylates, styrene-based compound, vinyl ether-based compounds) is also effective. Compounds having a large molecular weight and compounds having high hydrophobicity are, in some cases, not preferable from the standpoints of developing speed and precipitation in a developing solution, though they are excellent in photosensitive speed and film strength.

Further, the selection of addition polymerization compound, and the method in which it is used are important factors determining the compatibility and dispersibility of the additions polymerization compound with the other components of the heat sensitive composition (e.g. binder polymer, initiator, coloring agent and the like), and for example, compatibility can be improved in some cases by use of a compound having low purity or by simultaneous use of two or more compounds.

The heat-sensitive composition of the present invention is characterized in that its properness change reversibly, and by adding a light-heat converting agent in addition to the above-mentioned components, change in properties as described above can be caused, namely, a composition having photosensitivity can be obtained, by heat mode exposure, typically, by laser emitting infrared ray.

This light-heat converting agent (III) will be described below.

(III) Light-heat Converting Agent

The light-heat converting agent a functions to absorb a given wavelength of light and to convert it into heat. By heat generated in this reaction, namely, by heat mode exposure with a wavelength which can be absorbed by this light-heat converting agent (III), an acid/radical generating agent, a component (I) is decomposed to generate and acid or radical.

The light-heat converting agent used in the present invention is not particularly restricted providing it has a converts light absorbed into heat, and in general, there are listed dyes or pigments known as a so-called infrared absorber having an absorption maximum in wavelengths of an infrared laser usable for writing, namely, wavelengths from 760 nm to 1200 nm.

As the dye, commercially available dyes and, known materials described in literature such as, for example, "Dye Manual" (edited by Yuki Gosei Kagaku Kyokai, 1960) and the like can be used. Specifically, dyes such as azo dyes, metal complex salt azo dyes, pyrazoloneazo dyes, naphthoquinone dyes, anthraquinone dyes, phthalocyanine dyes, carbonium dyes, quinoneimine dyes, methine dyes, cyanine dyes, squarylium colorants, pyrylium salts, metal thiolate complexes, oxonol dyes, diimonium dyes, aminium dyes, croconium acid and the like are listed.

As preferable dyes, for example, cyanine dyes described in JP-A Nos. 58-125246, 59-84356, 59-202829, 60-78787 and the like, methine dyes described in JP-A Nos. 58-173696, 58-181690 and 58-194595 and the like, naphthoquinone dyes described in JP-A Nos. 58-112793, 58-224793, 59-48187, 59-73996, 60-52940, 60-63744 and the like, squarylium dyes described JP-A No. 58-112792 and the like, cyanine dyes described in GB-Patent No. 434,875, etc. are listed.

Further, near infrared absorbing sensitizers described in U.S. Pat. No. 5,156,938 can also be used suitably, and also preferably used are arylbenzo(thio)pyrylium salts described U.S. Pat. No. 3,881,924, trimethinethiapyrylium salts described in JP-A No. 57-142645 (U.S. Pat. No. 4,327,169), pyrylium-based compounds described in JP-A Nos. 58-181051, 58-220143, 59-41363, 59-84248, 59-84249, 59-146063 and 59-146061, cyanine colorants described in JP-A No. 59-216146, pentamethinethiopyrylium salts and the like described in U.S. Pat. No. 4,283,475, and pyrylium compounds described in JP-B Nos. 5-13514 and 5-19702.

Further, as preferable examples of dyes, near infrared absorption dyes of the formulae (I) and (II) described in U.S. Pat. No. 4,756,993 are listed.

Of these dyes, cyanine colorants, phthalocyanine colorants, oxonol colorants, squarylium colorants, pyrylium salts, thiopyrylium colorants and nickel thiolate complex are preferable. Cyanine colorants of the following general formula (a) to (e) are particularly preferable. Cyanine colorants of the following general formula (a) are most preferable since they bring out high polymerization activity in addition to stability and economy, when they are used in the polymerization composition of the present invention.

General formula (a)

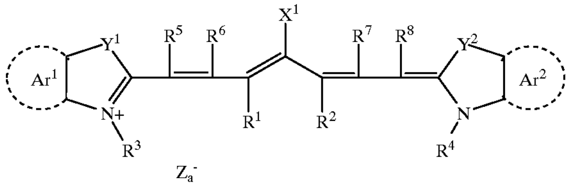

General formula (a)

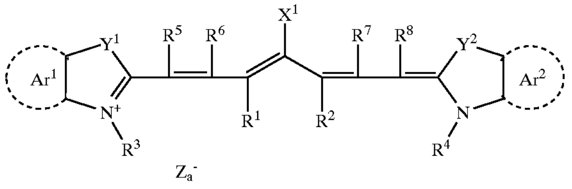

In the general formula (a), $X^1$ represents a halogen atom, —$NPh_2$, $X^2$—$L^1$, or the group listed below.

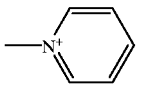

$X^2$ represents an oxygen atom or a sulfur atom, and $L^1$ represents a hydrocarbon group having 1 to 12 carbon atoms, an aromatic ring having heteroatom(s) or a hydrocarbon group having 1 to 12 heteroatoms, wherein said heteroatom is selected from the group consisting of a nitrogen atom, a sulfur atom, an oxygen atom, a halogen atom and a selenium atom.

Each of $R^1$ and $R^2$ independently represents a hydrocarbon group having 1 to 12 carbon atoms. From the standpoint of the storage stability of an application solution for a photosensitive layer, $R^1$ and $R^2$ are preferably a hydrocarbon group having 2 or more carbon atoms, and further, it is particularly preferable that $R^1$ and $R^2$ are bonded to each other to form a 5-membered or 6-membered ring.

$Ar^1$ and $Ar^2$ may be the same or different and represent an aromatic hydrocarbon group optionally having a substituent. As the preferable aromatic hydrocarbon group, a benzene ring and a naphthalene ring are listed. Further, as the preferable substituent, hydrocarbon groups having 12 or less carbon atoms, halogen atoms, and alkoxy groups having 12 or less carbon atoms. $Y^1$ and $Y^2$ may be the same or different and represent a sulfur atom or a dialkylmethylene group having 12 or less carbon atoms. $R^3$ and $R^4$ may be the same or different and represent a hydrocarbon group having 20 or less carbon atoms optionally having a substituent. As the preferable substituent, alkoxy groups having 12 or less carbon atoms, carboxyl groups and sulfo group are listed. $R^5$, $R^6$, $R^7$ and $R^8$ may be the same or different, and represent a hydrogen atom or a hydrocarbon group having 12 or less carbon atoms. In view of availability of raw materials, a hydrogen atom is preferable. $Z_a^-$ represents a counter anion. However, when a sulfo group is substituted on any of R1 to R8, $Z_a^-$ is not necessary. In view of storage stability of an application solution for a photosensitive layer, $Z_a^-$ is preferably halogen ion, perchloric acid ion, tetrafluoroborate ion, hexafluorophosphate ion, or sulfonic acid ion, and particularly preferable, is perchloric acid ion, hexafluorophosphate ion or arylsulfonic acid ion.

As specific examples of the cyanine colorant of the general formula (a) which can be suitably used in the present invention, in addition to the specific examples shown below, those described in paragraphs [0017] to [0019] in Japanese Patent Application No. 11-310623, those described in paragraphs [0012] to [0038] in Japanese Patent Application No. 2000-224031, and those described in paragraphs [0012] to [0023] in Japanese Patent Application No. 2000-211147 are listed.

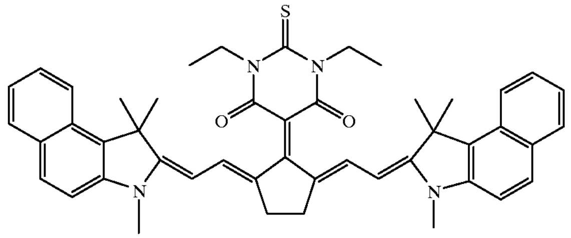

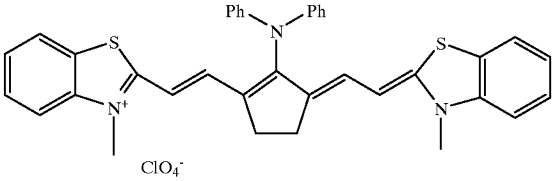

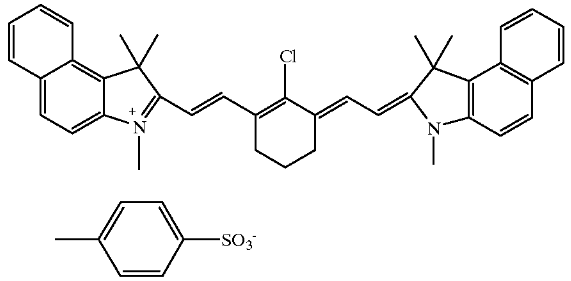

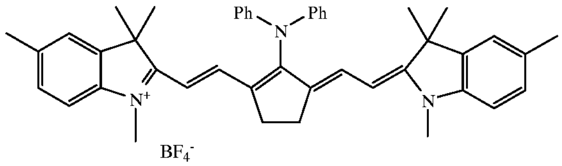

-continued

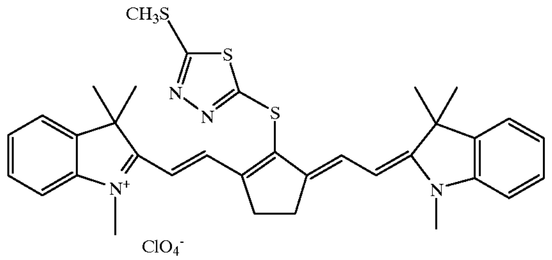

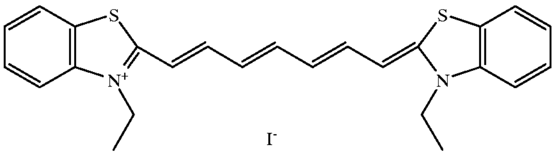

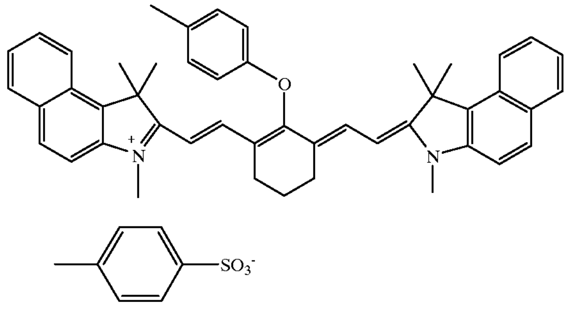

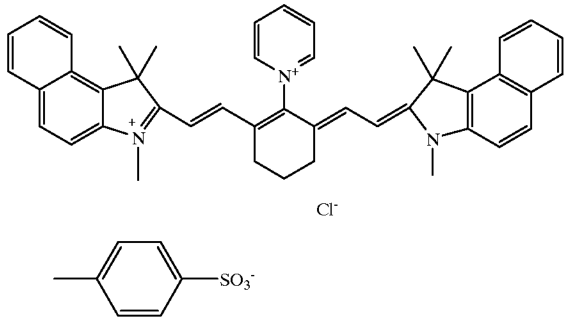

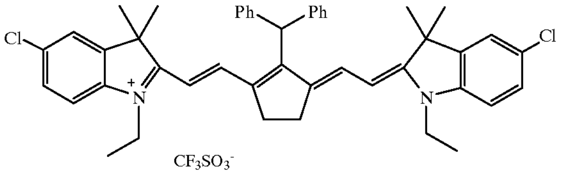

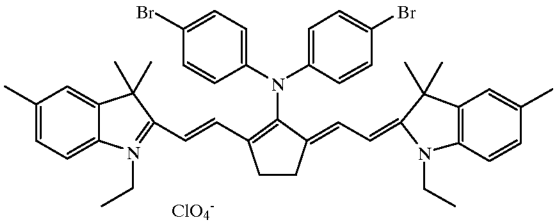

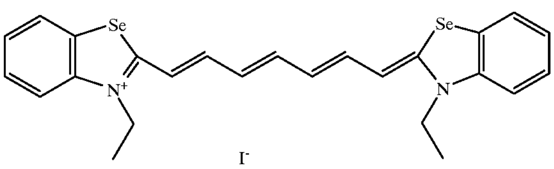

-continued

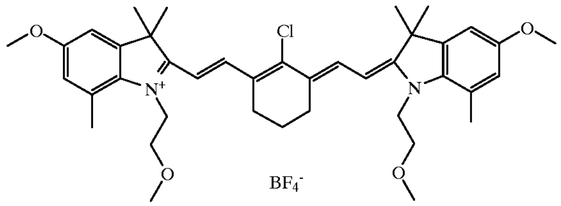

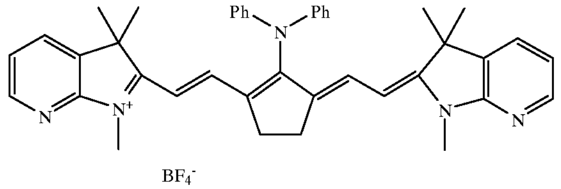

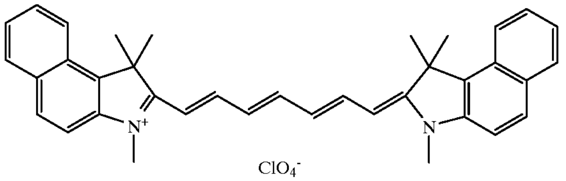

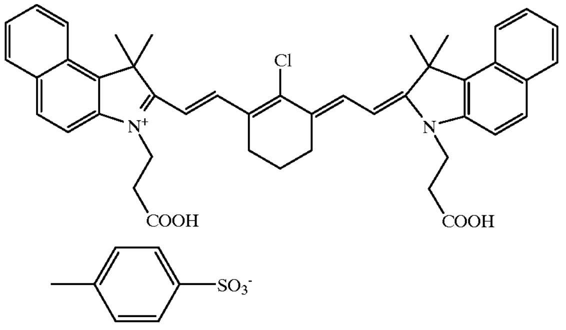

The general formula (b) is shown below.

General formula (b)

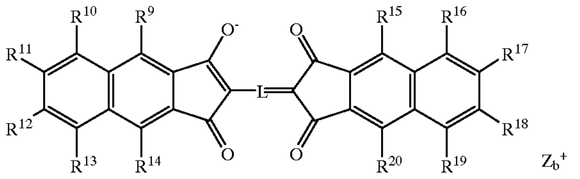

In the general formula (b), L represents a methine chain which may have substituent(s), wherein the substituents may be linked each other to form a ring. $Z_b^+$ represents a counter cation. As preferable cations, ammonium, iodonium, sulfonium, phosphonium, pyridinium and alkali metal cation ($Na^+$, $K^+$ and $Li^+$) can be listed. $R^9$ to $R^{14}$ and $R^{15}$ to $R^{20}$ independently represent a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group, wherein two or three of which may be combined or may be linked together to form a ring. In view of availability of raw materials and effect, those represented by the general formula (b) wherein L represents a methine chain having 7 conjugated carbon atom, or those represented by the general formula (b) wherein all of $R^9$ to $R^{14}$ and $R^{15}$ to $R^{20}$ represents a hydrogen atom are preferable.

Following are specific examples of the colorant of the general formula (b) which can be suitably used in the present invention.

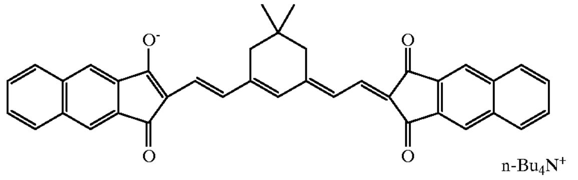

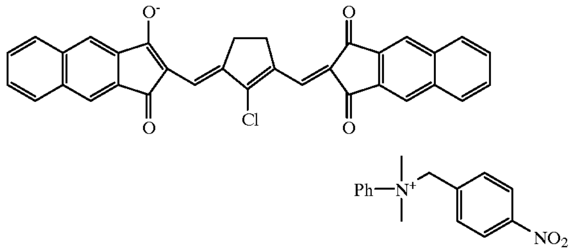

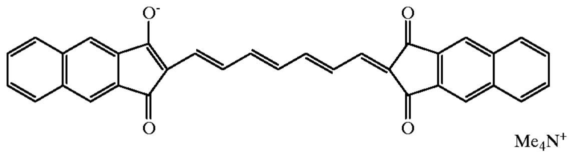

The general formula (c) is shown below.

General formula (c)

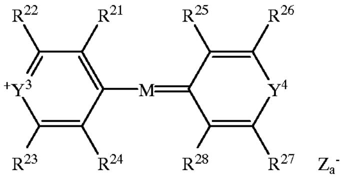

In the general formula (c), $Y^3$ and $Y^4$ independently represent an oxygen atom, a sulfur atom, a selenium atom or a tellurium atom. M represents amethine chain having 5 or more of conjugated carbon atoms. $R^{21}$ to $R^{24}$ and $R^{25}$ to $R^{28}$ may be the same or different, and represent hydrogen atom(s), halogen atom(s), cyano group(s), alkyl group(s), aryl group(s), alkenyl group(s), alkynyl group(s), carbonyl group(s), thio group(s), sulfonyl group(s), sulfinyl group(s), oxy group(s) or amino group(s). $Z_a^-$ represents a counter anion, which is the same as that shown in the general formula (a).

Following are specific examples of the colorant of the general formula (c) which can be suitably used in the present invention.

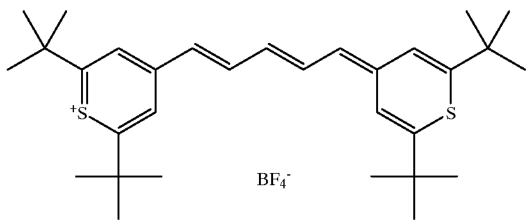

-continued

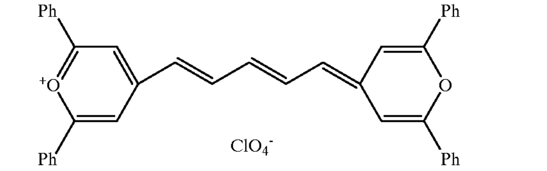

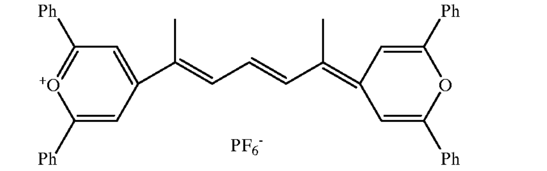

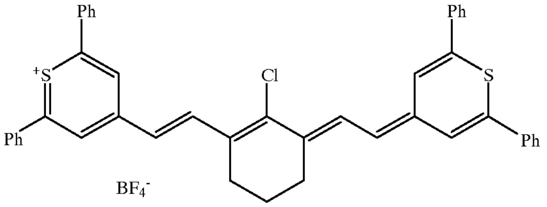

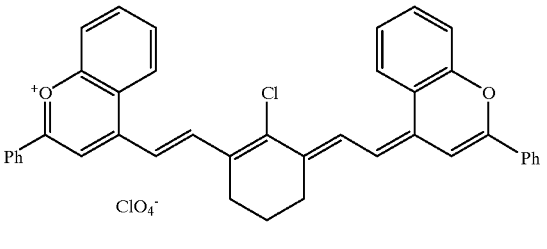

The general formula (d) is shown below.

General formula (d)

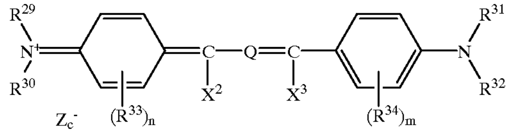

In the general formula (d), $R^{29}$ to $R^{31}$ independently represent a hydrogen atom, an alkyl group or an aryl group. $R^{33}$ and $R^{34}$ independently represent an alkyl group, a substituted oxy group or a halogen atom. n and m independently represent an integer from 0 to 4. $R^{29}$ and $R^{30}$ may be linked to form a ring. $R^{31}$ and $R^{32}$ may be linked to form a ring. $R^{29}$ and/or $R^{30}$ may be linked with $R^{33}$ to form a ring. $R^{31}$ and/or $R^{32}$ may be linked with $R^{34}$ to form a ring. When plurality of groups are represented by $R^{33}$ and/or $R^{34}$, a ring may be formed within such plurality of groups of $R^{33}$(/$R^{34}$). $X^1$ and $X^2$ independently represent hydrogen atom, alkyl group or aryl group. At least one of $X^1$ and $X^2$ independently represents a hydrogen atom or an alkyl group. Q represents a trimethine group or a pentamethine group which may have substituent(s), and may form a ring by adding a divalent organic acid. $Z^{c-}$ represents a counter anion, which is the same as $Z_a^-$ shown in the general formula (a).

Following are specific examples of the colorant of the general formula (d) which can be suitably used in the present invention.

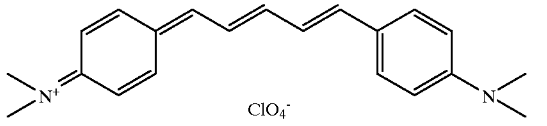

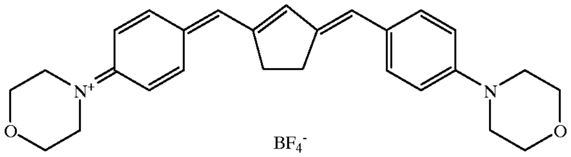

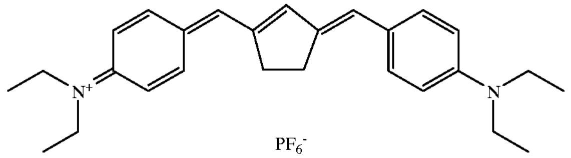

The general formula (e) is shown below.

General formula (e)

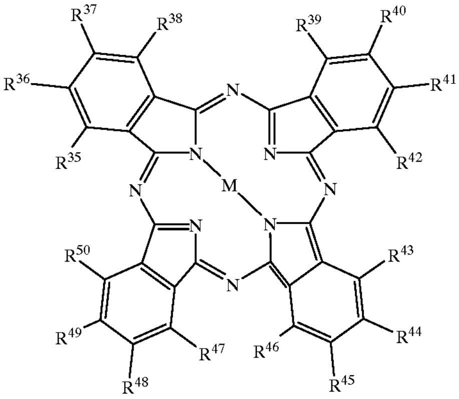

In the general formula (e), $R^{35}$ to $R^{50}$ independently represent a hydrogen atom, a halogen atom, a cyano group, an alkyl group, an aryl group, an alkenyl group, an alkynyl group, a hydroxy group, a carbonyl group, a thio group, a sulfonyl group, a sulfinyl group, an oxy group, an amino group or an onium salt construction that may have substituent(s). M represents two hydrogen atoms, a metal atom, a halometal group or an oxy group, wherein said metal atom may be selected from the group consisting of atoms of IA group, atoms of IIA group, atoms of IIIB group, atoms of IVB group, transition metals of first, second and third period of periodic table, and lanthanide elements. Among these preferable metal atoms, a copper atom, a magnesium atom, an iron atom, a zinc atom, a cobalt atom, an aluminum atom, a titanium atom and a vanadium atom can be preferably used.

Following are specific examples of the colorant of the general formula (e) which can be suitably used in the present invention.

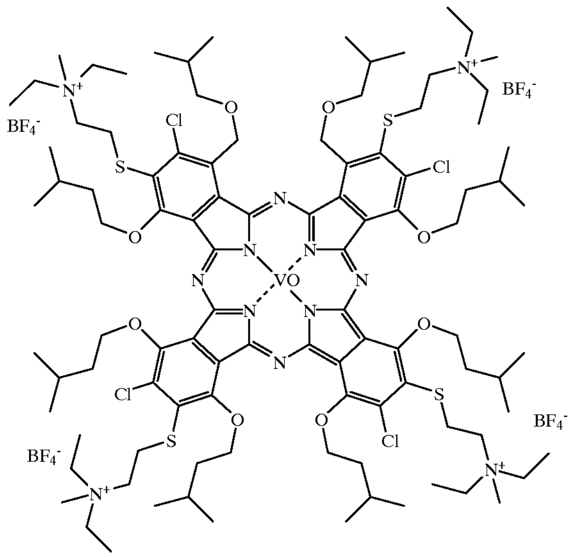

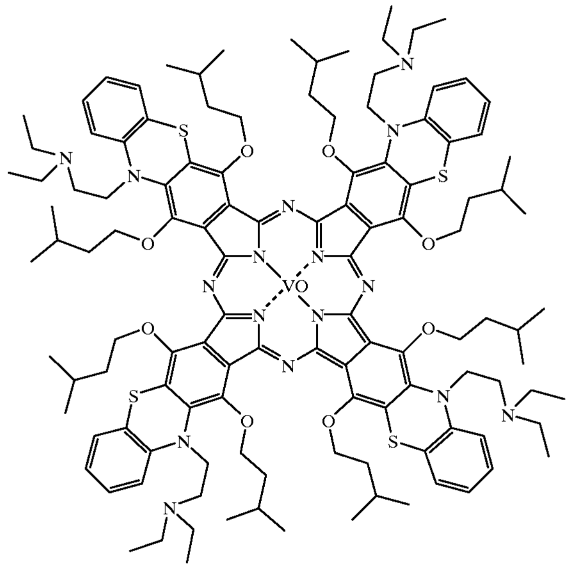

As the pigment used in the present invention, commercially available pigment, and pigments described in Color Index (C. I.) manual, "Saishin Ganryo Binran (Current Pigment Manual)" (edited by Nippon Ganryo Gijutsu Kyokai, 1977), "Saishin Ganryo Oyo Gijutsu (Current Pigment Application Technology)" (published by CMC, 1986), "Insatsu Inki Gijutsu (Printing Ink Technology)" (published by CMC, 1984) can be utilized.

As the pigments, black pigments, yellow pigments, orange pigments, brown pigments, red pigments, violet pigments, blue pigments, green pigments, fluorescent pigments, metal powder pigments, and additionally, polymer bond pigments, are listed. Specifically, insoluble azo pigments, azolake pigments, condensed azo pigments, chelate azo pigments, phthalocyanine-based pigments, anthraquinone-based pigments, perylene and perynone-based pigments, thioindigo-based pigments, quinacridone-based pigments, dioxazine-based pigments, isoindolinone-based pigments, quinophthalone-based pigments, dyeing lake pigments, azine pigments, nitroso pigments, nitro pigments, natural pigments, fluorescent pigments, inorganic pigments, carbon black and the like can be used. Among these pigments, carbon black is preferable.

These pigments may be used without surface treatment, or may be surface-treated before use. The method of surface treatment may be a method of surface coating with a resin and wax, a method of adhering a surfactant, a method of bonding a reactive substance (for example, silane coupling agent, epoxy compound, polyisocyanate and the like) to the surface of a pigment, and the like. The above-mentioned surface treatment methods are described in "Kinzoku Sekken no Seishitsu to Oyo (Nature and Application of Metal Soap)" (Sachi Publication), "Insatsu Inki Gijutsu (Printing Ink Technology)" (published by CMC, 1984), and "Saishin Ganryo Oyo Gijutsu (Current Pigment Application Technology)" (published by CMC, 1986).

The particle size of a pigment is preferably from 0.01 μm to 10 μm, further preferably from 0.05 μm to 1 μm, and particularly preferably from 0.1 μm to 1 μm. A particle size of a pigment of less than 0.01 μm is not preferable from the standpoint of instability of a dispersed substance in an application solution of an image photosensing layer, and a particle size of over 10 μm is not preferable from the standpoint of uniformity of an image photosensitive layer.

As the method of dispersing a pigment, known dispersing technologies used in production of ink, production of toners, and the like can be used. As the dispersing machine, a ultrasonic disperser, sand mill, attritor, pearl mill, super mill, ball mill, impeller, disperser, KD mill, colloid mill, Dynatron, triple screw roll mill, press kneader and the like are listed. The details are described in "Saishin Ganryo Oyo Gijutsu (Current Pigment Application Technology)" (published by CMC, 1986).

These light-heat converting agents may be used alone or in combination of two or more. In the standpoint of sensitivity, the dye represented by the general formula (a) is preferable. The cyanine dye represented by the general formula (a) which comprises diarylamino group is most preferable.

These light-heat converting agents are preferably added in a heat-sensitive composition in an amount of 0.1 to 20% by weight based on the total solid content. When the amount is far be low than this range, there is a tendency that sensitivity of change of properties by exposure lowers, and photosensitivity is not sufficiently obtained, and when too large, there is a tendency that uniformity and strength of film lower, namely, both cases are not preferable.

Next, the planographic printing plate of the present invention using the above-mentioned heat-sensitive composition will be described. In the planographic printing plate of the present invention, the above-mentioned heat-sensitive composition is used in a recording layer.

Recording Layer

First, a recording layer (photosensitive layer) having a function to form images in the planographic printing plate of the present invention will be described. The photosensitive layer of the planographic printing plate of the present invention comprises (I) an acid/radical polymerization initiator of the following general formula (A), (III) a light-heat converting agent, (II-a) a compound having a polymerizable unsaturated bond, and (IV) a binder polymer, and by irradiation with infrared laser, the light-heat converting agent (III) generates heat, and by the light of infrared laser or heat generated by the light-heat converting agent (III), an acid/radical generating agent (I) of the general formula (A) is decomposed to generate an acid or radical, and a hardening reaction of the compound (II-a) having a polymerizable unsaturated bond is promoted and exposed parts are hardened to form negative images which are image portions.

In formation the photosensitive layer of the planographic printing plate of the present invention, the above-mentioned acid/radical polymerization initiator of the general formula (A) is contained preferably in an amount of 0.5 to 15% by weight based on the total amount of solid components constituting the photosensitive layer. This acid/radical generating agent is used in combination with a light-heat converting agent (III) described later, and when irradiated with infrared laser, it generates an acid or radical due to the light or heat or both of these energy forms, to initiate and promote polymerization of the compound (II-a) having a polymerizable unsaturated group.

As the compound (II-a) having a polymerizable unsaturated group used in a recording layer of a planographic printing plate, compounds as described in detail in the above-mentioned explanations of the compound (II) are used, and regarding the type of the compound, specific structures may be selected for the purpose of enhancing close adherence with a substrate, an over coat layer and the like described later, in addition to the above-mentioned requirements. Regarding the compounding ratio of the addition-polymerizable compound (II-a) in a heat-sensitive composition, a larger ratio is more advantageous from the standpoint of sensitivity, however, when too large, problems can occur such as occurrence of undesirable phase separation, problems in the production process due to stickiness of a heat-sensitive composition (for example, failures in production owing to transfer and adhesion of sensitive material components), occurrence of precipitation from a developing solution when a planographic printing plate is formed, and the like. From these viewpoints, preferable compounding ratio is, in many cases, from 5 to 80% by weight, and preferably from 25 to 75% by weight based on the total amount of solid components of a composition constituting the recording layer. These may be used alone or in combination of two or more. Additionally, when an addition polymerizable compound is used, suitable structure, and compounding, and addition amounts of the compound can be optionally selected from the standpoints of extent of polymerization inhibition due to oxygen, resolution, fogging, change of refractive index, surface stickiness and the like, and in some cases, layer constitution and application methods such as priming and finishing can also be carried out.

In the planographic printing plate of the present invention, the above-mentioned light-heat converting agent (III) may be added to the same layer as other components, or to an other layer formed, and when a negative image formation material is produced, it is preferable that the optical density at absorption maximum in a wavelength range of a photosensitive layer from 760 to 1200 nm is from 0.1 to 3.0. When the value is out of this range, sensitivity tends to lower. Since the optical density is determined by the addition amount of the above-mentioned light-heat converting agent (III) and the thickness of a recording layer, given optical density is obtained by controlling conditions of both parameters. The optical density of a recording layer can be measured by an ordinary method. As the measurement method, for example, a method in which on a transparent or white substrate, a recording layer having an appropriate pre-determined thickness in terms of application amount after drying and in a range required as a planographic printing plate is formed, and the optical density is measured by a transmission type optical density meter, a method in which a recording layer is formed on a reflective substrate such as aluminum and the like and then the reflection density is measured, and other methods are listed.

(IV) Binder Which is Water-insoluble and Alkali Aqueous Solution-soluble

In the planographic printing plate of the present invention, it is further preferable to use a binder polymer in a recording layer. A linear organic polymer is preferably included as the binder. Any such “linear organic polymer” may be used. Preferably, linear organic polymers which are soluble or swellable in water or weak alkaline water, or those which enable water development or weak alkaline water development, are selected. The linear organic polymer is selected and used, according to use not only as a film forming agent of a composition but also according to use as water, weak alkaline water or as an organic solvent developing agent. For example, when a water-soluble organic polymer is used, water development is possible. As such linear organic polymer, addition polymers having a carboxylic acid group on a side chain, for example, those described in JP-A No. 59-44615, JP-B Nos. 54-34327, 58012577, 54025957, JP-A Nos. 54-92723, 59-53836 and 59-71048, namely, methacrylic acid copolymers, acrylic acid copolymers, itaconic acid copolymer, crotonic acid copolymers, maleic acid copolymers, partially esterifiedmaleic acid copolymers and the like are listed. Likewise, acidic cellulose derivatives having a carboxylic acid group on a side chain are listed. In addition, those obtained by adding a cyclic acid anhydride to addition polymers having a hydroxyl group, and the like are useful.

Particularly, among these compounds, [benzyl(meth) acrylate/(meth)acrylic acid/other addition-polymerizable vinyl monomer, if necessary] copolymers and [allyl(meth) acrylate/(meth)acrylic acid/other addition-polymerizable vinyl monomer, if necessary] copolymers are excellent in balance between film strength, sensitivity and developing property, and consequently suitable.

Urethane-based binder polymers having an acid group described in JP-B Nos. 7-12004, 7-120041, 7-120042 and 8-12424, JP-A Nos. 63-287944, 63-287947 and 1-271741, Japanese Patent Application No. 10-116232, and the like, are advantageous with respect to printing endurance and low exposure ability since these polymers are extremely excellent in strength.

Binders having an amide group described in JP-A No. 11-171907 have both excellent developing property and film strength , and are thus suitable.

Further, as other water-soluble linear organic polymers, polyvinylpyrrolidone, polyethylene oxide and the like are useful. Further, for enhancing the strength of a hardened film, alcohol-soluble nylon, polyethers of 2,2-bis-(4-hydroxyphenyl)propane and epichlorohydrin, and the like are also useful. These linear organic polymers can be mixed in suitable amount in the whole composition. When the amount mixed is over 90% by weight, preferable results are not obtained with regard to image strength and the like. This amount is preferably from 30 to 85% by weight. The ratio by weight of compounds having an ethylenically unsaturated double bond to linear organic polymers is preferably 1/9 to 7/3.

As the binder polymer used in the present invention, those substantially insoluble in water and soluble in alkaline aqueous solution are used. Therefore, in a developing solution, an organic solvent that is undesirable for environments is not used or the amount used thereof can be suppressed to an extremely low level. The acid value (acid content per 1 g of polymer is represented in terms of chemical grade number) and molecular weight of such a binder polymer is appropriately selected from the standpoints of image strength and developing property. The preferable acid value is from 0.4 to 3.0 meq/g and the preferable molecular weight is from 3000 to 500000, and more preferably, the acid value is from 0.6 to 2.0 and the molecular weight is from 10000 to 300000.

(V) Other Components

In a composition constituting a recording layer of the planographic printing plate of the present invention, other components suitable for use, production methods thereof and the like can be further added appropriately. Examples of the preferable additives are given below.

(V-1) Co-sensitizer

The sensitivity can be further improved by using a certain kind of additive (hereinafter, referred to as co-sensitizer) Though the working mechanism of the co-sensitizer them is not clear, it is believed to be based on the following chemical process in some cases. Namely, it is estimated that various intermediate active species (radicals, cations) produced in light reaction initiated by a heat polymerization initiator and in the subsequent addition polymerization reaction are reacted with a co-sensitizer to produce a new active radical. These are roughly classified into (a) those which are reduced to produce an active radical, (b) those which are oxidized to produce an active radical, (c) a radical having lower activity which is reacted to be converted into a radical having higher activity, or to act as a chain transfer agent: However, in many cases there is no general explanation as to which of these groups each of the compounds belong.

(a) Compound Which is Reduced to Produce an Active Radical

Compound having carbon-halogen bond: It is believed that a carbon-halogen bond is reductively broken to generate an active radical. Specifically, for example, trihalomethyl-s-triazines, trihalomethyloxadiazoles and the like can be suitably used.

Compound having nitrogen-nitrogen bond: It is believed that a nitrogen-nitrogen bond is reductively broken to generate an active radical. Specifically, hexaarylbiimidazoles and the like are suitably used.

Compound having oxygen-oxygen bond: It is believed that an oxygen-oxygen bond is reductively broken to generate an active radical. Specifically, organic peroxides and the like are suitably used.

Onium compound: It is believed that a carbon-hetero bond and an oxygen-nitrogen bond are reductively broken to generate an active radical. Specifically, diaryliodonium salts, triarylsulfonium salts, N-alkoxypyridinium (azinium) salts and the like are suitably used.

Ferrocene, iron allene complexes: An active radical can be reductively produced.

(b) Compound Which is Oxidized to Produce an Active Radical

Alkylate complex: It is believed that a carbon-hetero bond is oxidatively decomposed to produce an active radical. Specifically, for example, triarylalkylborates are suitably used.

Alkylamine compound: It is believed that a C—X bond on a carbon adjacent to nitrogen is broken by oxidation to produce an active radical. As X, a hydrogen atom, carboxyl group, trimethylsilyl group, benzyl group and the like are suitable. Specifically, for example, ethanolamines, N-phenylglycines, N-trimethylsilylmethylanilines and the like are listed.

Sulfur-containing, tin-containing compound: Compounds obtained by substituting a sulfur atom and tin atom for a nitrogen atom on the above-mentioned amines can form an active radical by the same action. Compounds having an S—S bond are also known to gain sensitivity by breakage of the S—S bond.

α-substituted methylcarbonyl compound: An active radical can be produced by oxidation due to the breaking of a bond between carbonyl-α-carbon. Those obtained by substituting oxime ether for carbonyl also manifest the same action. Specifically, 2-alkyl-1-[4-(alkylthio)phenyl]-2-morpholinopronone-1s, and oxime ethers obtained by reacting the pronones with hydroxylamines, then, etherifying N—OH, are listed.

Sulfine salts: An active radical can be reductively produced. Specifically, sodium arylsulfinate and the like are listed. (c) A Compound which is reacted with a radical to be converted into a highly active radical, or which acts as chain transfer agent: For example, a group of compounds having SH, PH, SiH or GeH in the molecule are used. These can give hydrogen to lower active radical species to form a radical, or can be oxidized, then, de-protonated to produce a radical. Specifically, for example, 2-mercaptobenzimidazoles and the like are listed.

Many specific examples of these co-sensitizer are described, for example, in JP-A No. 9-236913, as additives for improving sensitivity, and these can be applied also in the present invention.

These co-sensitizer can be used alone or in combination of two or more. The amount used thereof is from 0.05 to 100 parts by weight, preferably from 1 to 80 parts by weight, further preferably from 3 to 50 parts by weight based on 100 parts by weight of a compound having an ethylenically unsaturated double bond.

(V-2) Polymerization Inhibitor

Further, in the present invention, in addition to the above-mentioned basic components, it is desirable to add a small amount of heat polymerization inhibitor in order to inhibit unnecessary heat polymerization of a compound having a polymerizable ethylenically unsaturated double bond in production or storage of a photosensitive composition. Examples of the suitable heat polymerization inhibitor include, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenyl), N-nitrosophenylhydroxylamine primary cerium, and the like. The amount of the heat polymerization inhibitor added is preferably from about 0.01 to about 5% by weight based on the total composition weight. If necessary, for preventing polymerization inhibition by oxygen, a higher fatty acid derivative such a behenic acid and behenic amide and the like may be added and allowed to be present locally on the surface of a photosensitive layer in a process of drying after application onto a substrate and the like, when a planographic printing plate is produced. The amount of the higher fatty acid derivative added is preferably from about 0.5 to about 10% by weight based on the whole composition.

(V-3) Coloring Agent and the Like

Further, when the photosensitive composition of the present invention is used in a planographic printing plate, a dye or pigment may be added for the purpose of coloring a photosensitive layer thereof. By adding the dye or pigment, so-called plate inspection properties such as visibility of the plate after it is produced, and the ease of using an image concentration measuring device are improved. As the coloring agent, use of a pigment is particularly preferable since most dyes cause reduction in sensitivity of a photopolymerization photosensitive layer. Specific examples thereof include pigments such as phthalocyanine pigments, azo pigments, carbon black, titanium oxide and the like, and dyes such as ethyl violet, crystal violet, azo dyes, anthraquinone dyes, cyanine dyes and the like. The amount of the dye and pigment added is preferably from about 0.5 to about 5% by weight based on the whole composition.

(V-4) Other Additives

Further, when the photosensitive composition of the present invention is used in a planographic printing plate, known additives such as inorganic fillers, other plasticizers, sensitizers which can improve ink adhering property on the surface of a photosensitive layer, and the like, may be added to improved physical properties of a hardened film.

As the plasticizer, for example, dioctyl phthalate, didodecyl phthalate, triethylene glycol dicaprylate, dioctyl adipate, dibutyl sebacate, triacetyl glycerin and the like are listed, and when a binder is used, it can be added in an amount of 10% by weight or less based on the total weight of a compound having an ethylenically unsaturated double bond and a binder.

Further, in order to reinforce heating and exposing effects after development, for the purpose of improving film strength (printing endurance) described later, a UV initiator, aging cross-linking agent and the like, to reinforce heating and exposing effects after development, for the purpose of improving film strength (printing endurance) described later, can also be added.

In addition, additives can be added and an intermediate layer can be provided for improving close adherence between a photosensitive layer and a substrate, and enhancing developing and removing ability of a non-exposed photosensitive layer. For example, close adherence can be improved and printing endurance can be enhanced by addition and priming of a compound having relatively strong mutual action with a substrate such as a compound having a diazonium structure, a phosphone compound and the like, and on the other hand, developing property of non-image portions is improved and improvement of staining property is possible by addition and priming of a hydrophilic polymer such as polyacrylic acid and polysulfonic acid.

For providing a planographic printing plate, when the photosensitive composition of the present invention is applied on a substrate, the composition is dissolved in various organic solvents before being used. Examples of the solvent used herein are, acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethylformamide, dimethylsulfoxide, γ-butyrolactone, methyl lactate, ethyl lactate and the like. These solvents can be used alone or in combination. The concentration of solid components in an application solution is suitably from 2 to 50% by weight.

It is desirable to appropriately select the amount applied on the substrate of the above-mentioned photosensitive layer in accordance with use, in view of influences such as sensitivity of a photosensitive layer, developing property, strength and printing endurance of an exposed film, and the like. When the application amount is too small, printing endurance is insufficient. On the other hand, when the application amount is too large, sensitivity decreases, exposure takes much time, and in addition, developing treatment also requires a longer period of time, and is thus undesirable. The application amount suitable in the planographic printing plate of the present invention is from about 0.1 to about 10 $g/m^2$ in terms of weight after drying, in general. More preferably, it is from 0.5 to 5 $g/m^2$.

Protective Layer

In the planographic printing plate of the present invention, if necessary, a protective layer can be provided on a recording layer containing a photopolymerizable compound. Such a planographic printing plate is usually exposed in air, and the protective layer prevents mixing into a photosensitive layer of a compound having lower molecular weight such as basic substances and oxygen present in air, which inhibits image formation reaction in a photosensitive layer which takes place due to, occurred by exposure, in a photosensitive layer, and prevents inhibition of image formation reaction by exposure in air. Therefore, properties desired for such a protective layer are lot permeability of a compound having lower molecular weight such as oxygen and the like, and further, it is desirable that transmission property of light used for exposure is good, close adherence with a photosensitive layer is excellent, and the protective layer can be easily removed in a developing process after exposure.

Such modifications of a protective layer have been conventionally conducted, and described in detail in U.S. Pat. No. 3,458,311 and JP-A No. 55-49729. As materials which can be used in the protective layer, for example, water-soluble polymer compound having relatively excellent crystallinity are advantageously used, and specifically, water-soluble polymers such as polyvinyl alcohol, polyvinyl pyrrolidone, acidic celluloses, gelatin, gum Arabic, polyacrylic acid and the like are known, and of these, use of polyvinyl alcohol as a main component gives most preferable results from the standpoints of basic properties such as oxygen-blocking property and development-removing property. Polyvinyl alcohol used in the protective layer may be partially substituted with ester, ether and acetal providing it contains an unsubstituted vinyl alcohol unit for giving oxygen blocking property and water-solubility required. Further, in a similar manner, it may partially contain other copolymerization components.

As specific examples of polyvinyl alcohol, those 71 to 100% of which have been hydrolyzed 71 to 100% and which have a molecular weight from 300 to 2400 are listed. Specific examples are PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8 and the like (trade names; all manufactured by Kuraray Co., Ltd.).

Components of a protective layer (selection of PVA, use of additives), application amount, and the like are selected in view of fogging property, close adherence and scratch-resistance in addition to oxygen-blocking property and development-removing property. In general, when the hydrolysis rate of PVA used is higher (when content of non-substituted vinyl alcohol unit in a protective layer is higher) and when the film thickness is larger, oxygen-blocking property increases, and this is advantageous from the standpoint of sensitivity. However, if the increase in oxygen-blocking property is extreme, unnecessary polymerization reaction occurs in production and storage, and problems occur such as unnecessary fogging and broadening of image lines in image exposure. Further, close adherence with image portions and scratch resistance are also extremely important for handling of the plate. Namely, when a hydrophilic layer composed of a water-soluble polymer is laminated on a lipophilic polymerization layer, film peeling due to poor adhesion tends to occur, and peeled parts cause defects such as poor film hardening and the like by inhibition of oxygen polymerization.

On the other hand, various suggestions have been made to improve adhesion between these two layers, U.S. Pat. Nos. 292,501 and 44,563 describe obtaining sufficient adhesion by mixing acrylic emulsion or water-insoluble vinylpyrrolidone-vinyl acetate copolymer and the like in an amount of 20 to 60% by weight into a hydrophilic polymer composed mainly of polyvinyl alcohols, and laminating the mixture on a polymerization layer. Any of these known techniques can be applied to the protective layer of the present invention. The method of applying such a protective layer is described in detail in, for example, U.S. Pat. No. 3,458,311 and JP-A No. 55-49729.

Further, the protective layer can be endowed with other functions. For example, safe light becomes made suitable for use without causing reduction in sensitivity by addition of a coloring agent (water-soluble dye and the like) which gives excellent transmission of light used for exposure (for example, infrared laser having a wavelength from 760 to 1200 nm) and can efficiently absorb light having wavelengths independent of exposure.

Substrate

The substrate used in the planographic printing plate of the present invention is not particularly restricted providing it is a dimensionally stable plate, and there are listed, for example, paper, paper laminated with plastics (for example, polyethylene, polypropylene, polystyrene and the like), metal plates (for example, aluminum, zinc, copper and the like), and plastic films (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal and the like). These may be a sheet of single component such as a resin film and metal plate and the like, or a laminate composed of two or more materials, and for example, paper and plastic films laminated or deposited with metal as described above, laminated sheets made of different plastic films.

As the above-mentioned substrate, polyester films or aluminum plates are preferable, and of them, an aluminum plate that has excellent dimension stability and is relatively cheap is particularly preferable. The suitable aluminum plate is a pure aluminum plate or an alloy plate composed mainly of aluminum and containing traces of foreign elements, and further, plastic films laminated or deposited with aluminum may also be used. As the foreign elements contained in an aluminum alloy, silicon, iron, manganese, copper, magnesium, chromium, zinc, bismuth, nickel, titanium and the like are listed. The content of the foreign elements in the alloy is at most 10% by weight or less. In the present invention, particularly suitable aluminum is pure aluminum, however, since completely pure aluminum is not produced easily from the standpoint of refining technology, those containing a trace amount of foreign elements may also be used. The aluminum plate thus applied to the present invention does not have a formulation limited within a specific range, and aluminum plates made of conventionally known and used materials can be appropriately utilized.

The thickness of the above-mentioned aluminum plate is from about 0.1 to 0.6 mm, preferably from 0.15 to 0.4 mm, particularly preferably from 0.2 to 0.3 mm.

Prior to roughening of an aluminum plate, if required, de-greasing treatment is conducted using a surfactant, organic solvent or alkaline aqueous solution and the like, for example, for in order to remove rolling oil on the surface there of.

The surface roughening treatment of the surface of an aluminum plate is conducted by various methods, and for example, a mechanical roughening method, a method of dissolving and roughening the surface electrochemically, and a method of selectively dissolving the surface, are used. As the mechanical method, known methods such as a ball polishing method, brush polishing method, buff polishing method and the like can be used. As the electrochemical roughening method, methods using alternating current or direct current in a hydrochloric acid or nitric acid electrolyte solution are used. Further, methods using both of them in combination can also be used as disclosed in JP-A No. 54-63902.

An aluminum plate thus roughened can be subjected, if necessary, to alkali etching treatment and neutralization treatment, and for enhancing water-retention and abrasion-resistance of the surface, to anodizing treatment, As the electrolytes used for anodizing treatment of an aluminum plate, various electrolytes forming a porous oxide film can be used, and in general, sulfuric acid, phosphoric acid, oxalic acid, chromic acid or a mixed acid thereof can be used. The concentrations of these electrolytes are appropriately determined depending on the kinds of the electrolytes.

The treating conditions for anodizing can not universally be specified since they vary depending on electrolytes used, and in general, it is suitable that the concentration of electrolytes is from 1 to 80% by weight based on the solution, the liquid temperature is from 5 to 70° C., the current density is from 5 to 60 $A/dm^2$, the voltage is from 1 to 100 V, and the electrolysis time is from 10 seconds to 5 minutes.

The amount of an anodized film is suitably 1.0 $g/m^2$ or more, more preferably from 2.0 to 6.0 $g/m^2$. If the amount of an anodized film is less than 1.0 $g/m^2$, printing endurance is insufficient, non-image portions of a planographic printing plate are scratched easily, consequently, so-called "scratch staining" in which ink is adhered to scratched parts in printing tends to occur.

Such anodizing treatment is performed on a surface used for printing of a substrate of a planographic printing plate, and in general that an anodized film is formed also on the rear surface in an amount of 0.01 to 3 $g/m^2$ by turning the electric power lines to the rear.

The hydrophilization treatment of the surface of a substrate is performed after the above-mentioned anodizing treatment, and conventional treating methods can be used. As such hydrophilization treatment, an alkali metal silicate (for example, sodium silicate aqueous solution) method as disclosed in U.S. Pat. Nos. 2,714,066, 3,181,561, 3,280,734 and 3,902,734 is used. In this method, a substrate is immersed in a sodium silicate aqueous solution or subjected to electrolysis treatment. In addition, treatment with potassium fluorozirconate disclosed in JP-B No. 36-22063, and polyvinylphosphonic acid disclosed in U.S. Pat. Nos. 3,276,868, 4,153,461 and 4,689,272, and other methods are used.

Among them, the particularly preferable hydrophilization treatment in the present invention is the silicate treatment. The silicate treatment will be described below.

An anodized film of an aluminum plate on which the above-mentioned treatment has been performed is immersed in an aqueous solution having an alkali metal silicate content from 0.1 to 30% by weight, preferably from 0.5 to 10% by weight and having a pH from 10 to 13 at 25° C., at a temperatures from 15 to 80° C. for 0.5 to 120 seconds. When pH of an alkali metal silicate aqueous solution is less than 10, the solution is gelled, and when over 13.0, an oxidized film is dissolved. As the alkali metal silicate used in the present invention, sodium silicate, potassium silicate, lithium silicate and the like are used. As the hydroxide used for enhancing pH of the alkali metal silicate aqueous solution, sodium hydroxide, potassium hydroxide, lithium hydroxide and the like are listed. In the above-described treating solution, an alkaline earth metal salt or IVB metal salt may be compounded. As the alkaline earth metal salt, nitrates salts such as calcium nitrate, strontium nitrate, magnesium nitrate, barium nitrate and the like, and water-soluble salts such as sulfate salts, hydrochlorides, phosphate salts, acetate salts, oxalate salts, borate salts and the like, are listed. As the IVB metal salt, titanium tetrachloride, titanium trichloride, potassium fluorotitanate, potassium oxalate titanate, titanium sulfate, titanium tetraiodide, zirconium chloride oxide, zirconium dioxide, zirconium oxychloride, zirconium tetrachioride and the like are listed. The alkaline earth metal salts and IVB metal salts can be used alone or in combination of two or more. The amount of these metal salts is preferably from 0.01 to 10% by weight, and further preferably from 0.05 to 5.0% by weight.

By the silicate salt treatment, hydrophilicity on the surface of an aluminum plate is further improved, consequently, in printing, ink is not easily adhered to non-image portions, leading to improvement in anti-staining ability.

If necessary, a back coat is provided on the rear surface of a substrate. As the back coat, there are preferably used coating layers made of a metal oxide obtained by hydrolysis and polycondensation of organic polymer compounds described in JP-A No. 5-5885 and organic or inorganic metal compounds described in JP-A No. 6-35174.

Regarding these coating layers, alkoxide compounds of silicon such as $Si(OCH_3)_4$, $Si(OC_2H_5)_4$, $Si(OC_3H_7)_4$, $Si(OC_4H_9)_4$ and the like are available at low cost, and coating layers of metal oxides obtained from them are excellent in development-resistance and particularly preferable.

Exposure

As described above, the planographic printing plate of the present invention can be made. This planographic printing plate is exposed image-wise to solid laser and semiconductor laser emitting infrared ray having a wavelength from 760 nm to 1200 nm. In the present invention, developing treatment may be effected directly after laser irradiation, however, heating treatment can also be conducted between the laser irradiation process and the developing process. The heating treatment is preferably conducted at a temperature from 80 to 150° C. for from 10 seconds to 5 minutes. By this heating treatment, laser energy required for recording, in laser irradiation, can be reduced.

Development Solution

When a photosensitive material using the photosensitive composition of the present invention is used as an image formation material, usually, after image exposure, non-exposed parts of a photosensitive layer are removed by a development solution, to give images. As the preferable development solution when these photopolymerizable compositions are used for production of planographic printing plates, development solutions described in JP-B No. 57-7427 are listed, and aqueous solutions of inorganic alkali agents such as sodium silicate, potassium silicate, sodium hydroxide, potassium hydroxide, lithium hydroxide, tribasic sodium phosphate, dibasic sodium phosphate, tribasic ammonium phosphate, dibasic ammonium phosphate, sodium metasilicate, sodium hydrogen carbonate, ammonia water and the like and organic alkali agents such as monoethanolamine or diethanolamine and the like, are suitable. Materials are added so that such an alkali solution has a concentration of from 0.1 to 10% by weight, preferably from 0.5 to 5% by weight.

Further, such an alkaline aqueous solution, if necessary, contains a small amount of a surfactant and an organic solvent such as benzyl alcohol, 2-phenoxyethanol, 2-butoxyethanol and the like. For example, those described in U.S. Pat. Nos. 3,375,171 and 3,615,480 are listed.

Furthermore, development solutions described in JP-A Nos. 50-26601, 58-54341, 56-39464 and 56-42860 are also excellent.

The planographic printing plate obtained as described above can be subjected to a printing process after de-sensitizing gum is applied on the plate if necessary, and when a planographic printing plate having higher printing endurance is desired, burning treatment is performed.

When the planographic printing plate is subjected to burning, treatment with smoothing liquid as described in JP-N Nos. 61-2518, 55-28062, 62-31859 and 61-159655 is preferably conducted before burning.

As this method, a method in which the above-mentioned smoothing liquid is applied on a planographic printing plate by sponge or absorbent cotton impregnated with the smoothing liquid, or the printing plate is immersed in a vat filled with the smoothing solution to effect application, a method of application with an automatic coated, and other methods, are applied. Further, a desirable effect is obtained by making the application amount uniform by squeezing or by using squeegee roller after application.

The planographic printing plate which has been burn-treated can be subjected, if necessary, appropriate to conventionally conducted treatments such as washing with water, gum drawing and the like, and when smoothing liquid containing a water-soluble polymer compound and the like is used, so-called de-sensitizing treatments such as gum drawing and the like can be omitted.

Planographic printing plates obtained by such treatments are applied to an offset printing machine and the like, and used in printing in large numbers.

EXAMPLES

The following examples illustrate the present invention in-detail, but they do not limit the scope of the present invention.

Examples 1 to 53, Comparative Examples 1 to 12

1. Production of Substrate [A] and Substrate [B]

An aluminum plate having a thickness of 0.3 mm was degreased by trichloroethylene, then, the surface thereof was sand-blasted using a nylon brush and a pumice-water suspension of 400 mesh, and washed sufficiently with water. This plate was immersed in a 25% aqueous sodium hydroxide solution at 45° C. for 9 seconds to effect etching, and washed with water, then, further immersed in a 20% nitric acid for 20 seconds, and washed with water. The etched amount of the sand-blasted surface in this procedure was about 3 $g/m^2$. Then, this plate was treated at a current density of 15 $A/dm^3$ using 7% sulfuric acid as an electrolyte to form thereon a direct current electrode oxidized film of 3 $g/m^2$, then, washed with water, and dried to produce a substrate [A].

The substrate [A] was treated with a 2 wt % aqueous solution of sodium silicate for 15 seconds, and washed with water to produced a substrate [B].

2. Production of Substrate [C]

The surface of an aluminum plate having a thickness of 0.30 mm was sand-blasted using a nylon brush and a water suspension of pumice of 400 mesh, and washed sufficiently with water. This plate was immersed in a 10 wt % aqueous sodium hydroxide solution at 70° C. for 60 seconds to effect etching, and washed with flowing water, then, neutralized with 20 wt % nitric acid, and washed with water. This was subjected to an electrolytic roughening treatment with an electric quantity at an anode of 160 coulomb/$dm^2$ in a 1 wt % nitric acid aqueous solution using an alternation wave-form current of sine waves under a condition of $V_A$=12.7 V. The surface roughness thereof was measured to find it was 0.6 $\mu$m (Ra indication). Subsequently, it was immersed in a 30 wt % nitric acid aqueous solution and desmutted at 55° C. for 2 minutes, then, subjected to an anodizing treatment for 2 minutes so that the thickness of the anodized film was 2.7 g/$m^2$, at a current density of 2 A/$dm^2$ in a 20 wt % sulfuric acid aqueous solution.

Next, a liquid composition (sol liquid) according to an SG method was prepared by the following procedure.

Sol Solution

| | |
|---|---|
| Methanol | 130 g |
| Water | 20 g |
| 85 wt % Phosphoric acid | 16 g |
| Tetraethoxysilane | 50 g |
| 3-Methacryloxypropyltrimethoxysilane | 60 g |

The above-mentioned compounds were mixed, and stirred. After about 5 minutes, heat generation was confirmed. After reaction for 60 minutes, the content was put in another vessel, and to this was added 3000 g of methanol to obtain sol liquid.

This sol liquid was diluted with methanol/ethylene glycol=9/1 (ratio by weight), and applied so that the amount of Si on a substrate was 3 mg/$m^2$, and dried at 100° C. for 1 minute to obtain a substrate [C].

Formation of Planographic Printing Plate

On the substrate [A], substrate [B] and substrate [C] produced as described above, the following photosensitive layer application solution was applied so the amount applied was 1.5 g/$cm^2$, to obtain planographic printing plates of Examples 1 to 50. Substrates, (I) acid/radical generating agents (indicated as polymerization initiator), (II) light-heat converting agents, (III) compounds having a polymerizable unsaturated group (indicated as addition polymerizable compound) and (IV) binders, used, are as shown in the following Tables 1 to 3.

The compositions of the photosensitive application solutions are as described below.

| | |
|---|---|
| Addition polymerizable compounds (compounds in Tables 1 to 3) | 1.5 g |
| Binders (compounds in Tables1 to 3) | 2.0 g |
| Light-heat converting agents (compounds in Tables 1 to 3) | 0.1 g |
| Polymerization initiators (compounds in Tables 1 to 3) | 0.2 g |
| Fluorine-based nonionicsurfactant (trade name: Megafac F-177, Dainippon Ink & Chemicals Inc.) | 0.02 g |
| Dye obtained by converting counter ion in Victoria Pure Blue BOH into 1-naphthalenesulfonic acid anion | 0.04 g |
| Methyl ethyl ketone | 10 g |
| Methanol | 7 g |
| 2-Methoxy-1-propanol | 10 g |

TABLE 1

| | Substrate | Poly-merization initiator | Infrared absorber | Addition · Polymerizable compound | Binder | Develo-ping solution | Sensitivity ($mJ/cm^2$) | Printing endurance | | Sensitivity ($mJ/cm^2$) | Printing endurance |
|---|---|---|---|---|---|---|---|---|---|---|---|
| Example 1 | A | I-1 | DX-1 | M-1 | B-1 | DP-4 | 70 | 180 | Example 54 | 60 | 195 |
| Example 2 | B | II-8 | DX-1 | M-2 | B-2 | DN-3C | 85 | 165 | Example 55 | 75 | 110 |
| Example 3 | C | II-9 | DX-2 | M-2 | B-1 | DP-4 | 80 | 170 | Example 56 | 75 | 175 |
| Example 4 | A | II-20 | DX-3 | M-1 | B-2 | DP-4 | 80 | 170 | Example 57 | 70 | 180 |
| Example 5 | B | I-25 | DX-1 | M-2 | B-3 | DP-4 | 85 | 165 | Example 58 | 80 | 175 |
| Example 6 | C | I-12 | DX-1 | M-2 | B-1 | DP-4 | 80 | 165 | Example 59 | 70 | 180 |
| Example 7 | A | II-15 | DX-2 | M-1 | B-1 | DN-3C | 75 | 175 | Example 60 | 65 | 190 |
| Example 8 | B | III-11 | DX-1 | M-1 | B-2 | DN-3C | 75 | 170 | Example 61 | 65 | 190 |
| Example 9 | C | II-36 | DX-2 | M-2 | B-2 | DP-4 | 80 | 165 | Example 62 | 80 | 175 |
| Example 10 | A | III-14 | DX-2 | M-2 | B-2 | DN-3C | 90 | 160 | Example 63 | 85 | 170 |
| Example 11 | B | I-17 | DX-2 | M-1 | B-1 | DN-3C | 70 | 180 | Example 64 | 60 | 190 |
| Example 12 | C | II-24 | DX-3 | M-1 | B-3 | DP-4 | 70 | 175 | Example 65 | 65 | 185 |
| Example 13 | A | II-26 | DX-3 | M-2 | B-3 | DP-4 | 80 | 165 | Example 66 | 70 | 175 |
| Example 14 | B | III-1 | DX-2 | M-2 | B-2 | DN-3C | 85 | 165 | Example 67 | 75 | 175 |
| Example 15 | C | II-27 | DX-3 | M-1 | B-1 | DP-4 | 75 | 175 | Example 68 | 65 | 185 |
| Example 16 | A | III-6 | DX-2 | M-1 | B-3 | DN-3C | 85 | 160 | Example 69 | 75 | 170 |
| Example 17 | B | III-17 | DX-1 | M-1 | B-3 | DP-4 | 85 | 165 | Example 70 | 75 | 175 |
| Comparative Example 1 | A | H-1 | DX-1 | M-1 | B-1 | DP-4 | 140 | 100 | Comparative Example 13 | 125 | 110 |
| Comparative Example 2 | A | H-5 | DX-3 | M-1 | B-2 | DP-4 | No image formation | | Comparative Example 14 | No image formation | |
| Comparative Example 3 | B | H-3 | DX-1 | M-1 | B-2 | DN-3C | 125 | 110 | Comparative Example 15 | 120 | |
| Example 4 | C | H-4 | DX-2 | M-1 | B-1 | DN-3C | 125 | 115 | Comparative Example 16 | 115 | |

TABLE 2

| | Substrate | Poly-merization initiator | Addition · poly-merizable compound | Binder | Infrared absorber | Developing solution | Sensi-tivity | Printing endurance | | Sensi-tivity | Printing endurance |
|---|---|---|---|---|---|---|---|---|---|---|---|
| Example 18 | A | IVA-1 | M-1 | B-1 | DX-1 | DP-4 | 90 | 180 | Example 71 | 80 | 190 |
| Example 19 | A | IVA-32 | M-2 | B-2 | DX-1 | DP-4 | 85 | 190 | Example 72 | 80 | 200 |
| Example 20 | A | IVB-6 | M-2 | B-1 | DX-2 | DP-4 | 100 | 165 | Example 73 | 75 | 170 |
| Example 21 | A | SA-36 | M-1 | B-2 | DX-3 | DP-4 | 90 | 175 | Example 74 | 70 | 190 |
| Example 22 | A | SB-12 | M-2 | B-3 | DX-1 | DP-4 | 85 | 170 | Example 75 | 70 | 190 |
| Example 23 | B | IVB-23 | M-2 | B-1 | DX-1 | DP-4 | 85 | 175 | Example 76 | 70 | 195 |
| Example 24 | B | IVC-5 | M-1 | B-1 | DX-2 | DN-3C | 90 | 160 | Example 77 | 75 | 170 |
| Example 25 | B | IVE-7 | M-1 | B-2 | DX-1 | PN-3C | 10 | 145 | Example 78 | 100 | 155 |
| Example 26 | B | IVF-4 | M-1 | B-1 | DX-1 | DN-3C | 90 | 180 | Example 79 | 85 | 190 |
| Example 27 | B | IVG-17 | M-2 | B-2 | DX-2 | DN-3C | 85 | 175 | Example 80 | 75 | 190 |
| Example 28 | B | IVH-4 | M-1 | B-1 | DX-1 | DN-3C | 95 | 160 | Example 81 | 85 | 170 |
| Example 29 | B | IVB-14 | M-1 | B-3 | DX-3 | DP-4 | 80 | 190 | Example 82 | 65 | 205 |
| Example 30 | B | IVB-1 | M-2 | B-2 | DX-1 | DN-3C | 85 | 190 | Example 83 | 75 | 200 |
| Example 31 | B | SA-28 | M-1 | B-3 | DX-2 | DN-3C | 80 | 175 | Example 84 | 70 | 200 |
| Example 32 | B | SA-17 | M-1 | B-1 | DX-2 | DN-3C | 110 | 155 | Example 85 | 105 | 165 |
| Example 33 | B | SB-1 | M-2 | B-1 | DX-3 | DN-3C | 80 | 180 | Example 86 | 65 | 200 |
| Example 34 | B | SB-14 | M-2 | B-2 | DX-1 | DN-3C | 85 | 180 | Example 87 | 75 | 190 |
| Example 35 | B | SC-8 | M-1 | B-3 | DX-2 | DN-3C | 85 | 180 | Example 88 | 70 | 195 |
| Example 36 | B | SD-2 | M-2 | B-1 | DX-1 | DN-3C | 85 | 175 | Example 89 | 75 | 190 |
| Example 37 | B | SG-1 | M-2 | B-3 | DX-3 | DP-4 | 105 | 15 | Example 90 | 90 | 170 |
| Example 38 | B | SE-2 | M-1 | B-2 | DX-3 | DN-3C | 95 | 160 | Example 91 | 85 | 175 |
| Comparative Example 5 | A | H-1 | M-2 | B-1 | DX-2 | DP-4 | 140 | 100 | Comparative Example 17 | 125 | 110 |
| Comparative Example 6 | B | H-2 | M-1 | B-2 | BX-1 | DN-3C | 125 | 90 | Comparative Example 18 | 120 | 95 |
| Camparative Example 7 | A | H-3 | M-1 | B-1 | DX-1 | DP-4 | 125 | 110 | Comparative Example 19 | 120 | 120 |
| Comparative Example 8 | B | H-4 | M-2 | B-2 | DX-2 | DN-3 | 120 | 115 | Comparative Example 20 | 115 | 115 |

TABLE 3

| | Substrate | Poly-merization initiator | Infrared absorber | Addition · poly-merizable compound | Binder | Developing solution | Sensi-tivity (mJ/cm$^2$) | Printing endurance | | Sensi-tivity (mJ/cm$^2$) | Printing endurance |
|---|---|---|---|---|---|---|---|---|---|---|---|
| Example 39 | A | ii-1 | DX-1 | M-1 | B-1 | DP-4 | 90 | 160 | Example 92 | 80 | 180 |
| Example 40 | B | ii-4 | DX-1 | M-2 | B-2 | DN-3C | 90 | 155 | Example 93 | 80 | 170 |
| Example 41 | C | ii-15 | DX-2 | M-2 | B-1 | DP-4 | 100 | 155 | Example 94 | 95 | 175 |
| Example 42 | A | ii-10 | DX-3 | M-1 | B-2 | DP-4 | 85 | 170 | Example 95 | 75 | 190 |
| Example 43 | B | ii-18 | DX-1 | M-2 | B-3 | DP-4 | 105 | 155 | Example 96 | 95 | 170 |
| Example 44 | C | ii-26 | DX-1 | M-2 | B-1 | DP-4 | 95 | 160 | Example 97 | 90 | 180 |
| Example 45 | A | ii-27 | DX-2 | M-1 | B-1 | DN-3C | 90 | 160 | Example 98 | 85 | 180 |
| Example 46 | 8 | ii-1 | DX-1 | M-1 | B-2 | DN-3C | 90 | 160 | Example 99 | 85 | 175 |
| Example 47 | C | iii-3 | DX-2 | M-2 | B-2 | DP-4 | 90 | 165 | Example 100 | 80 | 185 |
| Example 48 | A | iii-6 | DX-2 | M-2 | B-2 | DN-3C | 85 | 170 | Example 101 | 75 | 190 |
| Example 49 | B | iii-9 | DX-1 | M-1 | B-1 | DN-3C | 105 | 150 | Example 102 | 100 | 170 |
| Example 50 | C | iii-11 | DX-3 | M-1 | B-3 | DP-4 | 100 | 160 | Example 103 | 95 | 175 |
| Example 51 | A | I-1 | DX-4 | M-1 | B-2 | DP-4 | 65 | 180 | Example 104 | 55 | 200 |
| Example 52 | 8 | ii-1 | DX-4 | M-1 | B-2 | DN-3C | 80 | 165 | Example 105 | 75 | 190 |
| Example 53 | A | SA-28 | DX-4 | M-1 | B-1 | DP-4 | 75 | 185 | Example 106 | 70 | 205 |
| Comparative Example 9 | A | H-1 | DX-1 | M-1 | B-1 | DP-4 | 140 | 100 | Comparative Example 21 | 125 | 110 |
| Comparative Example 10 | A | H-2 | DX-3 | M-1 | B-2 | DP-4 | 125 | 90 | Comparative Example 22 | 120 | 95 |
| Comparative Example 11 | B | H-3 | DX-1 | M-1 | B-2 | DN-3C | 125 | 110 | Comparative Example 23 | 120 | 120 |
| Example 12 | C | H-4 | DX-2 | M-2 | B-2 | DP-4 | 120 | 115 | Comparative Example 24 | 115 | 115 |

DX-1

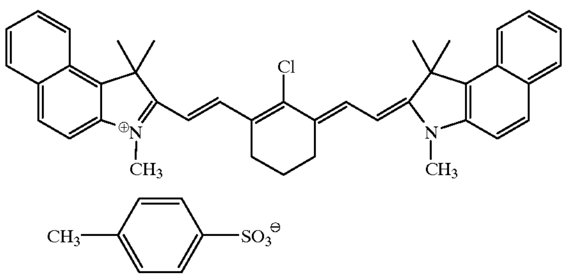

DX-2

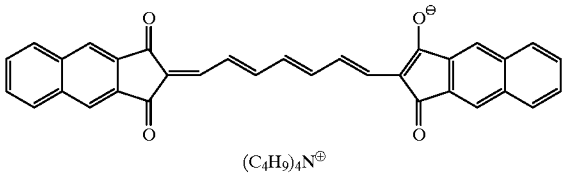

DX-3

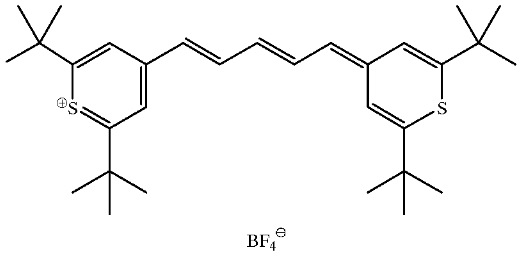

DX-4

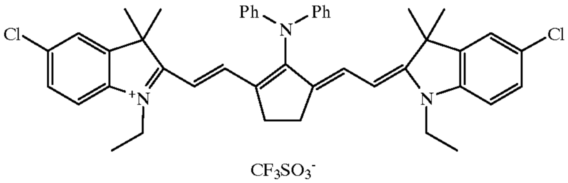

Addition polymerizable compounds in Tables 1 to 3

(M-1)

Pentaerythritol tetraacrylate (M-2)

Glycerin dimethacrylate hexamethylene diisocyanate urethane prepolymer (Binders in Tables 1 to 3)

(B-1)

Allyl methacrylate/methacrylic acid/N-isopropylamide copolymer (copolymerization molar ratio: 67/13/20)

Acid value (measured by NaOH titration): 1.15 meq/g

Polymerization average molecular weight: 130000

(B-2)

Allyl methacrylate/methacrylic acid copolymer (copolymerization molar ration: 83/17)

Acid value (measured by NaOH titration): 1.55 meq/g

Polymerization average molecular weight: 125000

(B-3)

Polyurethane resin which is condensate of the following diisocyanate with diol (a) 4,4'-Diphenylmethane diisocyanate (b) Hexamethylene diisocyanate (c) Polypropylene glycol (polymerization average molecular weight: 1000)

(c) 2,2-Bis(hydroxymethyl)propionic acid ((a)/(b)/(c)/(d) copolymerization molar ratio: 40/10/15/35)

Acid value (measurement by NaOH titration): 1.05 meq/g

Polymerization average molecular weight: 45000

Comparative Examples 1 to 12

For comparison, on the substrate [A], substrate [B] or substrate [C], photosensitive layers were formed by using photosensitive layer application solutions using known radical polymerization initiators having in a counter anion an onium salt structure other than those represented by the above-described formula, for example known radical polymerization initiators H-1 to H-5 having sulfonate (—$SO_3^-$) as a counter anion (structures are as shown below), and containing other components of compositions as shown in Tables 1 to 3, to obtain planographic printing plates (Comparative Examples 1 to 12).

H-1

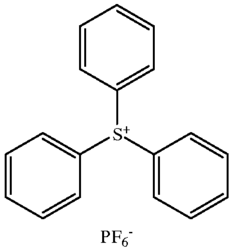

H-2

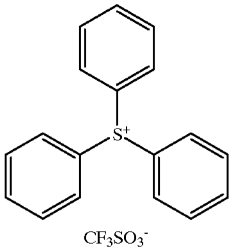

H-3

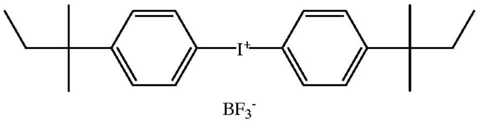

H-4

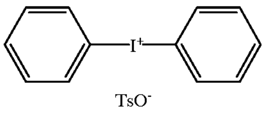

H-5

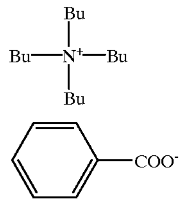

Exposure and Development

The obtained planographic printing plates were exposed using semiconductor laser having an output of 500 mW, a wavelength of 830 nm and a beam diameter of 17 μm ($1/e^2$)

at a main scanning rate of 5 m/sec., then, development was conducted using an automatic developing machine (manufactured by Fuji Photo Film Co., Ltd.: trade name "PS Processor 900 VR") charged with DN3C developer (trade name) or DP-4 developer (trade name) and lines liquid FR-3 (1:7) (trade name, manufactured by Fuji Photo Film Co., Ltd.), and the following evaluations were conducted. In the development treatments, kinds of developer used are also listed in the above-mentioned Tables 1 to 3 together.

Printing Endurance Test

R 201 (trade name, manufactured by Roland Corp.) was used as a printer, and GEOS (N) (trade name, manufactured by Dainippon Ink & Chemicals Inc.) was used as the ink. Printed products at solid image portions were observed, and printing endurance was measured based on the number of sheets manifesting initiation of fading. The printing endurance was represented by relative ratio based on 100 which is the numerical value (number of pieces) in Comparative Example 1. The evaluation is such that when the number is higher, printing endurance is more excellent.

Evaluation of Sensitivity

Planographic printing plates were exposed by semiconductor laser emitting infrared ray having a wavelength from 830 to 850 nm. After exposure, the plates were developed with DN-3C (trade name, a developer manufactured by Fuji Photo Film Co., Ltd.) diluted with water at a ratio of 1:2 or DP-4 (trade name, a developer manufactured by Fuji Photo Film Co., Ltd.) diluted with water at a ratio of 1:8, and then washed with water. The amount of energy required for recording was calculated based on the line width of an image, laser output, loss in an optical system, and scanning rate, obtained in the above-mentioned procedure. The smaller numerical value represents higher sensitivity.

The evaluation results are shown in Tables 1 to 3.

The results in Tables 1 to 3 show that the planographic printing plate of the present invention has high resistance in an alkali developer at the image portions, has excellent printing endurance ability, and has high sensitivity. On the other hand, the planographic printing plates in Comparative Examples 1, 3, 4 to 12 using known radical polymerization initiators are poorer both in printing endurance and sensitivity, as compared with those in Examples 1, 8, 11, 20, 25, 18, 27, 41, 46, 39 and 48 obtained under the same conditions except that polymerization initiators are different. In Comparative Example 2 where a compound having in a counter anion a carboxylate having a structure not belonging to the scope of the present invention was used, no image was formed. Examples 54 to 106, Comparative Examples 13 to 24

On the photosensitive layers of the planographic printing plates obtained in Examples 1 to 53 and Comparative Examples 1 to 12, a 3 wt % aqueous solution of polyvinyl alcohol (saponification degree: 98 mol %, polymerization degree: 550) was applied so that the amount applied after drying was 2 g/m$^2$, and dried at 100° C. for 2 minutes, to obtain planographic printing plates comprising protective layers provided on photosensitive layers. These plates correspond to Examples 54 to 106 and Comparative Examples 13 to 24.

The obtained planographic printing plates were subjected to exposure and development under the same conditions as in the above-described Examples 1 to 53 and Comparative Examples 1 to 12 to produce planographic printed plates, and color remaining on non-image portions and close adherence and printing endurance of image portions were evaluated in a similar manner. The results are shown in Tables 1 to 3.

The results in Tables 1 to 3 show that even when protective layers are provided on photosensitive layers, the same tendency as in Examples 1 to 53 having no protective layer is found, and the planographic printing plates of the present invention have resistance against an alkali developer in image portions, are excellent in printing endurance ability, and have high sensitivity, and further, that by providing a protective layer, both of sensitivity ad printing endurance are further improved.

Examples 107 to 109

On polytetraethylene terephthalate films (thickness: 0.1 mm) as a substrate, recording layer application solutions as described below were applied so that the application amount after drying was 2.0 g/cm$^2$, to obtain Examples 107 to 109 which are transparent recording materials. In Example 107, I-1 was used, in Example 108, SB-1 was used, and in Example 109, ii-10 was used, respectively, as an acid/radical generating agent.

The composition of the recording layer application solution is as described below.

| | |
|---|---|
| Addition polymerizable compound (M-1) | 2.0 g |
| Binder (B-1) | 1.6 g |
| Acid/radical generating agent | 0.4 g |
| Methyl ethyl ketone | 10 g |
| Methanol | 5 g |
| 2-Methoxy-1-propanol | 10 g |

This recording material was heated at 200° C. for 15 seconds to thermally set the recording layer on the substrate. Then, the recording material was immersed in dimethylsulfoxide for 5 minutes, and the insolubility of this recording layer was calculated from the amount of the remaining recording layer to show an insolubility of 97%. From this, it was confirmed that the recording layer composed of the heat-sensitive composition of the present invention containing the acid/radical generating agent of the general formulae (A) to (E) was hardened successfully.

Comparative Examples 25 to 28

Recording layers were thermally set in the same manners as in Examples 107 to 109 using radical generating agent having $SbF_6^-$ as a counter cation, instead of the radical generators in the above-mentioned recording layer application solutions, and the insolubilities were measured. As a result, about 14% insolubilized rate was manifested in all the example. By comparison of radical generating agents having the same anion parts, it was recognized that the heat-sensitive composition of the present invention is excellent in sensitivity.

Examples 110 to 112

On polytetraethylene terephthalate films (thickness: 0.1 mm) as a substrate, recording layer application solutions as described below were applied so that the application amount after drying was 2.0 g/cm$^2$, to obtain pale yellow transparent recording materials. In Example 110, II-1 was used, in Example 111, SA-1 was used, and in Example 112, iii-2 was used, respectively, as an acid/radical generating agent.

Recording layer application solution

| | |
|---|---|
| Oxidative color developing dye (Leuco Crystal Violet) | 0.2 g |
| Binder (polymethyl methacrylate) | 2.7 g |
| Acid/radical generating agent | 0.3 g |
| Methyl ethyl ketone | 10 g |
| Methanol | 8 g |
| 2-Methoxy-1-propanol | 8 g |

These recording materials were heated in an oven at 200° C. for 15 second to heat the recording layers on the substrates to develop color. In all cases, the recording layer developed sharp blue color. From this is it estimated that the recording layer composed of the heat-sensitive composition of the present invention which contains the acid/radical generating agent of the general formulae (A) to (E) includes a leuco dye which is oxidized and develops color due to generation of radicals.

In the heat-sensitive composition of the present invention highly sensitive irreversible changes of physical properties due to heating are possible. Further in the negative planographic printing plate using this heat-sensitive composition, writing by infrared layers is possible, and image portions have excellent alkali developer resistance. It is also excellent in printing durability and has high sensitivity.

What is claimed is:

1. A heat-sensitive composition comprising (I) a compound which generates an acid or a radical when heated and which is represented by the following general formula (A), general formula (B), general formula (C), general formula (D) or general formula (E), and further comprising (II) a compound whose physical and chemical properties are changed irreversibly by an acid or radical $^{a}X—COO^{-\,a}M^{+}$ General formula (A)

General formula (B)

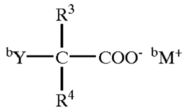

General formula (C)

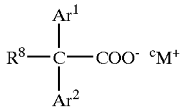

$^{d}R—COO^{-\,d}M^{+}$ General formula (D)

$^{e}X^{-\,e}M^{+}$ General formula (E)

wherein, in general formula (A), $^{a}M^{+}$ represents a monovalent cation selected from the group consisting of sulfonium, iodonium, diazonium and azinium; and $^{a}X$ represents one of the groups shown below or a halogen atom;

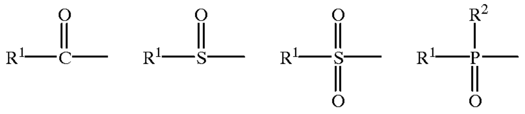

-continued

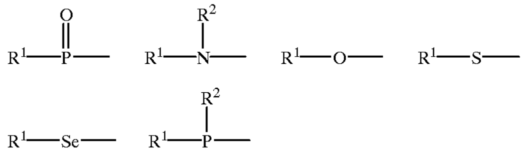

and in the above formulas, $R^1$ and $R^2$ may be the same or different and represent a monovalent non-metal atom, in the general formula (B), $^{b}Y$ has the same definition as for $^{a}X$ in the general formula (A) or represents —OH, —CN, —$NO_2$, —$Si(R^5)(R^6)(R^7)$; $R^3$ to $R^7$ may be the same or different and represent a monovalent non-metal atom; and $^{b}M^{+}$ represents a monovalent cation selected from the group consisting of sulfonium, iodonium, diazonium and azinium;

in the general formula (C), $R^8$ represents a monovalent non-metal atom; $Ar^1$ and $Ar^2$ may be the same or different and represent an aryl group; and $^{c}M^{+}$ represents a monovalent cation selected from the group consisting of sulfonium, iodonium, diazonium and azinium;

in the general formula (D), $^{d}R$ represents an alkyl group or aryl group; and $^{d}M^{+}$ represents a counter cation selected from the group consisting of sulfonium, iodonium, diazonium and azinium, in the general formula (E), $^{e}X^{-}$ is an anion of a compound having a structure of the following general formula (F);

General formula (F)

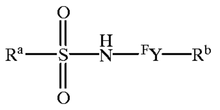

wherein in general formula (F), $^{F}Y$ represents a single bond, —CO— or —$SO_2$—; $R^a$ and $R^b$ each independently represents a linear, branched or cyclic alkyl group, aryl group, aralkyl group or camphor group; $R^a$ and $R^b$ may be connected via an alkylene group, arylene group or aralkyl group to form a ring; when $^{F}Y$ is a —CO— group, $R^b$ may be a hydroxyl group or an alkoxy group; and $^{e}M^{+}$ represents a counter cation selected from the group consisting of sulfonium, iodonium, diazonium and azinium.

2. The heat-sensitive composition according to claim 1, wherein, the composition further comprises (III) a light-heat converting agent, and by exposure at the absorption wavelength of said (III) light-heat converting agent, an acid or radical of a compound (I) is generated which generates an acid or a radical by heat represented by at least one of the above-mentioned general formulae (A) to (E), and physical or chemical properties are changed by an acid or radical.

3. The heat-sensitive composition according to claim 2, wherein said (III) light-heat converting agent is represented by the following general formula (a):

General formula (a)

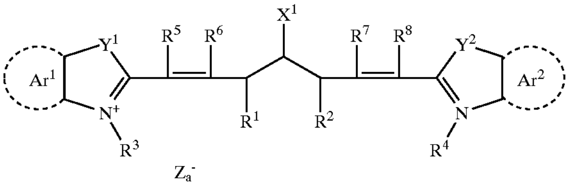

wherein in the general formula (a), $X^1$ represents a halogen atom, $—NPh_2$, $X^2—L^1$, or the group shown below;

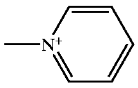

$X^2$ represents an oxygen atom or a sulfur atom; $L^1$ represents a hydrocarbon group having 1 to 12 carbon atoms, an aromatic ring having heteroatoms or a hydrocarbon group having 1 to 12 heteroatoms, wherein said heteroatom is selected from the group consisting of a nitrogen atom, a sulfur atom, an oxygen atom, a halogen atom and a selenium atom; each of $R^1$ and $R^2$ independently represents a hydrocarbon group having 1 to 12 carbon atoms; $Ar^1$ and $Ar^2$ may each be the same or different and represent an aromatic hydrocarbon group optionally having a substituent; $Y^1$ and $Y^2$ may each be the same or different and represent a sulfur atom or a dialkylmethylene group having 12 or less carbon atoms; $R^3$ and $R^4$ may each be the same or different and represent a hydrocarbon group having 20 or less carbon atoms, optionally having a substituent; $R^5$, $R^6$, $R^7$ and $R^8$ may each be the same or different, and represent a hydrogen atom or a hydrocarbon group having 12 or less carbon atoms; and $Z_a^-$ represents a counter anion, however, when a sulfo group is substituted in any of $R^1$ to $R^8$, $Z_a^-$ is not necessary.

4. The heat-sensitive composition according to claim 3, wherein $X^1$ in the general formula (a) is $—NPh_2$.

5. The heat-sensitive composition according to claim 1, wherein said compound (I) is represented by said formula (A), and wherein $R^1$ and $R^2$ in said formula (A) are selected from the group consisting of an alkyl group, an alkenyl group and an aryl group having 1 to 12 carbon atoms.

6. The heat-sensitive composition according to claim 1, wherein ${}^aM^+$, ${}^bM^+$, ${}^cM^+$, ${}^dM^+$ and ${}^eM^+$ each independently represents iodonium or sulfonium.

7. The heat-sensitive composition according to claim 6, wherein said compound (II) is a compound having at least one ethylenically unsaturated bond.

8. The heat-sensitive composition according to claim 7, wherein, the composition further comprises (III) a light-heat converting agent, and by exposure at the absorption wavelength of said (III) light-heat converting agent, an acid or a radical of a compound (I) is generated, and physical or chemical properties are changed by an acid or radical.

9. The heat-sensitive composition according to claim 8, wherein said (III) light-heat converting agent is represented by the following general formula (a):

General formula (a)

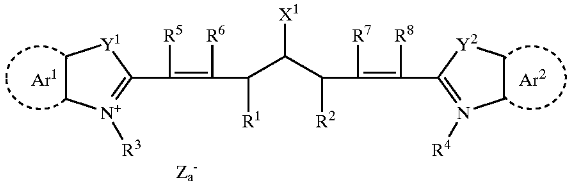

wherein in the general formula (a), $X^1$ represents a halogen atom, $—NPh_2$, $X^2—L^1$, or the group shown below;

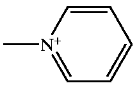

$X^2$ represents an oxygen atom or a sulfur atom; $L^1$ represents a hydrocarbon group having 1 to 12 carbon atoms, an aromatic ring having heteroatoms or a hydrocarbon group having 1 to 12 heteroatoms, wherein said heteroatom is selected from the group consisting of a nitrogen atom, a sulfur atom, an oxygen atom, a halogen atom and a selenium atom; each of $R^1$ and $R^2$ independently represents a hydrocarbon group having 1 to 12 carbon atoms; $Ar^1$ and $Ar^2$ may each be the same or different and represent an aromatic hydrocarbon group optionally having a substituent; $Y^1$ and $Y^2$ may each be the same or different and represent a sulfur atom or a dialkylmethylene group having 12 or less carbon atoms; $R^3$ and $R^4$ may each be the same or different and represent a hydrocarbon group having 20 or less carbon atoms, optionally having a substituent; $R^5$, $R^6$, $R^7$ and $R^8$ may each be the same or different, and represent a hydrogen atom or a hydrocarbon group having 12 or less carbon atoms; and $Z_a^-$ represents a counter anion, however, when a sulfo group is substituted in any of $R^1$ to $R^8$, $Z_a^-$ is not necessary.

10. The heat-sensitive composition according to claim 9, wherein $X^1$ in the general formula (a) is $—NPh_2$.

11. The heat-sensitive composition according to claim 6, wherein, the composition further comprises (III) a light-heat converting agent, and by exposure at the absorption wavelength of said (III) light-heat converting agent, an acid or a radical of a compound (I) is generated, and physical or chemical properties are changed by an acid or radical.

12. The heat-sensitive composition according to claim 11, wherein said (III) light-heat converting agent is represented by the following general formula (a):

General formula (a)

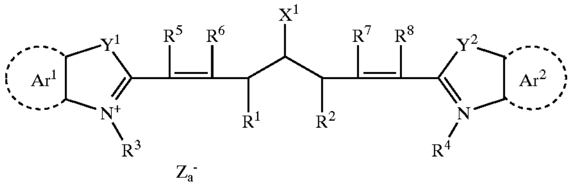

wherein in the general formula (a), $X^1$ represents a halogen atom, —$NPh_2$, $X^2$—$L^1$, or the group shown below;

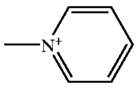

$X^2$ represents an oxygen atom or a sulfur atom; $L^1$ represents a hydrocarbon group having 1 to 12 carbon atoms, an aromatic ring having heteroatoms or a hydrocarbon group having 1 to 12 heteroatoms, wherein said heteroatom is selected from the group consisting of a nitrogen atom, a sulfur atom, an oxygen atom, a halogen atom and a selenium atom; each of $R^1$ and $R^2$ independently represents a hydrocarbon group having 1 to 12 carbon atoms; $Ar^1$ and $Ar^2$ may each be the same or different and represent an aromatic hydrocarbon group optionally having a substituent; $Y^1$ and $Y^2$ may each be the same or different and represent a sulfur atom or a dialkylmethylene group having 12 or less carbon atoms; $R^3$ and $R^4$ may each be the same or different and represent a hydrocarbon group having 20 or less carbon atoms, optionally having a substituent; $R^5$, $R^6$, $R^7$ and $R^8$ may each be the same or different, and represent a hydrogen atom or a hydrocarbon group having 12 or less carbon atoms; and $Z_a^-$ represents a counter anion, however, when a sulfo group is substituted in any of $R^1$ to $R^8$, $Z_a^-$ is not necessary.

13. The heat-sensitive composition according to claim 12, wherein $X^1$ in the general formula (a) is —$NPh_2$.

14. The heat-sensitive composition according to claim 1, wherein said compound (I) is represented by formula (A), and ${}^aM^+$ in said formula (A) is represented by the following general formula (${}^a$M-I) or(${}^a$M-II);

(${}^a$M-I)

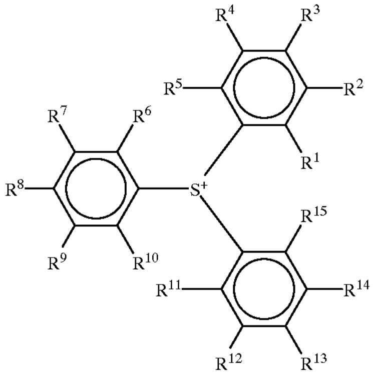

(${}^a$M-II)

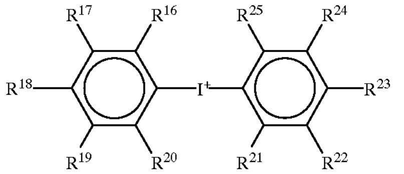

wherein, in the above formulae (${}^a$M-I) and (${}^a$M-II), $R^1$ to $R^{25}$ each independently represents a hydrogen atom, a linear, branched or cyclic alkyl group, a linear, branched or cyclic alkoxy group, a hydroxyl group, a halogen atom or a —S—$R^{26}$ group; and wherein $R^{26}$ represents a linear, branched or cyclic alkyl group, or an aryl group.

15. The heat-sensitive composition according to claim 1, wherein said compound (I) is represented by said formula (A) in which ${}^a$X has the following structure:

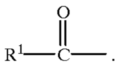

16. The heat-sensitive composition according to claim 1, wherein said compound (I) is represented by said formula (B) in which ${}^b$Y has one of the following structures:

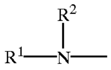 , 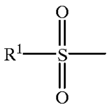 , 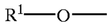 , 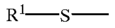 .

17. The heat-sensitive composition according to claim 1, wherein said compound (I) is represented by said formula (C), and wherein $R^8$ in said formula (C) is selected from the group consisting of a hydrogen atom, an alkyl group having 1 to 6 carbon atoms, an aryl group having 6 to 10 carbon atoms and a hydroxyl group.

18. The heat-sensitive composition according to claim 1, wherein said compound (I) is represented by said formula (D), and wherein ${}^d$R—COOH, which is a conjugate acid of the carboxylate ${}^d$R—$COO^-$ of said formula (D), has a pKa in water of 2 or more.

19. The heat-sensitive composition according to claim 1, wherein said compound (II) is a compound having at least one ethylenically unsaturated bond.

20. The heat-sensitive composition according to claim 19, wherein the composition further comprises (III) a light-heat converting agent, and by exposure at the absorption wavelength of said (III) light-heat converting agent, an acid or a radical of a compound (I) is generated, and physical or chemical properties are changed by an acid or radical.

21. The heat-sensitive composition according to claim 20, wherein said (III) light-heat converting agent is represented by the following general formula (a):

General formula (a)

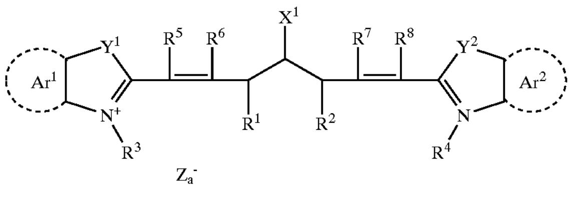

wherein in the general formula (a), $X^1$ represents a halogen atom, —$NPh_2$, $X^2$—$L^1$, or the group shown below;

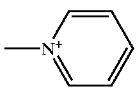

$X^2$ represents an oxygen atom or a sulfur atom; $L^1$ represents a hydrocarbon group having 1 to 12 carbon atoms, an aromatic ring having heteroatoms or a hydrocarbon group having 1 to 12 heteroatoms, wherein said heteroatom is selected from the group consisting of a nitrogen atom, a sulfur atom, an oxygen atom, a halogen atom and a selenium atom; each of $R^1$ and $R^2$ independently represents a hydrocarbon group having 1 to 12 carbon atoms; $Ar^1$ and $Ar^2$ may each be the same or different and represent an aromatic hydrocarbon group optionally having a substituent; $Y^1$ and $Y^2$ may each be the same or different and represent a sulfur atom or a dialkylmethylene group having 12 or less carbon atoms; $R^3$ and $R^4$ may each be the same or different and represent a hydrocarbon group having 20 or less carbon atoms, optionally having a substituent; $R^5$, $R^6$, $R^7$ and $R^8$ may each be the same or different, and represent a hydrogen atom or a hydrocarbon group having 12 or less carbon atoms; and $Z_a^-$ represents a counter anion, however, when a sulfo group is substituted in any of $R^1$ to $R^8$, $Z_a^-$ is not necessary.

22. The heat-sensitive composition according to claim 21, wherein $X^1$ in the general formula (a) is —$NPh_2$.

23. A heat mode-applicable negative planographic printing plate comprising a substrate which has disposed thereon a photosensitive layer comprising (I) an acid or radical polymerization initiator represented by at least one of the following general formula (A), general formula (B), general formula (C), general formula (D) and general formula (E); (II-a) a radical-polymerizable compound having an unsaturated bond (III) a light-heat converting agent, and (IV) a binder polymer;

$^{a}X—COO^{-\,a}M^{+}$ General formula (A)

General formula (B)

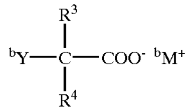

General formula (C)

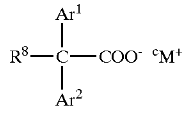

wherein, in general formula (A), $^{a}M^{+}$ represents a monovalent cation selected from the group consisting of sulfonium, iodonium, diazonium and azinium; $^{a}X$ represents one of the groups shown below or a halogen atom;

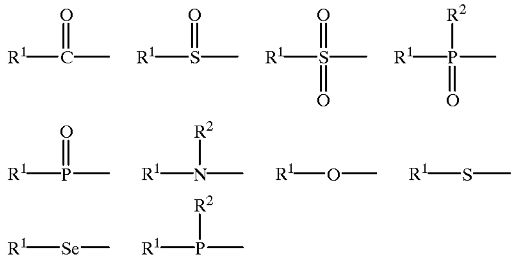

and in the above formulas, $R^1$ and $R^2$ may be the same or different and represent a monovalent non-metal atom, in the general formula (B), $^{b}Y$ has the same definition as for $^{a}X$ in the general formula (A) or represents —OH, —CN, —$NO_2$, —$Si(R^5)(R^6)(R^7)$; $R^3$ to $R^7$ may be the same or different and represent a monovalent non-metal atom; and $^{b}M^{+}$ represents a monovalent cation, selected from the group consisting of sulfonium, iodonium, diazonium and azinium;

in the general formula (C), $R^8$ represents a monovalent non-metal atom; $Ar^1$ and $Ar^2$ may be the same or different and represent an aryl group; and $^{c}M^{+}$ represents a monovalent cation, selected from the group consisting of sulfonium, iodonium, diazonium and azinium;

in the general formula (D), $^{d}R$ represents an alkyl group or aryl group; and $^{d}M^{+}$ represents a counter cation selected from the group consisting of sulfonium, iodonium, diazonium and azinium, in the general formula (E), $^{e}X^{-}$ is an anion of a compound having a structure of the following general formula (F);

General formula (F)

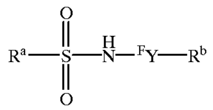

wherein in general formula (F), $^{F}Y$ represents a single bond, —CO— or —$SO^2$—; $R^a$ and $R^b$ each independently represents a linear, branched or cyclic alkyl group, aryl group, aralkyl group or camphor group; $R^a$ and $R^b$ may be connected via an alkylene group, arylene group or aralkyl group to form a ring; when $^{F}Y$ is a —CO— group, $R^b$ may be a hydroxyl group or alkoxy group; and $^{e}M^{+}$ represents a counter cation selected from the group consisting of sulfonium, iodonium, diazonium and azinium.

24. The heat mode-applicable negative planographic printing plate according to claim 23, wherein said compound (I) is represented by said formula(A), and wherein $R^1$ and $R^2$ in said formula (A) are independently selected from the group consisting of an alkyl group, an alkenyl group and an aryl group having 1 to 12 carbon atoms.

25. The heat mode-applicable negative planographic printing plate according to claim 23, wherein $^{a}M^{+}$, $^{b}M^{+}$, $^{c}M^{+}$, $^{d}M^{+}$ and $^{e}M^{+}$ each independently represents iodonium or sulfonium.

26. The heat mode-applicable negative planographic printing plate according to claim 23, wherein compound (I) is represented by said formula (A), and ${}^{a}M^{+}$ in said formula (A) is represented by the following general formula (${}^{a}$M-I) or (${}^{a}$M-II);

(${}^{a}$M-I)

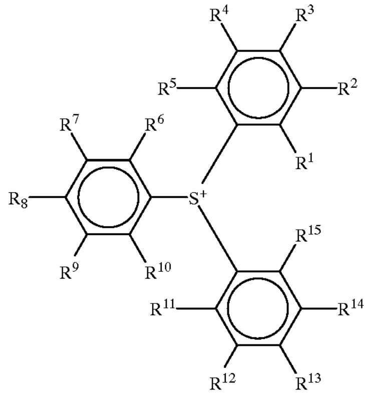

(${}^{a}$M-II)

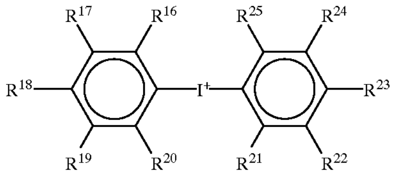

wherein, in the above formulae (${}^{a}$M-I) and (${}^{a}$M-II), $R^1$ to $R^{25}$ each independently represent a hydrogen atom, a linear, branched or cyclic alkyl group, a linear, branched or cyclic alkoxy group, a hydroxyl group, a halogen atom or a —S—$R^{26}$ group; and wherein $R^{26}$ represents a linear, branched or cyclic alkyl group, or an aryl group.

27. The heat mode-applicable negative plano graphic printing plate according to claim 23, wherein said compound (I) is represented by said formula (A) in which ${}^{a}X$ has the following structure:

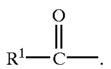

28. The heat mode-applicable negative planographic printing plate according to claim 23, wherein said compound (I) is represented by said formula (B) in which ${}^{b}Y$ has one of the following structures:

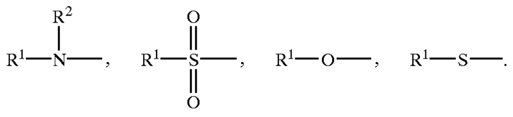

29. The heat mode-applicable negative planographic printing plate according to claim 23, wherein said compound (I) is represented by said formula(C), and wherein $R^8$ in said formula (C) is selected from the group consisting of a hydrogen atom, an alkyl group having 1 to 6 carbon atoms, an aryl group having 6 to 10 carbon atoms or a hydroxyl group.

30. The heat mode-applicable negative planographic printing plate according to claim 23, wherein said compound (I) is represented by said formula (D), and wherein ${}^{d}R$—COOH, that is a conjugate acid of the carboxylate ${}^{d}R$—$COO^-$ of said formula (D), has a pKa in water of 2 or more.

31. The heat mode-applicable negative planographic printing plate according to claim 23, wherein said (III) light-heat converting agent is represented by the following general formula (a):

General formula (a)

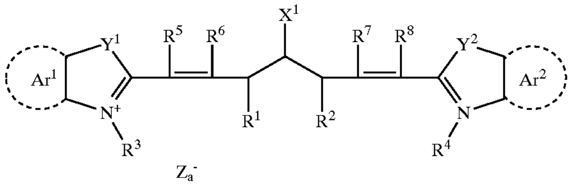

wherein in the general formula (a), $X^1$ represents a halogen atom, —$NPh_2$, $X^2$—$L^1$, or the group shown below;

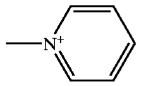

$X^2$ represents an oxygen atom or a sulfur atom; $L^1$ represents a hydrocarbon group having 1 to 12 carbon atoms, an aromatic ring having heteroatoms or a hydrocarbon group having 1 to 12 heteroatoms, wherein said heteroatom is selected from the group consisting of a nitrogen atom, a sulfur atom, an oxygen atom, a halogen atom and a selenium atom; each of $R^1$ and $R^2$ independently represents a hydrocarbon group having 1 to 12 carbon atoms; $Ar^1$ and $Ar^2$ may each be the same or different and represent an aromatic hydrocarbon group optionally having a substituent; $Y^1$ and $Y^2$ may each be the same or different and represent a sulfur atom or a dialkylmethylene group having 12 or less carbon atoms; $R^3$ and $R^4$ may each be the same or different and represent a hydrocarbon group having 20 or less carbon atoms, optionally having a substituent; $R^5$, $R^6$, $R^7$ and $R^8$ may each be the same or different, and represent a hydrogen atom or a hydrocarbon group having 12 or less carbon atoms; and $Z_a^-$ represents a counter anion, however, when a sulfo group is substituted in any of $R^1$ to $R^8$, $Z_a^-$ is not necessary.

32. The heat mode-applicable negative planographic printing plate according to claim 31, wherein $X^1$ in the general formula (a) is —$NPh_2$.

33. A heat-sensitive composition comprising (I) a compound which generates an acid or a radical when heated and which is represented by the following formula (E), and further comprising (II) a compound whose physical and chemical properties are changed irreversibly by an acid or a radical;

$${}^{e}X^{-}\,{}^{e}M^{+} \qquad \text{General formula (E)}$$

wherein in said formula (E), ${}^{e}X^-$ is an anion of a compound having a structure of the following formula (F);

General formula (F)

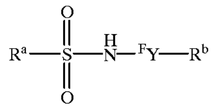

wherein in the above formula, ${}^FY$ represents —CO— or —$SO_2$—; $R^a$ and $R^b$ each independently represents a linear, branched or cyclic alkyl group, aryl group, aralkyl group or camphor group; $R^a$ and $R^b$ may be connected via an alkylene group, arylene group or aralkyl group to form a ring; when ${}^FY$ is a —CO— group, $R^b$ may be a hydroxyl group or an alkoxy group; and ${}^eM^+$ represents a counter cation selected from the group consisting of sulfonium, iodonium, diazonium, ammonium and azinium.

34. A heat mode-applicable negative planographic printing plate comprising a substrate, which has disposed thereon a photosensitive layer comprising (I) an acid or a radical polymerization initiator represented by formula (E), (II-a) a radical polymerizable compound having an unsaturated bond; (III) a light-heat converting agent; and (IV) a binder polymer;

${}^eX^-{}^eM^+$ General formula (E)

wherein in said formula (E), ${}^eX^-$ is an anion of a compound having a structure of the following general formula (F);

General formula (F)

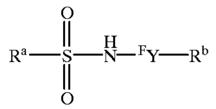

wherein in the above formula, ${}^FY$ represents —CO— or —$SO_2$—; $R^a$ and $R^b$ each independently represents a linear, branched or cyclic alkyl group, aryl group, aralkyl group or camphor group; $R^a$ and $R^b$ may be connected via an alkylene group, arylene group or aralkyl group to form a ring; when ${}^FY$ is a —CO— group, $R^b$ may be a hydroxyl group or an alkoxy group; and ${}^eM^+$ represents a counter cation selected from the group consisting of sulfonium, iodonium, diazonium, ammonium and azinium.

35. A heat-sensitive composition comprising (I) a compound which generates an acid or a radical when heated and which is represented by the following formula (I-a), and further comprising (II) a compound whose physical and chemical properties are changed irreversibly by an acid or a radical;

(I-a)

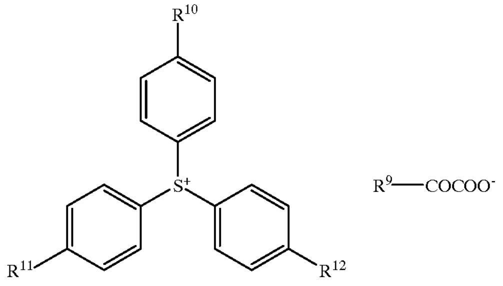

wherein, $R^9$ represents a phenyl group or an alkyl group having 1 to 4 carbon atoms; and $R^{10}$, $R^{11}$ and $R^{12}$ each independently represents a hydrogen atom, a halogen atom, a methyl group, or a butyl group.

36. A heat mode-applicable negative planographic printing plate comprising a substrate, which has disposed thereon a photosensitive layer comprising (I) an acid or a radical polymerization initiator represented by the following formula (I-a); (II-a) a radical-polymerizable compound having an unsaturated bond; (III) a light-heat converting agent; and (IV) a binder polymer;

(I-a)

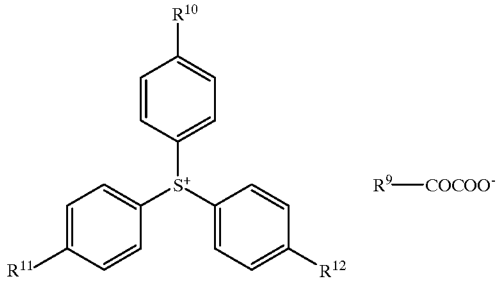

wherein, $R^9$ represents a phenyl group or an alkyl group having 1 to 4 carbon atoms; and $R^{10}$, $R^{11}$ and $R^{12}$ each independently represents a hydrogen atom, a halogen atom, a methyl group, or a butyl group.

* * * * *

UNITED STATES PATENT AND TRADEMARK OFFICE

CERTIFICATE OF CORRECTION

PATENT NO. : 6,660,446 B2 Page 1 of 1
DATED : December 9, 2003
INVENTOR(S) : Kazuto Shimada et al.

It is certified that error appears in the above-identified patent and that said Letters Patent is hereby corrected as shown below:

Column 102,
Lines 10-11, change "$R^1$ and $R^2$ may be the same or different and represent a monovalent non-metal atom," to -- $R^1$ and $R^2$ may be the same or different and represent a monovalent nonmetallic group, --.
Lines 16-17, change "$R^3$ to $R^7$ may be the same or different and represent a monovalent non-metal atom;" to -- $R^3$ to $R^7$ may be the same or different and represent a monovalent nonmetallic group; --.

Column 108,
Lines 24-25, change "$R^8$ represents a monovalent non-metal atom;" to -- $R^8$ represents a monovalent nonmetallic group; --.

Signed and Sealed this

Eighteenth Day of October, 2005

JON W. DUDAS
*Director of the United States Patent and Trademark Office*